US006255151B1

(12) United States Patent
Fukuda et al.

(10) Patent No.: US 6,255,151 B1
(45) Date of Patent: Jul. 3, 2001

(54) SEMICONDUCTOR INTEGRATED CIRCUIT DEVICE AND METHOD OF MANUFACTURING SAME

(75) Inventors: Takuya Fukuda, Kodaira; Yuzuru Ohji, Hinode-machi; Nobuyoshi Kobayashi, Kawagoe, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/209,013

(22) Filed: Dec. 11, 1998

(30) Foreign Application Priority Data

Dec. 19, 1997 (JP) .................................... 9-350537

(51) Int. Cl.[7] ..................... H01L 21/336; H01L 21/8234
(52) U.S. Cl. ..................... 438/197; 438/238; 438/239; 438/240; 438/241; 438/253; 438/256; 438/396; 438/397; 438/398; 438/399; 11/622; 11/642; 11/688; 11/296; 11/306; 11/307; 257/306; 257/307; 257/308; 257/309; 257/296; 257/758
(58) Field of Search .................................... 438/197, 253, 438/241, 256, 622, 618, 119.7, 238–240, 396–399; 257/758

(56) References Cited

U.S. PATENT DOCUMENTS

| 5,218,219 | 6/1993 | Ajika et al. |
|---|---|---|
| 5,279,983 | 1/1994 | Ahn . |
| 5,759,889 | * 6/1998 | Sakao ................................... 438/241 |
| 5,846,876 | * 12/1998 | Bandyopadhyay et al. .......... 438/622 |
| 5,981,369 | * 11/2000 | Yoshida et al. ...................... 438/597 |

FOREIGN PATENT DOCUMENTS

| 4-10651 | 1/1992 | (JP) . |
|---|---|---|
| 7-7084 | 1/1995 | (JP) . |
| 9-92794 | 4/1997 | (JP) . |

\* cited by examiner

Primary Examiner—T. Thomas
Assistant Examiner—Nitin Parekh
(74) Attorney, Agent, or Firm—Antonelli, Terry, Stout & Kraus, LLP

(57) ABSTRACT

A steplike offset between a memory cell array region and a peripheral circuit region, which is caused by a capacitor C, is reduced by an insulating film having a thickness substantially equal to the height of the capacitor C. Wiring or interconnection grooves are defined in the neighborhood of the surface of an insulating film whose surface is flattened by a CMP method. Further, connecting holes are defined in lower portions of the bottom faces of the interconnection grooves respectively. Second layer interconnections containing copper are formed within the interconnection grooves, and connecting portions containing copper are formed within the connecting holes. The second layer interconnections and first layer interconnections are connected to each other by the connecting portions whose lengths are shortened. The second layer interconnections and the connecting portions are integrally formed by a damascene method using the CMP method.

32 Claims, 38 Drawing Sheets

SEMICONDUCTOR INTEGRATED CIRCUIT DEVICE AND METHOD OF MANUFACTURING SAME

BACKGROUND OF THE INVENTION

The present invention relates to a semiconductor integrated circuit device and a manufacturing technique therefor; and more particularly, the invention relates to a technique which is effective for application to a DRAM or a semiconductor integrated circuit device, wherein the DRAM and a logic circuit, such as a logical control circuit or an arithmetic logic circuit or the like, are placed on one semiconductor substrate in mixed form.

Memory cells of a DRAM are generally placed at points where a plurality of word lines and a plurality of bit lines intersect on a principal surface of a semiconductor substrate in matrix form. Each memory cell comprises one memory cell selection MISFET (Metal Insulator Semiconductor Field Effect Transistor) and one information storage capacitive element (capacitor) electrically connected in series therewith. The memory cell selection MISFET is formed within an active region whose periphery is surrounded by a device separation region, and principally comprises a gate oxide film, a gate electrode constructed integrally with each word line, and a pair of semiconductor regions constituting a source and a drain. Each bit line is placed in an upper portion of the memory cell selection MISFET and is electrically connected to one of the source and drain shared between two adjacent memory cell selection MISFETs in an extending direction thereof. The information storage capacitive element is similarly placed in the upper portion of the memory cell selection MISFET and is electrically connected to the other of the source and drain.

A DRAM described in Japanese Patent Application Laid-Open No. Hei 7-7084 has been devised to provide a lower electrode (storage electrode) of each capacitor in a cylindrical form having an opening defined thereabove thereby to increase its surface area. Further, a capacitive insulating film is formed on the lower electrode and an upper electrode (plate electrode) is formed over the capacitive insulating film.

In a capacitor having such a lower electrode of cylindrical shape, a steplike offset or difference in level corresponding to the height of the capacitor occurs between a memory cell array region and a region other than a peripheral circuit region or the like.

If such a steplike offset exists, it is then difficult to adjust the exposure focus upon patterning an interconnection layer formed after the formation of the capacitor. As a result, fine wiring patterns cannot be obtained. With developments in miniaturization of a semiconductor integrated circuit device, the storage capacitive value required per unit area has increased and, therefore, the height of the capacitor has further increased. On the other hand, allowable margin values for adjustment of the exposure focus become increasingly more strict due to the miniaturization of each wiring pattern.

Japanese Patent Application Laid-Open No. Hei 4-10651 (corresponding U.S. Pat. No. 5,218,219) discloses a DRAM wherein in order to reduce the steplike offset between the aforementioned memory cell array region and peripheral circuit region, grooves are defined in an insulating film and capacitors are formed along inner walls of the grooves.

SUMMARY OF THE INVENTION

In the aforementioned DRAM, however, an insulating film having a thickness equal to the height of each capacitor is left within a region other than the memory cell array region. In the micro-fabricated DRAM, there may be cases in which the thickness of the insulating film reaches 1 μm in terms of the need for increasing the height of the capacitor to ensure its storage capacity. Therefore, when a first layer interconnection formed before a capacitor forming process is connected to a second layer interconnection formed after the formation of the capacitor, it is necessary to define each connecting hole in the thick insulating film having a thickness equal to the height of the capacitor, so that the aspect ratio (corresponding to the depth of the connecting hole relative to the open diameter of the connecting hole) of the connecting hole increases. Namely, even if the first layer interconnection and the second layer interconnection are connected to one another by a plug, they are inevitably connected to one another by a plug having a high aspect ratio. Thus, the yield might be reduced because a plug having such a high aspect ratio is formed. Further, the connecting hole reaches a substrate in an etching process for the formation of the connecting hole, so that the second layer interconnection and the substrate are short-circuited.

In a semiconductor integrated circuit device in which a DRAM and a logic circuit, such as a logical control circuit or a logic circuit or the like, are placed on a single semiconductor substrate in mixed form, the logic circuit part has a configuration in which a first layer interconnection and a second layer interconnection are connected by a plug having a high aspect ratio in a manner similar to a peripheral circuit of the DRAM. If the interconnections are connected by the plug having such a high aspect ratio, then the resistance thereof interferes with the performance, such as a quick response or the like of the logic circuit.

Incidentally, Japanese Patent Application Laid-Open No. Hei 9-92794 discloses a method of simultaneously forming capacitor-forming concave portions and plug-forming grooves in an insulating film to reduce a steplike offset and simplify a process for processing storage electrodes. However, the disclosed method has a problem in that when an interconnection (second layer interconnection) is formed after the formation of each capacitor, a CMP method cannot be used. When a lower electrode of the capacitor is formed simultaneously with the second layer interconnection of a peripheral circuit according to the features described in this publication, a capacitive insulating film of the capacitor is formed after a process for forming the second layer interconnection. When the capacitive insulating film is composed of an oxide metal, such as a tantalum oxide or the like, in order to obtain an increase in the stored charge of the capacitor, it is necessary inevitably to perform a heat treating process at a high temperature. A metal material, such as low-resistance copper or aluminum or the like, used for the second layer interconnection cannot be adopted from the viewpoint of thermal diffusibility and softening.

An object of the present invention is to improve the reliability of connection between a first layer interconnection and a second layer interconnection placed with a thick insulating film having a thickness equal to the height of each capacitor interposed therebetween in a semiconductor integrated circuit device having memory cells containing capacitive elements.

Another object of the present invention is to reduce the resistance of a hole portion for connection between the first layer interconnection and the second layer interconnection.

A further object of the present invention is to reduce the resistance of interconnections of a second or subsequent layer interconnection.

A still further object of the present invention is to provide a technique which is capable of performing a process for forming a second layer interconnection subsequently to a process for forming a capacitor requiring a high heat treating process and for using even a material which has a large thermal diffusion coefficient in the second layer interconnection.

A still further object of the present invention is to improve the quickness of response of a peripheral circuit or logic circuit formed on the same substrate as a DRAM having memory cells.

The above and other objects, and novel features of the present invention will become apparent from the description provided in the present specification and from the accompanying drawings.

Summaries of typical aspects of the invention disclosed in the present application will be described in brief as follows.

(1) A semiconductor integrated circuit device according to the present invention comprises memory cell selection MISFETs formed in a memory cell array region on a semiconductor substrate, peripheral circuit MISFETs formed in a peripheral circuit region around the memory cell array region, a first interlayer insulating film for covering the memory cell selection MISFETs and the peripheral circuit MISFETs, bit lines formed over the first interlayer insulating film lying in the memory cell array region, at least one information storage capacitive element provided with a lower electrode electrically connected to one source-to-drain region of each memory cell selection MISFET, and a second interlayer insulating film including a first portion formed in the same layer as that for the information storage capacitive element and for reducing or eliminating a steplike offset between the memory cell array region and the peripheral circuit region, the offset being caused by the height of the information storage capacitive element, and a second portion for covering the information storage capacitive element, and wherein the surface of the second interlayer insulating film is flattened and wiring or interconnection grooves are defined in the vicinity of the surface thereof, and interconnections having surfaces within the same plane as the surface thereof are formed inside the wiring grooves.

Further, the semiconductor integrated circuit device according to the present invention has a logic circuit region with logic circuit MISFETs constituting an arithmetic circuit or another logic circuit formed therein in addition to the memory cell array region and peripheral circuit region of the semiconductor integrated circuit device. Even in the case of the second interlayer insulating film in the logic circuit region, the surface thereof is flattened and wiring or interconnection grooves are defined in the vicinity of the surface thereof. Interconnections having surfaces within the same plane as the surface of the second interlayer insulating film are respectively formed inside the interconnection grooves.

According to such a semiconductor integrated circuit device, since the surface of the second interlayer insulating film is flattened, a steplike offset caused by the information storage capacitive element is not formed between the memory cell array region and other region. Unfocusing of exposure light, which will be produced when such a steplike offset exists, is not developed. Therefore, the patterning of the interconnections or the like formed over the second interlayer insulating film can be performed precisely. Thus, fine interconnections or the like can be formed so as to cope with high integration and high performance of the semiconductor integrated circuit device.

However, if the surface of the second interlayer insulating film is flattened in this way, then the thickness of the second interlayer insulating film in the peripheral circuit region or logic circuit region is made thick by an amount corresponding to the steplike offset. It is further necessary to process, with a high aspect ratio, each connecting hole for connecting interconnections formed on a second interlayer insulating film and members placed therebelow in the case of the prior art in which no countermeasures are taken thereagainst. This point is as described above.

In accordance with the present invention, however, the surface of the second interlayer insulating film is flattened and the wiring grooves are defined in the vicinity of the surface thereof. Further, interconnections having surfaces within the same plane as the surface of the second interlayer insulating film are formed in the interconnection grooves respectively. Therefore, the distance between each member below the second interlayer insulating film and the bottom of each interconnection becomes short and hence the length of a connecting portion for connecting each interconnection and the member to each other can be shortened. Thus, the length of a connecting hole for forming each connecting portion is shortened to make its processing easy, and the occurrence of a failure in processing is restrained, so that the semiconductor integrated circuit device can be improved in manufacturing yield and reliability. Further, since the length of the connecting portion becomes short, the resistance of the connecting portion is lowered and hence the resistance for connection between each interconnection and the member is reduced, whereby the performance, such as quick response or the like, of the semiconductor integrated circuit device can be improved.

Further, the interconnections can be formed within the peripheral circuit region alone, or the peripheral circuit region and logic circuit region alone without being formed within the memory cell array region. Thus, the resistance values of each interconnection and connecting portion in the peripheral circuit region or logic circuit region can be reduced so as to improve the quickness of response of the peripheral circuit and the logic circuit. In particular, an improvement in the quickness of response of the logic circuit portion exerts a direct influence on an improvement in operation speed and the like, and an improvement in the performance of the semiconductor integrated circuit device as it is and is also of importance thereto.

The bottom face of each interconnection can be placed below the upper surface of the information storage capacitive element. By placing the bottom face of the interconnection below the upper surface of the information storage capacitive element in this way, the length of each connecting portion connected to the member placed in a portion below the bottom face thereof as seen from the bottom face of the interconnection can be made shorter. Since the shortening of the length of each connecting portion contributes to improvements in yield and reliability of the semiconductor integrated circuit device and an improvement in the performance thereof as described above, the further shortening of the length thereof means that the above-described effect can be developed more pronouncedly.

Further, each of the first layer interconnections each composed of the same material as each bit line is formed over the first interlayer insulating film in the peripheral circuit region, or the peripheral circuit region and logic circuit region. Each interconnection can be provided as a second layer interconnection formed at the upper portion of the first layer interconnection. Thus, the formation of the first layer interconnection of the same material as a bit line over the first interlayer insulating film makes it possible to make the process for forming the first layer interconnection identical to the process for forming each bit line and thereby to simplify the processes. By forming the interconnection as the second layer interconnection and forming each lower member connected to the second layer interconnection as the first layer interconnection, the length between the second layer interconnection and the first layer interconnection, i.e., the length of the connecting portion can be shortened. It is thus possible to more remarkably achieve improvements in manufacturing yield and reliability owing to the facilitation of a process for forming each connecting hole, a reduction in series resistance owing to the shortening of the length of each connecting portion, and an improvement in the performance of the semiconductor integrated circuit device based on it.

Incidentally, the interconnection (or second layer interconnection) and the connecting portion are formed in their corresponding wiring or interconnection groove and connecting hole. They can be formed as an integral one. Namely, the connecting hole can be defined in a portion below the interconnection groove, and the interconnection or the second layer interconnection can be regarded as being connected to each peripheral circuit MISFET, each logic circuit MISFET or the first layer interconnection through the connecting portion formed integrally with the interconnection or the second layer interconnection inside the connecting hole. The above-described interconnection and connecting portion can be formed by a so-called damascene method (dual damascene method for integrally forming the interconnection and the connecting portion in particular) as will be described later.

Further, the interconnection and its connecting portion or the second layer interconnection and its connecting portion can be formed as metal conductive materials or conductors with copper as a principal conductive layer. In this case, any one selected from a tantalum film, a niobium film, a tantalum nitride film, a titanium nitride film and a tungsten nitride film or a plurality of thin films can be formed at an interface between the principal conductive layer composed of copper and the wiring groove and connecting hole. Further, the surface of the interconnection or the second layer interconnection can be covered with a silicon nitride film.

By utilizing copper as the principal conductive layer, the interconnection and the connecting portion are reduced in resistance value so that the performance of the semiconductor integrated circuit device can be improved. There are strong expectations for coping with a demand for an improvement in the performance of the logic circuit portion in particular. The improvement in its performance brings about a great technical effect. Any one selected from the tantalum film, niobium film, tantalum nitride film, titanium nitride film and tungsten nitride film or the plurality of thin films function as a blocking layer against copper. It is thus possible to prevent copper from being diffused into each interlayer insulating film or the like and improve the reliability of the semiconductor integrated circuit device. With respect to the tantalum film and the niobium film in particular, a chemical bond between tantalum and niobium, and copper exists stably and hence the migration of copper atoms at a tantalum/copper interface (niobium/copper interface) is or controlled retarded. Therefore, its retardant effect greatly works not only for electromigration but also for the diffusion of copper. As a result, a highly reliable semiconductor integrated circuit device which is excellent in resistance to electromigration can be obtained. Further, the diffusion of copper upward can be restrained by covering the surface of the interconnection or the second layer interconnection with a silicon nitride film.

Further, the interconnection and its connecting portion or the second layer interconnection and its connecting portion can be formed as metal conductive materials or conductors with aluminum as a principal conductive layer. In this case, a titanium nitride film can be formed at an interface between the principal conductive layer composed of aluminum and the wiring groove and connecting hole.

By utilizing aluminum as the principal conductive layer, the interconnection and the connecting portion are reduced in resistance value so that the performance of the semiconductor integrated circuit device can be improved. There are strong expectations for coping with a demand for an improvement in the performance of the logic circuit portion in particular. The improvement in its performance brings about a great technical effect. It is also possible to use the titanium nitride film as a wetting layer at the time that aluminum is embedded in its corresponding connecting hole under high pressure, as will be described later.

Incidentally, a lower electrode can be formed so as to have a cylindrical shape having an opening defined thereabove. Since the lower electrode shaped in such a cylindrical form can be provided with a large surface area, it has a shape advantageous to high integration of a future DRAM but inevitably results in a solid shape. Therefore, the steplike offset caused by each information storage capacitive element also increases. Thus, an effect at the time that the present invention is applied, becomes particularly prominent in the shape of the lower electrode.

Further, an upper interlayer insulating film having each wiring or interconnection groove in the vicinity of the surface of the interlayer insulating film, and an upper interconnection formed within the wiring groove and whose surface is placed substantially in the same plane as that of the upper interlayer insulating film, may be formed in a layer above the interconnection or second layer interconnection. Thus, even a third or fourth interconnection layer above the second layer interconnection can be reduced in series resistance in a manner similar to the second layer interconnection (interconnection) so as to improve the performance of the semiconductor integrated circuit device.

(2) A method of manufacturing a semiconductor integrated circuit device, according to the present invention comprises the following processes: a process for forming memory cell selection MISFETs in a memory cell array region on a principal surface of a semiconductor substrate and for forming peripheral circuit MISFETs or logic circuit MISFETs in a peripheral circuit region or logic circuit region on the semiconductor substrate, respectively; a process for forming a first insulating film for covering the memory cell selection MISFETs and the peripheral circuit MISFETs or logic circuit MISFETs; a process for forming bit lines over the first insulating film in the memory cell array region; a process for forming a second insulating film for covering the bit lines; a process for forming a lower electrode of each information storage capacitive element, a capacitive insulating film for covering the lower electrode, and an upper electrode over the second insulating film in the memory cell array region; a process for forming a third insulating film over the information storage capacitive element; and a process for flattening the surface of the third insulating film by a CMP method, thereafter defining wiring or interconnection grooves and connecting holes in the flattened third insulating film and a lower insulating film thereof in the peripheral circuit region or logic circuit region, successively depositing a first conductive layer and a second conductive layer over the third insulating film containing the interior of the interconnection grooves and connecting holes, removing the first and second conductive layers on the surface of the third insulating film by the CMP method, and forming interconnections comprised of the first and second conductive layers within each interconnection groove and forming connecting portions comprised of the first and second conductive layers within each connecting hole.

According to such a method of manufacturing the semiconductor integrated circuit device, the interconnections are formed by a so-called dual damascene method so that the semiconductor integrated circuit device described in paragraph (1) can be formed.

According to the present manufacturing method as well, since the interconnections are formed after the formation of each information storage capacitive element, no interconnections are affected by heat treatment at a high temperature, which is normally performed upon formation of the information storage capacitive element. Described another way, since the interconnections are not yet formed upon formation of the information storage capacitive element, it is not necessary to restrict the heating process at the time of formation of the information storage capacitive element in consideration of the heat resistance to the interconnections. Thus, heat treatment at a sufficiently high temperature (e.g., about 700° C.) is executed upon formation of the information storage capacitive element, whereby each information storage capacitive element can be formed to have a large in storage capacity. On the other hand, a material, which is inferior in heat resistance, but has high conductivity, e.g., copper, aluminum or the like, is used to reduce the wiring resistance, whereby the performance of the semiconductor integrated circuit device can be improved. Owing to such a manufacturing method, aluminum which has a low melting point or copper having a fast diffusion velocity can be used as the wiring material.

Further, since the connecting holes are defined after the formation of the wiring or interconnection grooves in the present manufacturing method, the depth of each connecting hole is reduced by an amount corresponding to the depth of each wiring hole. Therefore, the processing of each connecting hole can be made easy and a reduction in the yield of the semiconductor integrated circuit device due to a failure in processing can be restrained. Since the length of each connecting portion formed in its corresponding connecting hole is shortened, series resistance between the interconnection and a lower member, to which the interconnection is connected by its corresponding connecting portion, is reduced so that the semiconductor integrated circuit device can be improved in performance.

Although the problem of a steplike offset resulting from the information storage capacitive element is solved upon flattening the third insulating film, a method of forming an insulating film corresponding to the steplike offset in advance before the deposition of the third insulating film is used to solve such a steplike offset. Namely, before the deposition of the third insulating film, a fourth insulating film formed in the same layer as that for each information storage capacitive element is formed within the peripheral circuit region or logic circuit region, thereby making it possible to reduce or eliminate the steplike offset between the memory cell array region and the peripheral circuit region or logic circuit region due to the height of the information storage capacitive element.

As a method of solving the problem of a steplike offset, i.e., a method of forming the fourth insulating film, a method of providing the fourth insulating film as an insulating film, in which a cylindrical groove is defined upon formation of the lower electrode of the information storage capacitive element, can be used. According to this method, it is not necessary to additionally form the fourth insulating film when the lower electrode of the information storage capacitive element is set to a cylindrical shape having an opening defined thereabove. Further, the fourth insulating film required upon formation of the lower electrode is used even for a reduction in the steplike offset, whereby the process can be simplified. Since the reduction in the steplike offset is performed in advance by the fourth insulating film upon depositing the third insulating film and polishing it by a CMP method in particular, the amount of polishing of the third insulating film by a CMP process does not increase, so that the load on the CMP process can be reduced.

Further, the third insulating film covers the information storage capacitive element and is deposited with a thickness greater than or equal to a size corresponding to the height of the information storage capacitive element, whereby the problem of a steplike offset can be also solved. In this case, the solution to the problem of the steplike offset is performed only by the deposition of the third insulating film and polishing of the third insulating film by a CMP method. Since the thickness of the third insulating film on the memory cell array region is so great, there may be cases in which the polishing thereof by the CMP method in this case experiences difficulties in ensuring the flatness thereof by the CMP method. In such a case, a layer (e.g., a silicon nitride film slower in polishing velocity than a silicon oxide film corresponding to a typical material for the third insulating film) for controlling the velocity of polishing by the CMP method can be deposited within the peripheral circuit region or logic circuit region alone.

In the method of manufacturing the semiconductor integrated circuit device, a first layer interconnection composed of the same material as that for each bit line can be formed over the first insulating film in the peripheral circuit region or logic circuit region simultaneously with the formation of the bit lines, and each connecting portion can be electrically connected to the first layer interconnection. According to such a method of manufacturing the semiconductor integrated circuit device, the length of the connecting portion can be shortened. Namely, the depth of the connecting hole in which the connecting portion is formed is reduced, and the process for forming the connecting hole makes it easy to restrain or control the occurrence of a failure in processing, whereby the yield of the semiconductor integrated circuit device can be improved.

Further, the first conductive layer can be formed as a titanium nitride film and the second conductive layer can be formed as an aluminum film. In this case, after the deposition of the aluminum film, the semiconductor substrate is held under high pressure so that the aluminum film can be embedded in each connecting hole.

Alternatively, the first conductive layer can be formed as any one selected from a tantalum film, a niobium film, a tantalum nitride film, a titanium nitride film or a tungsten nitride film, or a plurality of thin films, and the second conductive layer can be formed as a copper film. In this case, the copper film can be deposited by a plating method. As the plating method, an electrolytic plating method or an electroless plating method can be employed by way of illustrative example. Further, a silicon nitride film can be deposited over the third insulating film and each interconnection.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description, when taken in connection with the accompanying drawings, in which:

DESCRIPTION OF THE PREFERRED EMBODIMENTS

Figure 1:
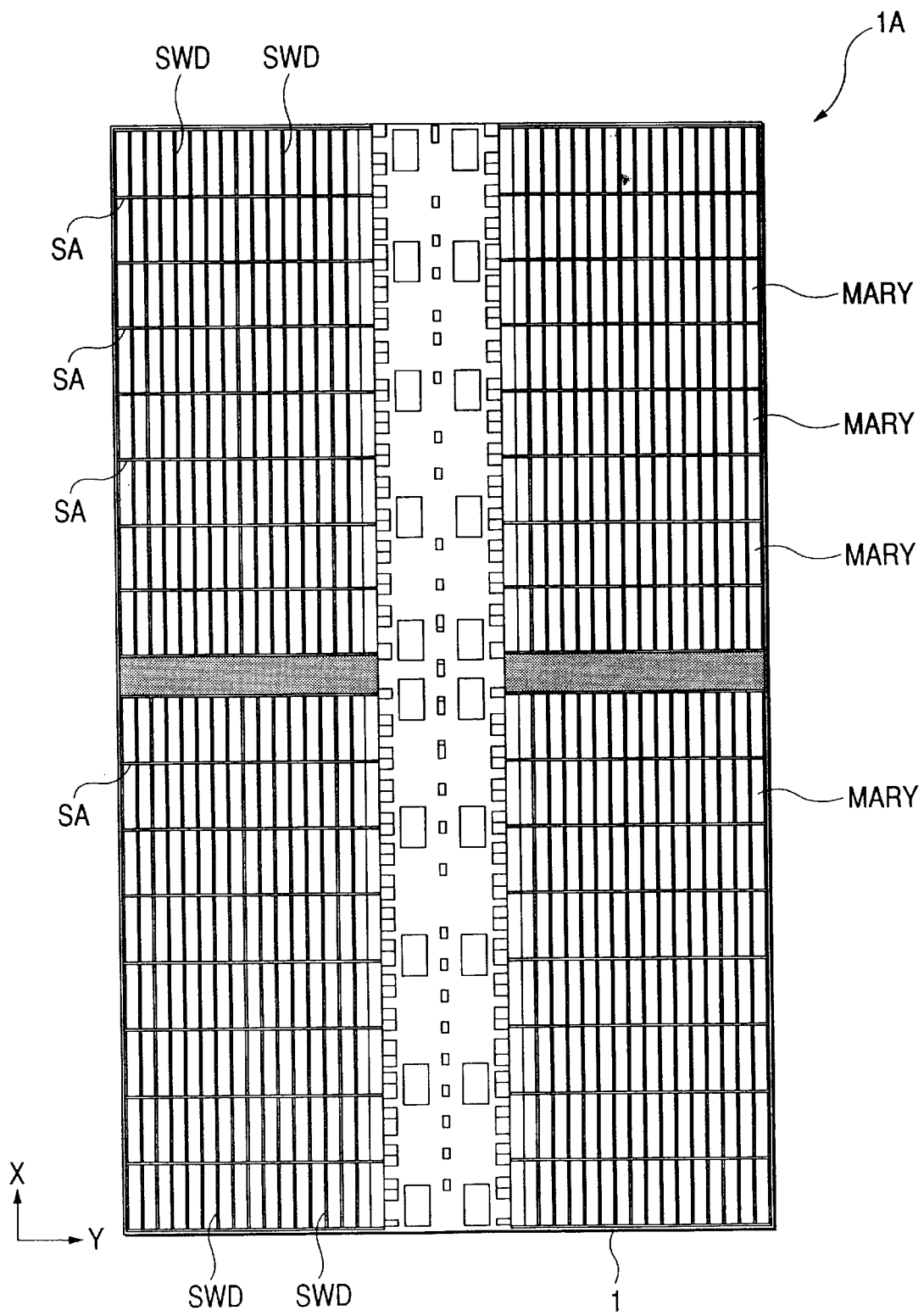
FIG. 1 is a plan view showing one example of the entire semiconductor chip with a DRAM formed therein according to a first embodiment of the present invention.

Preferred embodiments of the present invention will be described in detail hereinafter with reference to the accompanying drawings. In all the drawings for describing the respective embodiments, members or components having the same functions are identified by the same reference numerals and their repetitive description will therefore be omitted.

(First Embodiment)

FIG. 1 is a plan view showing one example of the entire semiconductor chip with a DRAM formed therein according to a first embodiment of the present invention. The DRAM according to the present embodiment has a storage capacity of 256 Mbits. Further, the DRAM has an outside size of 12×5 mm², for example and a memory occupancy rate of 58%. As shown in the drawing, a large number of memory arrays MARY are arranged or placed in matrix form over a principal surface of a semiconductor chip 1A comprised of monocrystalline silicon along an X direction (corresponding to the longitudinal direction of the semiconductor chip 1A) and a Y direction (corresponding to the transverse direction of the semiconductor chip 1A). Sense amplifiers SA are respectively placed between the memory arrays MARY arranged adjacent to each other along the X direction. 512 memory cells are electrically connected to bit lines BL electrically connected to the sense amplifiers SA. When a hierarchical word structure is adopted for the word lines, subword decoders SWD are respectively placed between the memory arrays MARY arranged adjacent to one another along the Y direction. Further, control circuits such as word drivers WD, data line selection circuits, etc., input/output circuits, bonding pads, etc. are arranged in the central portion of the principal surface of the semiconductor chip 1A.

Figure 2:
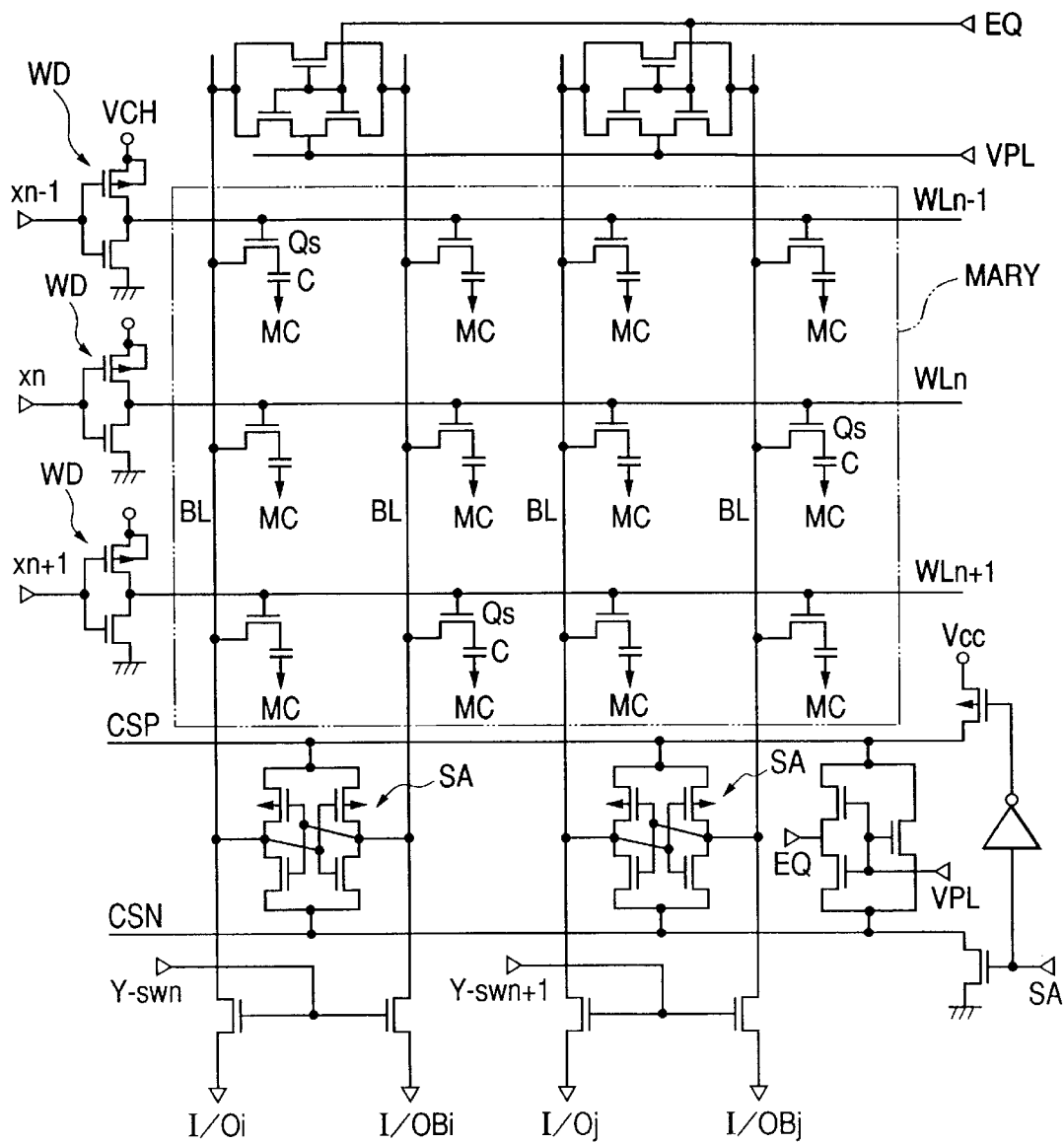
FIG. 2 is an equivalent circuit diagram of the DRAM according to the first embodiment.

FIG. 2 is an equivalent circuit diagram of the DRAM according to the first embodiment. As shown in the drawing, a memory array (MARY) of the present DRAM comprises a plurality of word lines WL (WLn−1, WLn, WLn+1, . . . ) and a plurality of bit lines BL placed in matrix form, and a plurality of memory cells (MC) placed at points where they intersect. One memory cell for storing 1-bit information therein comprises one capacitor C and one memory selection MISFET Qs electrically connected in series with the capacitor C. One of the source and drain of each memory selection MISFET Qs is electrically connected to its corresponding capacitor C and the other thereof is electrically connected to a corresponding bit line BL. One end of each word line WL is electrically connected to a corresponding word driver WD, and one end of each bit line BL is electrically connected to a corresponding sense amplifier SA.

Figure 3:
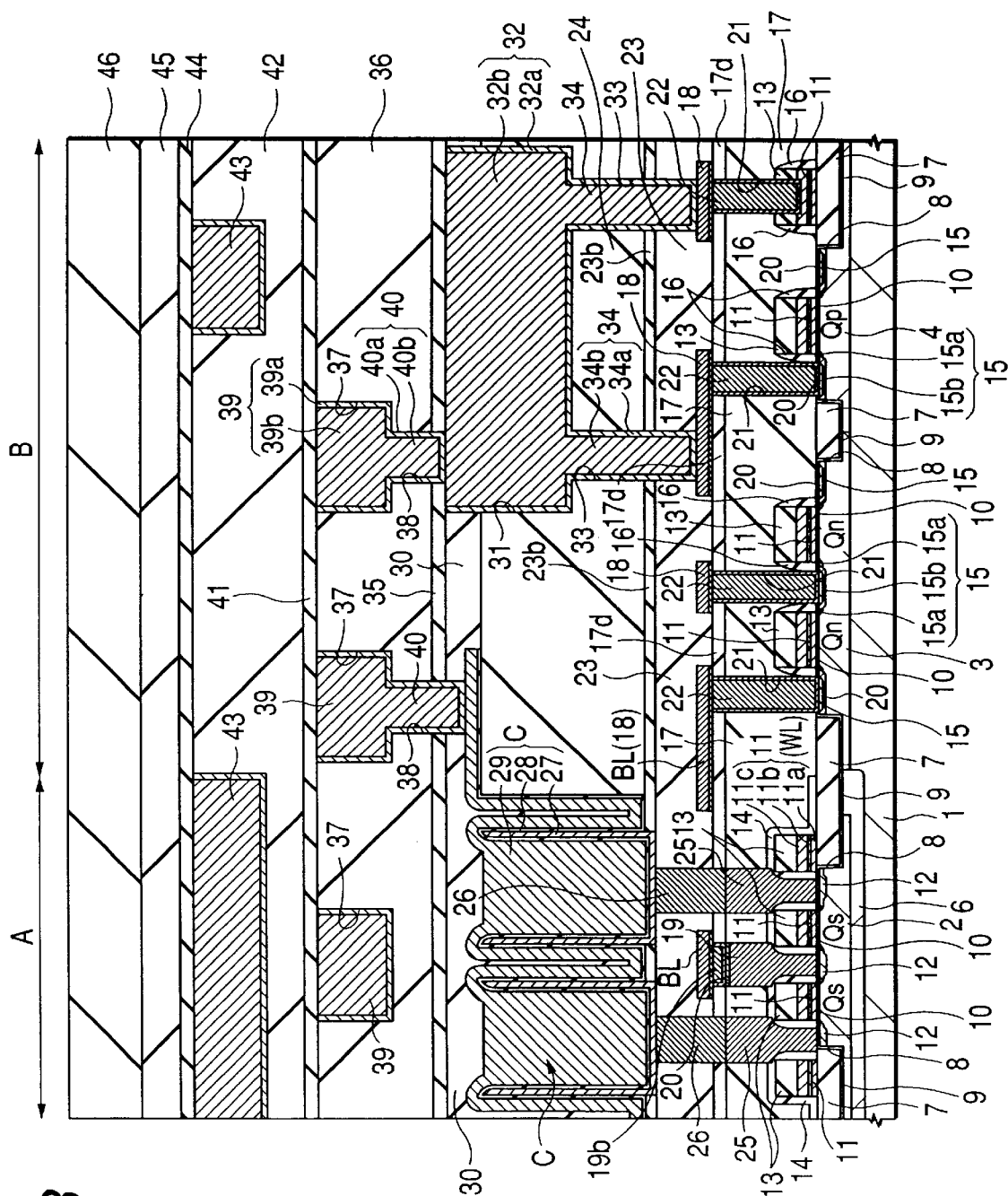
FIG. 3 is a fragmentary cross-sectional view of the DRAM according to the first embodiment.

FIG. 3 is a fragmentary cross-sectional view of the DRAM according to the first embodiment. In FIG. 3, an A region indicates some of a memory array MARY and a B region indicates some of a peripheral circuit.

A p-type well 2 lying within the A region, and a p-type well 3 and an n-type well 4 lying within the B region are formed over a principal surface of a semiconductor substrate 1 comprised of p-type monocrystalline silicon. Further, an n-type deep well 6 is formed so as to surround the p-type well 2. Incidentally, a threshold voltage control layer may be formed within each well.

Separation or isolation regions 7 are formed within principal or main surfaces of the respective wells, respectively. Each isolation region 7 is comprised of a silicon oxide film and is formed within a shallow groove 8 defined in the principal surface of the semiconductor substrate 1 with a thermally-oxidized silicon oxide film 9 interposed therebetween.

Memory selection MISFETs Qs of the DRAM are formed over the principal surface of the p-type well 2. Further, n channel MISFETs Qn and p channel MISFETs Qp are respectively formed over the principal surfaces of the p-type well 3 and the n-type well 4.

Each memory cell selection MISFET Qs comprises a gate electrode 11 formed on the principal surface of the p-type well 2 with a gate insulating film 10 interposed therebetween, and impurity semiconductor regions 12 formed in the principal surface of the p-type well 2 on both sides of each gate electrode 11. Each gate insulating film 10 is comprised of a silicon oxide film formed by thermal oxidation, which has a film thickness ranging from 7 nm to 8 nm, for example. The gate electrode 11 can be formed as a layered film of, for example, a polycrystal silicon film 11a having a thickness of 70 nm, a titanium nitride film 11b having a thickness of 50 nm and a tungsten film 11c having a thickness of 100 nm. Further, an n-type impurity, for example, arsenic or phosphorous is introduced into the impurity semiconductor region 12.

A cap insulating film 13 composed of a silicon nitride film is formed in an upper layer of the gate electrode 11 of each memory cell selection MISFET Qs. Further, an upper layer of each cap insulating film 13 is covered with a silicon nitride film 14. The silicon nitride film 14 is formed even on a side wall of the gate electrode 11 and is used for self-alignment processing at the formation of connecting holes to be described later. Incidentally, the gate electrode 11 of the memory cell selection MISFET Qs functions as a word line of the DRAM. A word line WL is formed on the upper surface of each isolation region 7.

On the other hand, the n channel MISFETs Qn and the p channel MISFETs Qp are respectively formed over the principal surfaces of the p-type well 3 and the n-type well 4 and respectively comprise gate electrodes 11 formed through the gate insulating films 10, and impurity semiconductor regions 15 formed on the principal surfaces of the respective wells on both sides of the gate electrodes 11. The gate insulating films 10 and the gate electrodes 11 are similar to the above. Each impurity semiconductor region 15 comprises a low-concentration impurity region 15a and a high-concentration impurity region 15b, which forms a so-called LDD (Lightly Doped Drain) structure. As the impurity to be introduced into the impurity semiconductor region 15, an n-type or p-type impurity is introduced therein according to the type of conduction of each MISFET.

Cap insulating films 13 each comprised of a silicon nitride film are formed on upper layers of the gate electrodes 11 of the n channel MISFETs Qn and the p channel MISFETs Qp. Side wall spacers 16 each comprised of, for example, a silicon nitride film are formed on the sides of the gate electrodes 11.

The respective memory cell selection MISFETs Qs, n channel MISFETs Qn and p channel MISFETs Qp are covered with an interlayer insulating film 17. The interlayer insulating film 17 can be formed as a stacked or layered film of, for example, an SOG (Spin On Glass) film, a TEOS oxide film obtained by flattening a silicon oxide film (hereinafter called "TEOS oxide film") formed by a plasma CVD method by a CMP (Chemical Mechanical Polishing) method with a TEOS (Tetramethoxysilane) as a raw gas, and a TEOS oxide film.

Further, a TEOS oxide film 17d is formed over the interlayer insulating film 17, and bit lines BL and first layer wires or interconnections 18 are formed over its upper surface. The bit lines BL and the first layer interconnections 18 are respectively formed as a layered film consisting of a titanium nitride film and a tungsten film, for example. Thus, the performance of the DRAM can be improved by bringing the bit lines BL and the first layer interconnections 18 into a low resistance. Further, the bit lines BL and the first layer interconnections 18 can be formed simultaneously as will be described later. As a result, the process can be simplified.

Each bit line BL is electrically connected to the impurity semiconductor region 12 commonly used in the pair of memory cell selection MISFETs Qs through a plug 19 and a plug 19b. The plug 19 can be formed as a polycrystal silicon film into which, for example, an n-type impurity is introduced. The plug 19b can be formed as a layered film comprised of a titanium nitride film and tungsten film, for example. Further, a cobalt silicide film 20 is formed at a portion where the plug 19 and the plug 19b are connected. It is thus possible to reduce the connecting resistance between the plug 19 and the plug 19b, i.e., each bit line BL and the plug 19, and thereby improve the reliability of their connection.

The first layer interconnections 18 are respectively electrically connected to the impurity semiconductor regions 15 or the gate electrodes 11 of the n channel MISFETs Qn and p channel MISFETs Qp through plugs 22 formed within connecting holes 21. Each plug 22 can be formed as a layered film comprised of, for example, a titanium nitride film and tungsten film in a manner similar to the plug 19b. Further, the cobalt silicide film 20 is formed at a portion where the plug 22 and the impurity semiconductor region 15 are connected. It is thus possible to reduce the resistance connected between the plug 22 and the impurity semiconductor region 15 and thereby improve the reliability of their connection.

The bit lines BL and first layer interconnections 18 are covered with an interlayer insulating film 23. The interlayer insulating film 23 can be formed as a layered film of, for example, an SOG film, a TEOS oxide film flattened by the CMP method, and a TEOS oxide film. Incidentally, the bit lines BL and the first layer interconnections 18 may be covered with a cap insulating film and a side wall spacer each comprised of a silicon nitride film.

Each of the information storage capacitors C is formed in the A region of a layer above the interlayer insulating film 23. Further, an insulating film 24 is formed within a layer in the B region, above the interlayer insulating film 23 so as to fall into the same layer as that for the capacitor C. The insulating film 24 can be comprised of a silicon oxide film, for example. The formation of the insulating film 24 in the same layer as that for the capacitor C allows prevention of the occurrence of a steplike offset or difference in level between the A and B regions, which results from an elevation of the capacitor C. Thus, this can make allowance for the focal depth at the time of photolithography and can stabilize the process so as to cope with micro-fabrication. Incidentally, a silicon nitride film 23b is formed on the upper surface of the interlayer insulating film 23. As will be described later, the silicon nitride film 23b is a thin film which functions as an etching stopper at the formation of each lower electrode 27 of the capacitor C.

Each capacitor C comprises a lower electrode 27 electrically connected via a plug 26 to a plug 25 connected to an impurity semiconductor region 12 opposite to the impurity semiconductor region 12 electrically connected to the bit line BL of each memory cell selection MISFET Qs, a capacitive insulating film 28 composed of, for example, a silicon nitride film and tantalum oxide, and a plate electrode 29 composed of titanium nitride, for example.

An insulating film 30 composed of a TEOS oxide film, for example, is formed in a layer above the capacitor C. The insulating film 30 and the insulating film 24 cover the capacitor C and serve as an interlayer insulating film (second interlayer insulating film) insulated from other members. The insulating film 24 corresponds to a portion (first portion) for reducing or eliminating a steplike offset or difference in level between the memory cell array region and the peripheral circuit region, which is caused by the height of the information storage capacitive element (capacitor C). The insulating film 30 corresponds to a portion (second portion) for covering an information storage capacitive element. The surface of the insulating film 30 is flattened by the CMP method, so that the flatness of the overall surface of the semiconductor substrate 1 is ensured.

Wiring or interconnection grooves 31 are defined in the neighborhood of the surfaces of the insulating film 30 and insulating film 24. A second layer interconnection 32 is formed within each interconnection groove 31. As shown in FIG. 3, the surface of the second layer interconnection 32 and the surface of the insulating film 30 are flush with each other. Further, the bottom face of each second layer interconnection 32 is placed in a position below the surface (corresponding to the surface of the plate electrode 29) of the capacitor C. As will be described later, the second layer interconnection 32 is formed by the CMP method.

Connection holes 33 are defined in portions below the interconnection grooves 31, respectively, and connecting portions 34 are formed within the connecting holes 33, respectively. The second layer interconnection 32 and the connecting portion 34 are formed as one piece. The second layer interconnection 32 is comprised of a first conductive layer 32a and a second conductive layer 32b, and the connecting portion 34 comprises a first conductive layer 34a and a second conductive layer 34b. Each of the first conductive layers 32a and 34a is comprised of a tantalum film, for example, and each of the second conductive layers 32b and 34b is made up of copper, for example.

The second conductive layers 32b and 34b serve as principal conductive layers of the second layer interconnection 32 and the connecting portion 34. Since they have principal conductive layers each composed of copper in this way, the resistance of the second layer interconnection 32 and connecting portion 34 can be lowered and the response of a semiconductor integrated circuit device, particularly, a peripheral circuit, can be speeded up to improve the performance of the DRAM.

The first conductive layers 32a and 34a function as barrier layers for preventing the diffusion of copper. Since the tantalum film is used in the present embodiment in particular, Ta—Cu bonding is formed at interfaces between the first conductive layers 32a and 34a and between the second conductive layers 32b and 34b, whereby the migration of copper due to its diffusion or electromigration can be effectively prevented. Further, the formation of the Ta—Cu bonding allows an improvement in the adhesiveness of the copper film. As a result, the reliability of the DRAM can be improved.

Since each of the connecting holes 33 is defined in the lower portion of the interconnection groove 31 in the present embodiment, the depth of the connecting hole 33 can be made shallow by a length corresponding to the depth of the interconnection groove 31. In the present embodiment, the depth of the interconnection groove 31, i.e., the thickness of the second layer interconnection 32 can be set to 0.7 μm, and the depth of the connecting hole 33, i.e., the length of the connecting portion 34 can be set to 0.7 μm. This means that the depth of each connecting hole can be shortened from 1.4 μm to 0.7 μm as compared with the case where the second layer interconnection is formed on the insulating film 30 as in the prior art. The shallow depth of each connecting hole 33 makes it possible to facilitate a working process thereof, restrain the occurrence of a working failure to improve the reliability of connection, and improve the manufacturing yield of the DRAM. Further, since the connecting hole 33 can be made shallow in depth, the connecting portion 34 can be shortened in length, and the resistance of the connecting portion 34 is reduced so that the resistance between the second layer interconnection 32 and the first layer interconnection 18 can be lowered.

In the present embodiment, the tantalum film is illustrated as the first conductive layers 32a and 34a by way of example. However, a niobium film, a tantalum nitride film, a titanium nitride film or a tungsten nitride film may be used as well. A layered film of these elements may be used.

A silicon nitride film 35 is formed over the upper surfaces of the insulating films 30 and the second layer interconnections 32. Such a silicon nitride film 35 can prevent the diffusion of copper in an upper direction.

An interlayer insulating film 36 is formed in a layer above the silicon nitride film 35, and wiring or interconnection grooves 37 are defined in the neighborhood of the surface of the interlayer insulating film 36. Each connecting hole 38 connected to the second layer interconnection 32 or the plate electrode 29 of the capacitor C is formed at the bottom of each wiring or interconnection groove 37. A third layer interconnection 39 is formed inside each interconnection groove 37, and a connecting portion 40 is formed inside each connecting hole 38. The surfaces of the interlayer insulating film 36 and the third layer interconnection 39 exist within the same plane and are formed by the CMP method as will be described later.

The third layer interconnection 39 is comprised of a first conductive layer 39a and a second conductive layer 39b in a manner similar to the second layer interconnection 32. The connecting portion 40 is made up of a first conductive layer 40a and a second conductive layer 40b in a manner similar to each connecting portion 34. The first conductive layers 39a and 40a can be formed as a tantalum film in a manner similar to the first conductive layers 32a and 34a. The niobium film, tantalum nitride film, titanium nitride film or tungsten nitride film, or a layered film of these elements may be used. The second conductive layers 39b and 40b are composed of, for example, copper in a manner similar to the second conductive layers 32b and 34b. Each third layer interconnection 39 can be used as a main word line MWB or a shunt wire or interconnection for each word line WL.

A silicon nitride film 41 is formed over the surfaces of the interlayer insulating film 36 and the third layer interconnection 39. The silicon nitride film 41 prevents the diffusion of copper from the third layer interconnection 39.

An interlayer insulating film 42 is formed in a layer above the silicon nitride film 41. Fourth layer interconnections 43 constructed in a manner similar to the second layer interconnection 32 and the third layer interconnection 39 are formed in the neighborhood of the surface of the interlayer insulating film 42. The fourth layer interconnection 43 is electrically connected to each third layer interconnection 39 through an unillustrated connecting portion. The fourth layer interconnection 43 can be used as a Y select line YS.

A silicon nitride film 44 is formed over the interlayer insulating film 42 and the fourth layer interconnection 43. Further, an insulating film 45 and a passivation film 46 are formed over the silicon nitride film 44. The silicon nitride film 44 prevents the diffusion of copper from each fourth layer interconnection 43.

A method of manufacturing the DRAM according to the present embodiment will next be described in process sequences with reference to FIGS. 4 through 28. FIGS. 4 through 28 are, respectively, cross-sectional views showing one example of a method of manufacturing a DRAM according to one embodiment of the present invention in process sequences.

A p-type semiconductor substrate 1 is first prepared and shallow grooves 8 are defined in a main or principal surface of the semiconductor substrate 1. Thereafter, the semiconductor substrate 1 is subjected to thermal oxidation to form a silicon oxide film 9. Further, the silicon oxide film is deposited thereon and thereafter polished by the CMP method to leave the silicon oxide film within each shallow groove 8 alone, whereby isolation regions 7 are formed.

Figure 4:
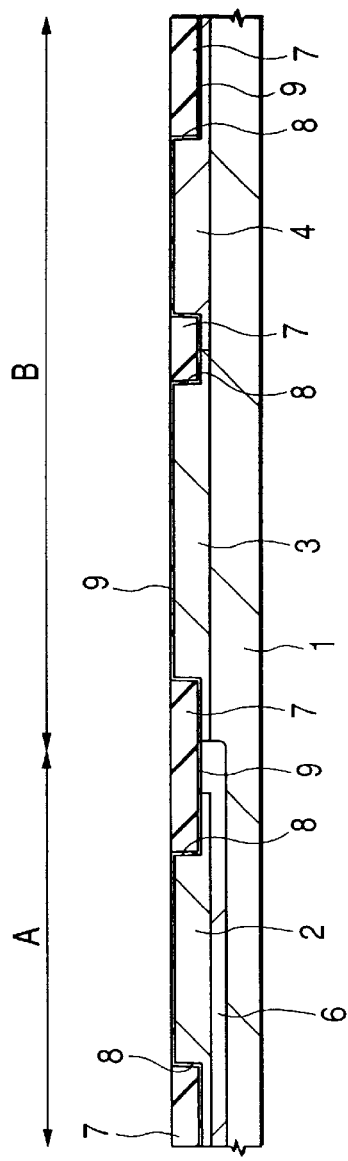
FIG. 4 is a cross-sectional view illustrating one example of a method of manufacturing the DRAM according to the first embodiment in a process sequence.
Figure 5:
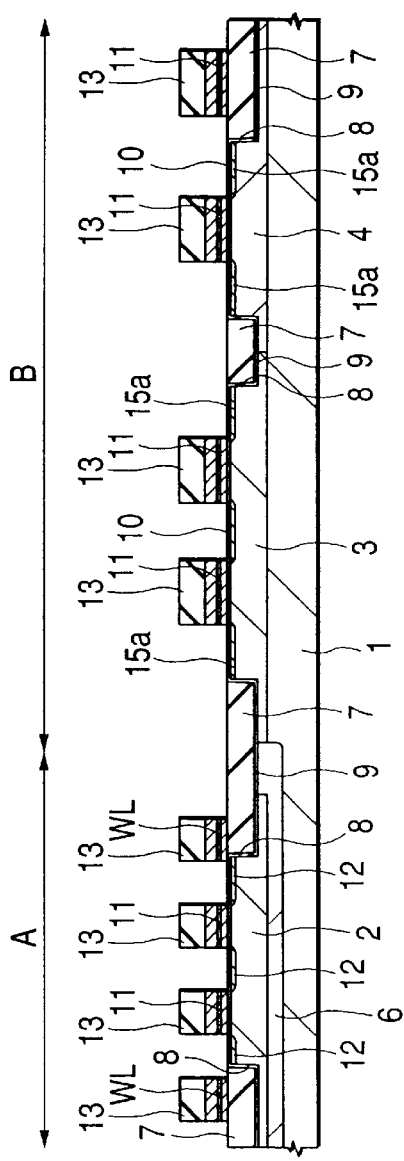
FIG. 5 is a cross-sectional view depicting one example of the method of manufacturing the DRAM according to the first embodiment in another process sequence.
Figure 6:
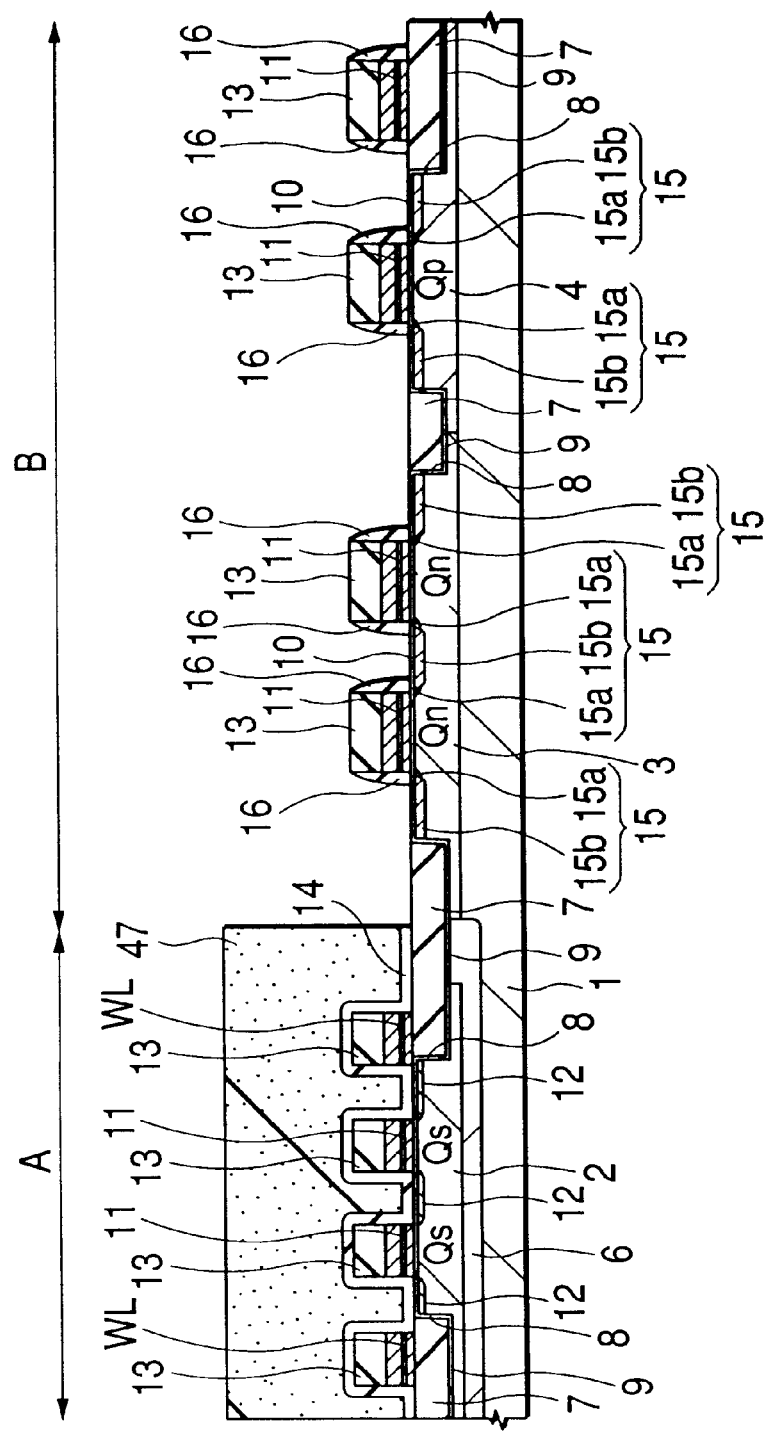
FIG. 6 is a cross-sectional view showing one example of the method of manufacturing the DRAM according to the first embodiment in a further process sequence.
Figure 7:
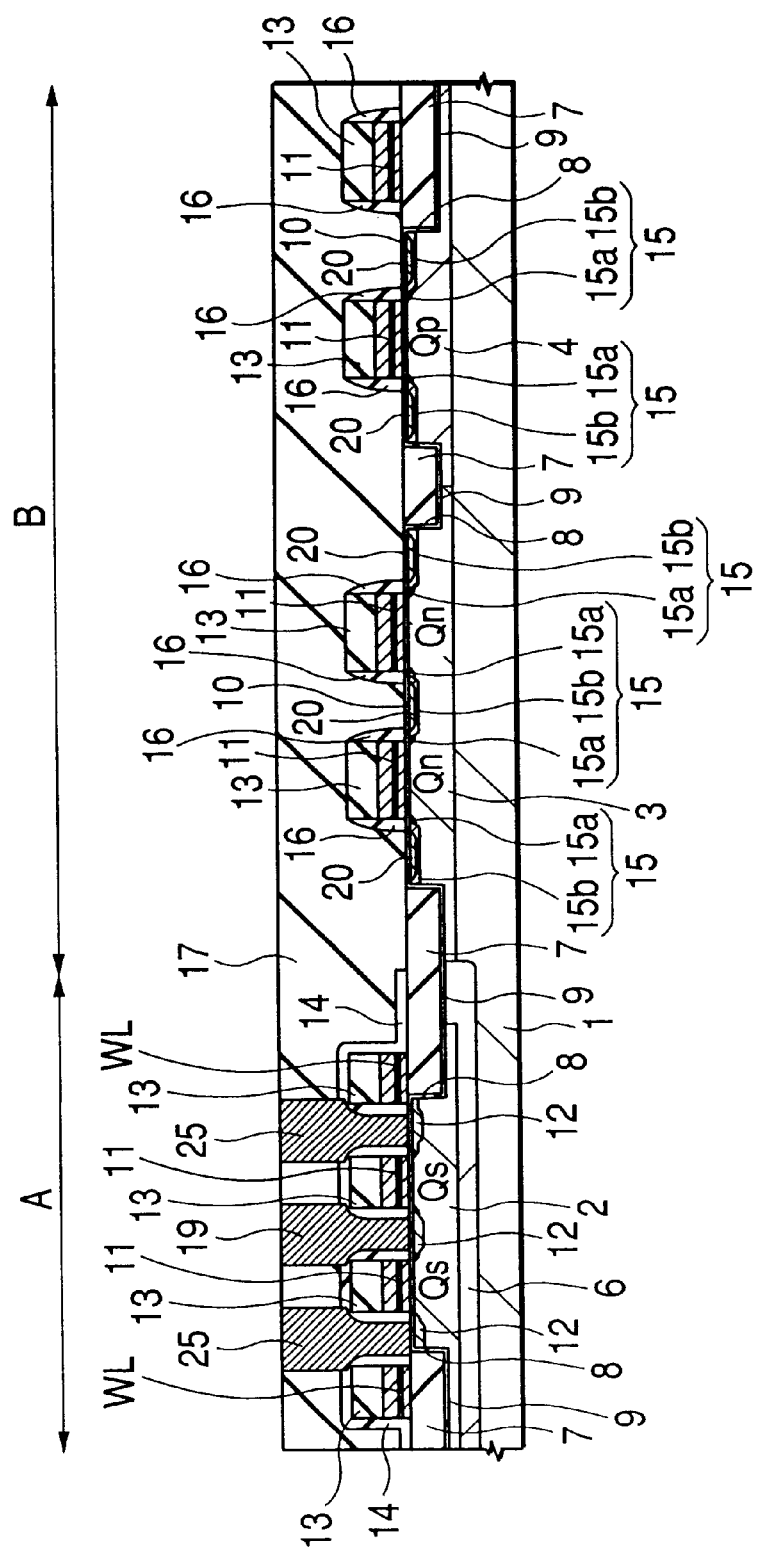
FIG. 7 is a cross-sectional view illustrating one example of the method of manufacturing the DRAM according to the first embodiment in a still further process sequence.

Next, an impurity is ion-implanted with a photoresist as a mask to form p-type wells 2 and 3, an n-type well 4 and a deep well 6 (see FIG. 4).

A gate oxide film 10 is formed in an active region in which the p-type wells 2 and 3 and the n-type well region 4 are formed, by a thermal oxidation method. Further, a polycrystal silicon film, a titanium nitride film, a tungsten film and a silicon nitride film doped with impurities are successively deposited over the entire surface of the semiconductor substrate 1. Thereafter, the silicon nitride film, tungsten film, titanium nitride film and polycrystal silicon film are patterned by using a photolithography technique and an etching technique to form gate electrodes (word lines WL) and cap insulating films 13. Further, impurities are ion-implanted with the cap insulating films 13 and the gate electrodes 11, and a photoresist being used as masks to thereby form impurity semiconductor regions 12 and low-concentration impurity regions 15a (see FIG. 5).

Next, a silicon nitride film (not shown) is deposited over the entire surface of the semiconductor substrate 1 to thereby form a photoresist film 47 only within a region (A region) in which each memory cell is formed. Thereafter, the silicon nitride film is subjected to anisotropic etching with the photoresist film as a mask to thereby form a silicon nitride film 14 only on the semiconductor substrate 1 in the A region and simultaneously form side wall spacers 16 on the side walls of the gate electrodes 11 in the B region. Further, impurities are ion-implanted on a self-alignment basis with the side wall spacers 16 as masks to thereby form high-concentration impurity regions 15b (see FIG. 6).

Next, a cobalt film (not shown) is deposited over the entire surface of the semiconductor substrate 1 by sputtering or the like with the photoresist film 47 left behind. After removal of the photoresist film 47, the deposited cobalt film is subjected to heat treatment, whereby a silicide reaction is selectively performed between the cobalt film and each high-concentration impurity region 15b. Thereafter, the non-reacted cobalt film is removed by selective etching, so that a cobalt silicide film 20 is formed over each high-concentration impurity region 15b.

Next, an SOG film is applied onto the entire surface of the semiconductor substrate 1 and cured at a temperature of about 400° C., after which it is heat-treated at a temperature of about 800° C. for stabilization. Further, a TEOS oxide film is deposited thereon by a plasma CVD method. In this case, the TEOS oxide film can be deposited thereon so that the surface thereof reaches a height of 1.3 $\mu$m as seen from the principal surface of the semiconductor substrate 1. The TEOS oxide film is polished by using the CMP method to flatten its surface. Thus, steplike offsets resulting from the gate electrodes 11 and the cap insulating films 13 can be eliminated. As a result, the focus margin in the subsequent photolithography process can be improved and hence the opening of each fine connecting hole and the like can be made. After cleaning of the surface of the TEOS oxide film, the TEOS oxide film is further deposited to repair damage from scratches on a TEOS oxide film 17d, caused by CMP.

An SOG film, a TEOS oxide film flattened by the CMP method, and an interlayer insulating film 17 comprised of a TEOS oxide film are formed in this way.

Next, each connecting hole is defined in the interlayer insulating film 17 and then is subjected to plug-implantation, after which a polycrystal silicon film doped with impurities is deposited. The polycrystal silicon film is polished by the CMP method to form plugs 19 and 25 (see FIG. 7). Incidentally, the connecting holes are opened or defined by two-stage etching, so that excessive etching of the semiconductor substrate 1 can be prevented.

Next, a TEOS oxide film 17d is formed. The elevation or height as seen from the principal surface of the semiconductor substrate 1 becomes about 0.8 µm when the TEOS oxide film 17d is formed.

Next, an opening is defined in the TEOS oxide film 17d so that the plug 19 electrically connected with each bit line BL is exposed. Thereafter, a cobalt film (not shown) is deposited over the entire surface of the semiconductor substrate 1 by sputtering or the like and then is subjected to heat treatment, whereby a silicide reaction is selectively performed between the cobalt film and the plug 19. Thereafter, each non-reacted cobalt film is selectively etched and thereafter removed, so that a cobalt silicide film 20 is formed over the plug 19.

Figure 8:
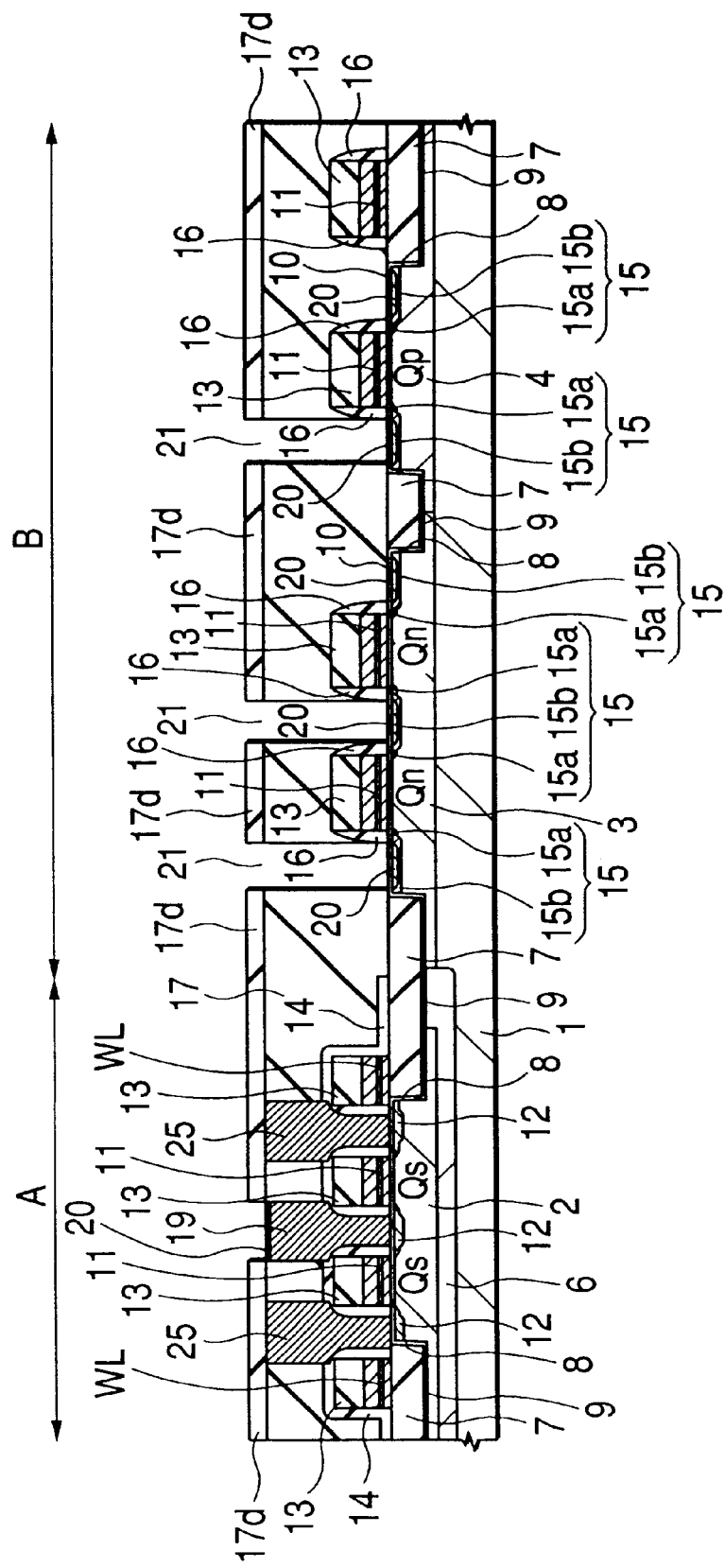
FIG. 8 is a cross-sectional view illustrating one example of the method of manufacturing the DRAM according to the first embodiment in a still further process sequence.
Figure 9:
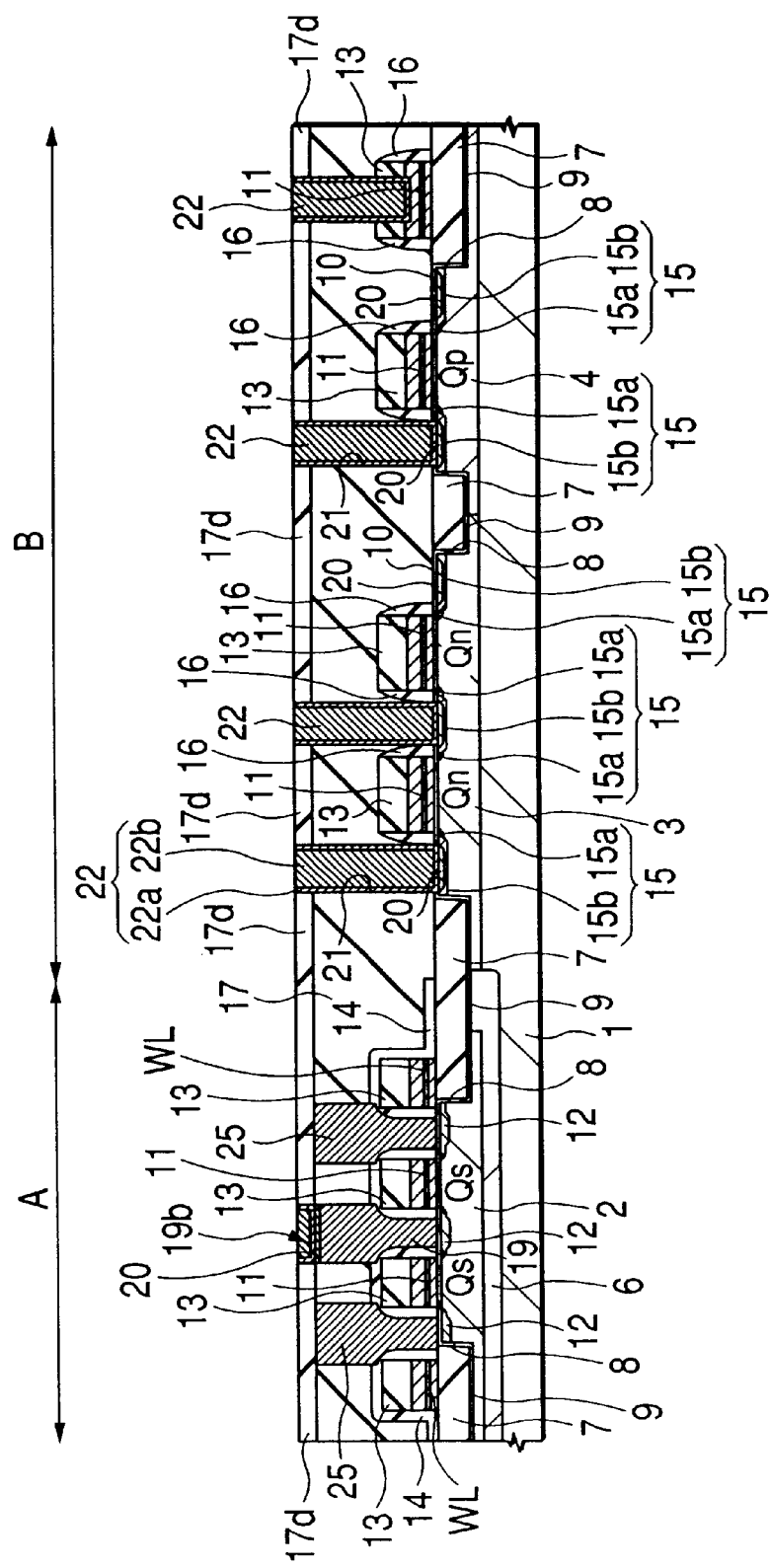
FIG. 9 is a cross-sectional view showing one example of the method of manufacturing the DRAM according to the first embodiment in a still further process sequence.

Next, connecting holes 21 are defined in the interlayer insulating film 17 so that the impurity semiconductor regions 15 and the gate electrodes 11 of the n channel MISFETs Qn and p channel MISFETs Qp are made bare (see FIG. 8). Incidentally, the cobalt silicide films 20 on the high-concentration impurity regions 15b as described previously can be also formed at this stage.

Next, a titanium nitride film 22a and a tungsten film 22b are deposited on the entire surface of the semiconductor substrate 1, i.e., the TEOS oxide film 17d containing the inside or interior of each connecting hole 21, by sputtering, for example. The titanium nitride film 22a and the tungsten film 22b on the surface of the TEOS oxide film 17d are removed by polishing using the CMP method. The plug 22 comprised of the titanium nitride film 22a and the tungsten film 22b and the plug 19b are formed in this way (see FIG. 9). Incidentally, the titanium nitride film 22a may be comprised of a film in which a titanium film and a titanium nitride film are stacked on one another.

Figure 10:
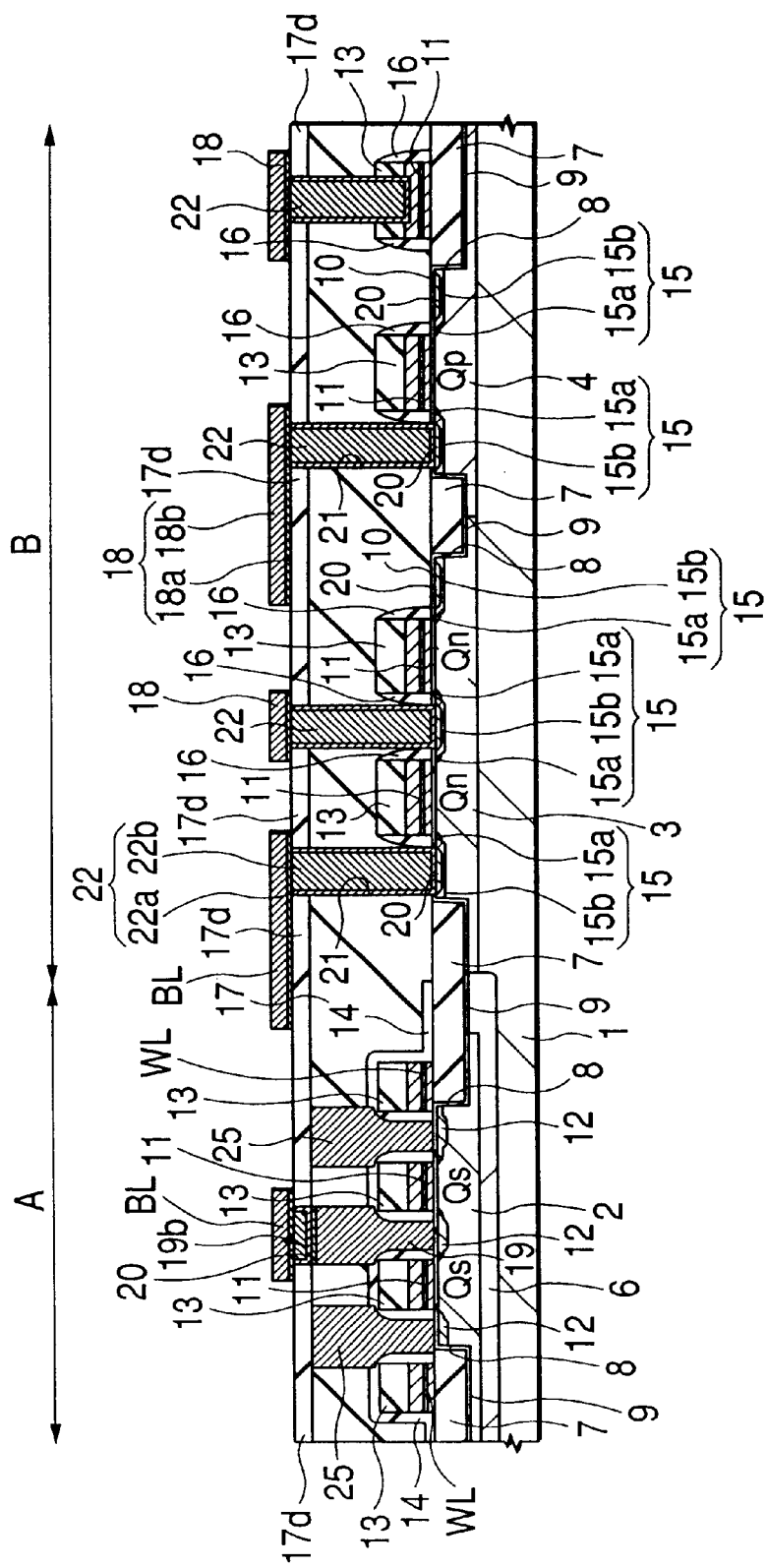
FIG. 10 is a cross-sectional view depicting one example of the method of manufacturing the DRAM according to the first embodiment in a still further process sequence.
Figure 11:
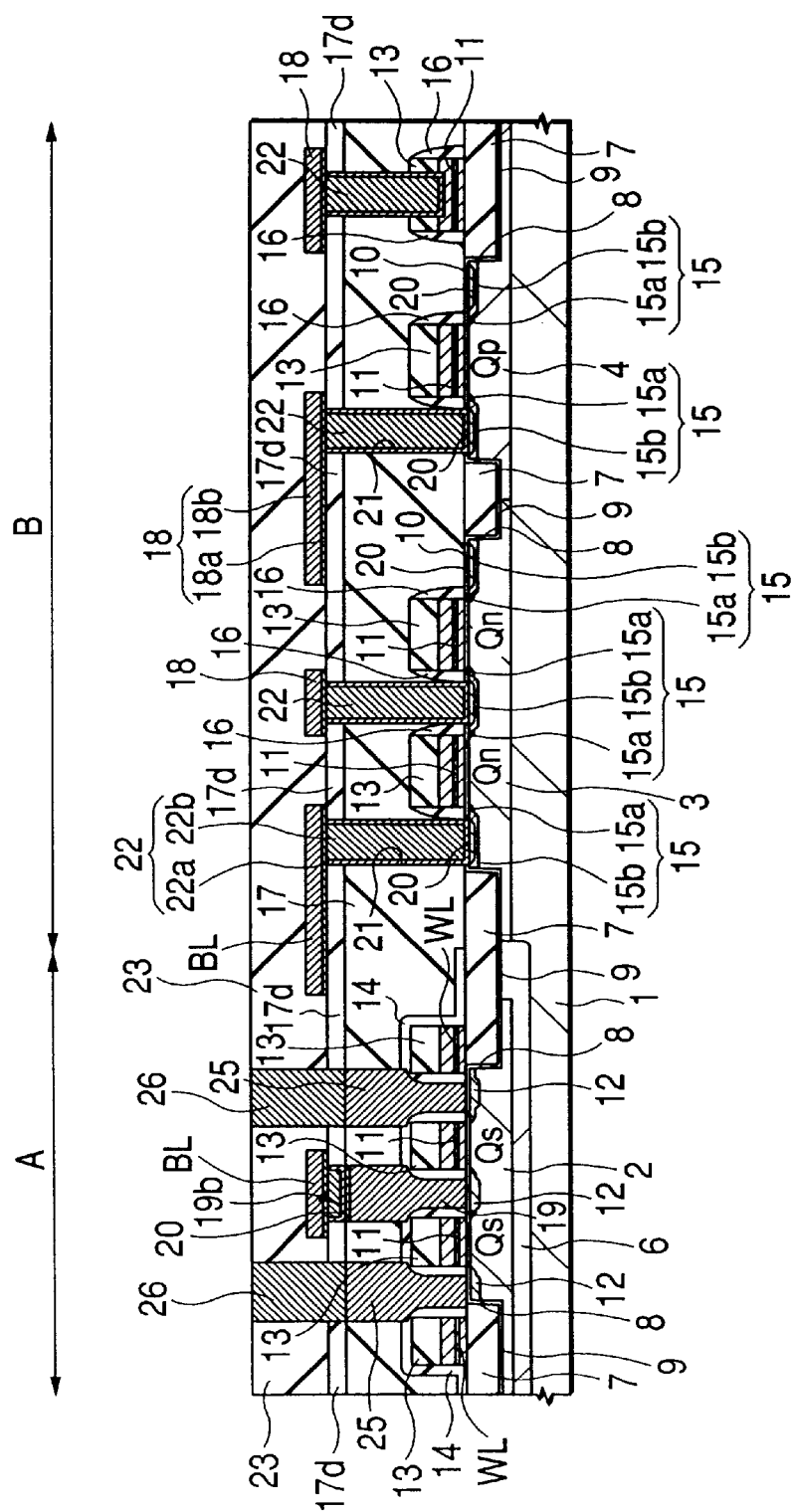
FIG. 11 is a cross-sectional view illustrating one example of the method of manufacturing the DRAM according to the first embodiment in a still further process sequence.

Next, a titanium nitride film 18a and a tungsten film 18b are successively deposited by sputtering, for example and thereafter are patterned by using photolithography and dry etching techniques to thereby form a bit line BL and a first layer interconnection 18 each comprised of the titanium nitride film 18a and the tungsten film 18b (see FIG. 10). Thus, since each bit line BL and each first layer interconnection 18 are simultaneously formed in the present embodiment, the process can be simplified. Further, since the bit line BL and the first layer interconnection 18 are formed after the formation of each plug 22, they can be decreased in thickness. As a result, the capacitance between the adjacent bit lines BL can be reduced in particular so that the sensitivity of detection of the presence or absence of stored charges can be improved.

Incidentally, the bit lines BL and the first layer interconnections 18 may be respectively formed of a single-layered tungsten film. The formation of the bit line BL and the first layer interconnection 18 from the tungsten film alone makes it possible to reduce resistance values at the same cross-sectional area state as compared with the layered film of the tungsten film and the titanium nitride film. This is based on the fact that the tungsten is lower than the titanium nitride in resistivity. Further, each of the bit line BL and the first layer interconnection 18 is provided with a cap insulating film and a side wall spacer each comprised of a silicon nitride film, for example.

Next, an SOG film is applied onto the entire surface of the semiconductor substrate 1 and cured at a temperature of about 400° C., after which a TEOS oxide film is deposited thereon by the plasma CVD method. The TEOS oxide film can be deposited thereon so that the surface thereof reaches a height of 0.8 µm as seen from the TEOS oxide film 17d. Thereafter, the TEOS oxide film is polished by using the CMP method to form an SOG film and an interlayer insulating film 23 whose surface is flattened. The surface of the flattened interlayer insulating film 23 reaches 0.6 µm in height as seen from the TEOS oxide film 17d. Thus, a focus margin in the subsequent photolithography process can be improved and hence the opening of each fine connecting hole and the like can be performed. After cleaning of the surface of the interlayer insulating film 23, the TEOS oxide film may further be deposited so as to cover scratches formed by CMP.

Next, each connecting hole is defined in the interlayer insulating film 23, after which a polycrystal silicon film doped with impurities is deposited. The polycrystal silicon film is polished by the CMP method to form plugs 26 (see FIG. 11).

Figure 12:
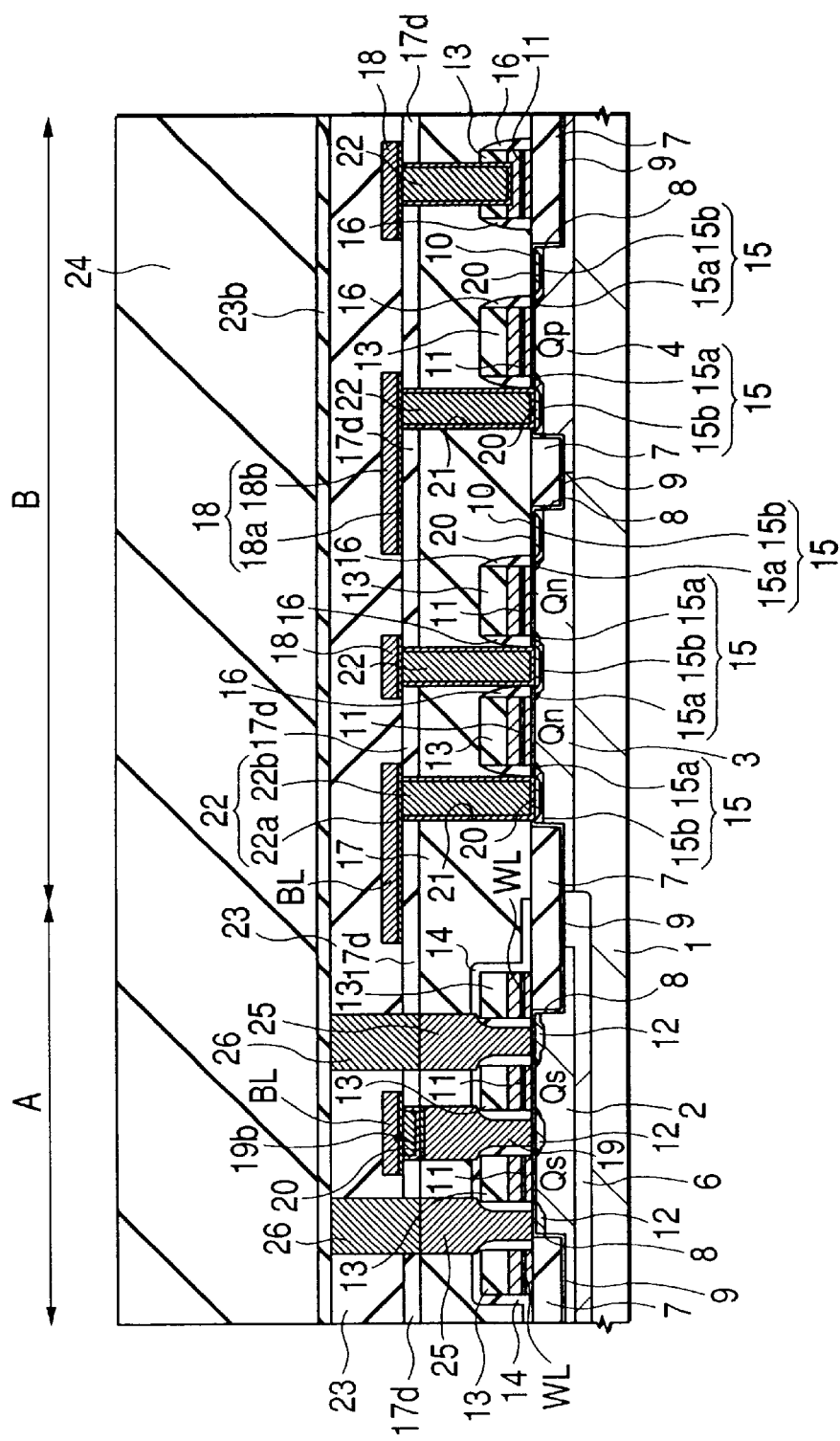
FIG. 12 is a cross-sectional view showing one example of the method of manufacturing the DRAM according to the first embodiment in a still further process sequence.
Figure 13:
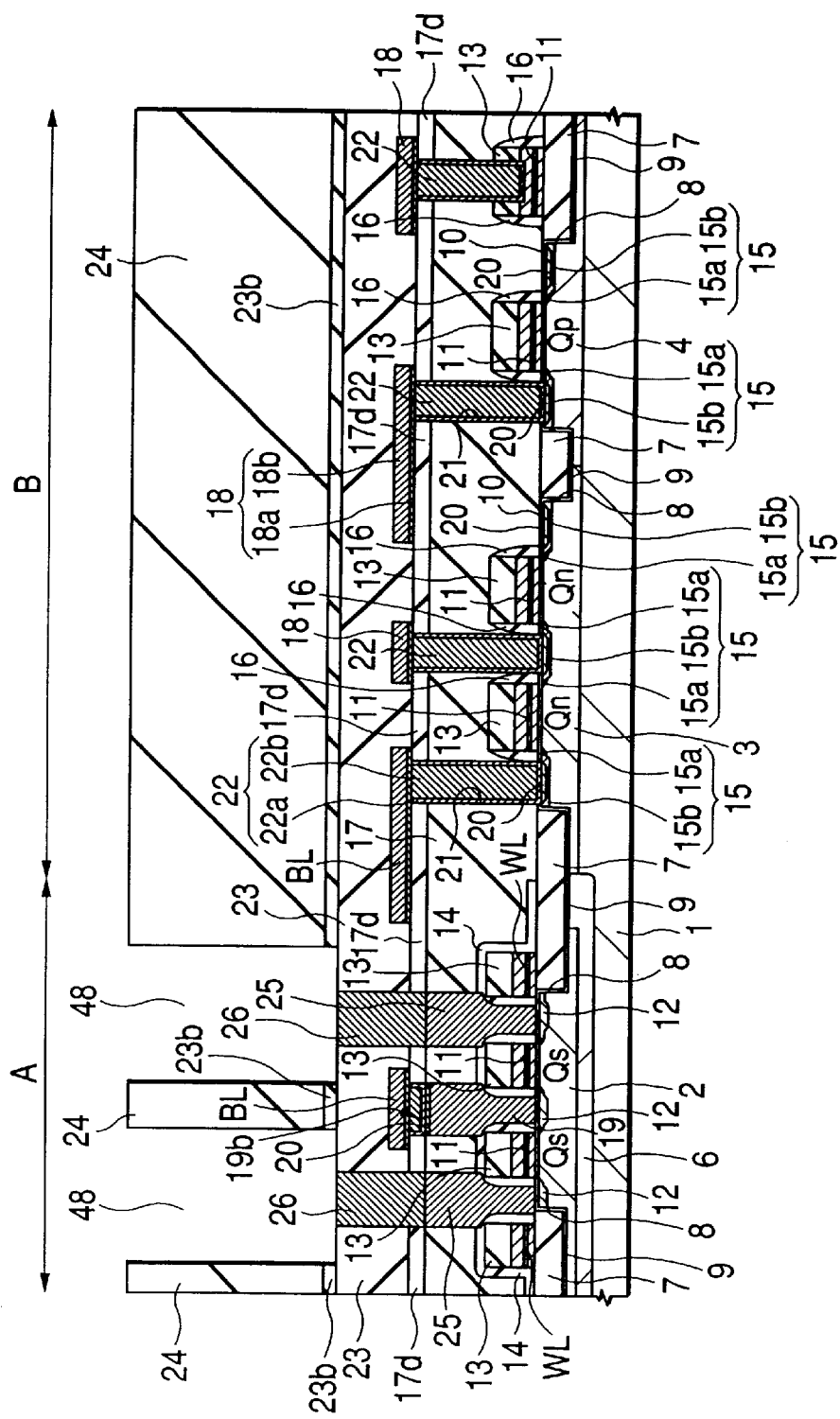
FIG. 13 is a cross-sectional view illustrating one example of the method of manufacturing the DRAM according to the first embodiment in a still further process sequence.
Figure 14:
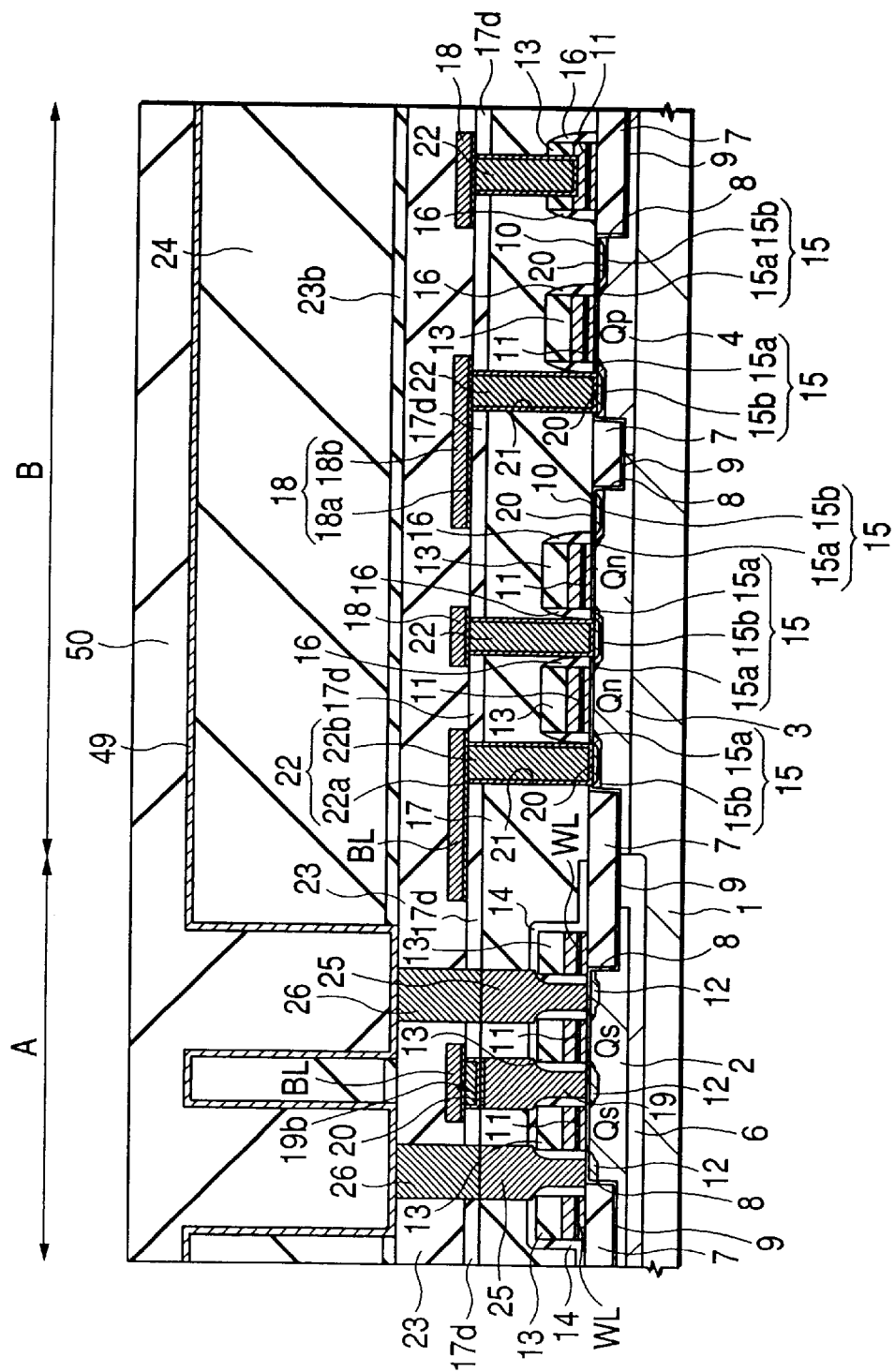
FIG. 14 is a cross-sectional view depicting one example of the method of manufacturing the DRAM according to the first embodiment in a still further process sequence.

Next, a silicon nitride film 23b having a thickness of 200 nm is formed over the entire surface of the semiconductor substrate 1 and an insulating film 24 is deposited thereon (see FIG. 12). The deposition of the insulating film 24 can be performed by the plasma CVD method. The thickness of the insulating film 24 will be defined as 1.2 µm.

A process for forming a capacitor C will next be described. The required storage capacity thereof is about 30 pF.

Each of grooves 48 is defined within a capacitor C forming region with dimensions of 0.75×0.25 µm. Each plug 26 is made bare by the formation of the groove 48 (see FIG. 13). The formation of the groove 48 can be performed using photolithography and dry etching techniques.

Next, a polycrystal silicon film 49, which covers the grooves 48, is deposited over the entire surface of the semiconductor substrate 1. Further, a silicon oxide film 50 is deposited over the entire surface of the semiconductor substrate 1 (see FIG. 14). The polycrystal silicon film 49 can be doped with phosphorus. The thickness thereof can be set to 0.03 µm. Since the thickness of the polycrystal silicon film 49 is sufficiently thinner than the size of each groove 48, the polycrystal silicon film 49 is deposited even inside each groove 48 with good step coverage. The silicon oxide film 50 is deposited so as to be buried or embedded into the groove 48. If consideration is given to the embeddability of the silicon oxide film 50 inside the groove 48, then the silicon oxide film 50 can be formed as an SOG film or a silicon oxide film produced by the CVD method using TEOS.

Figure 15:
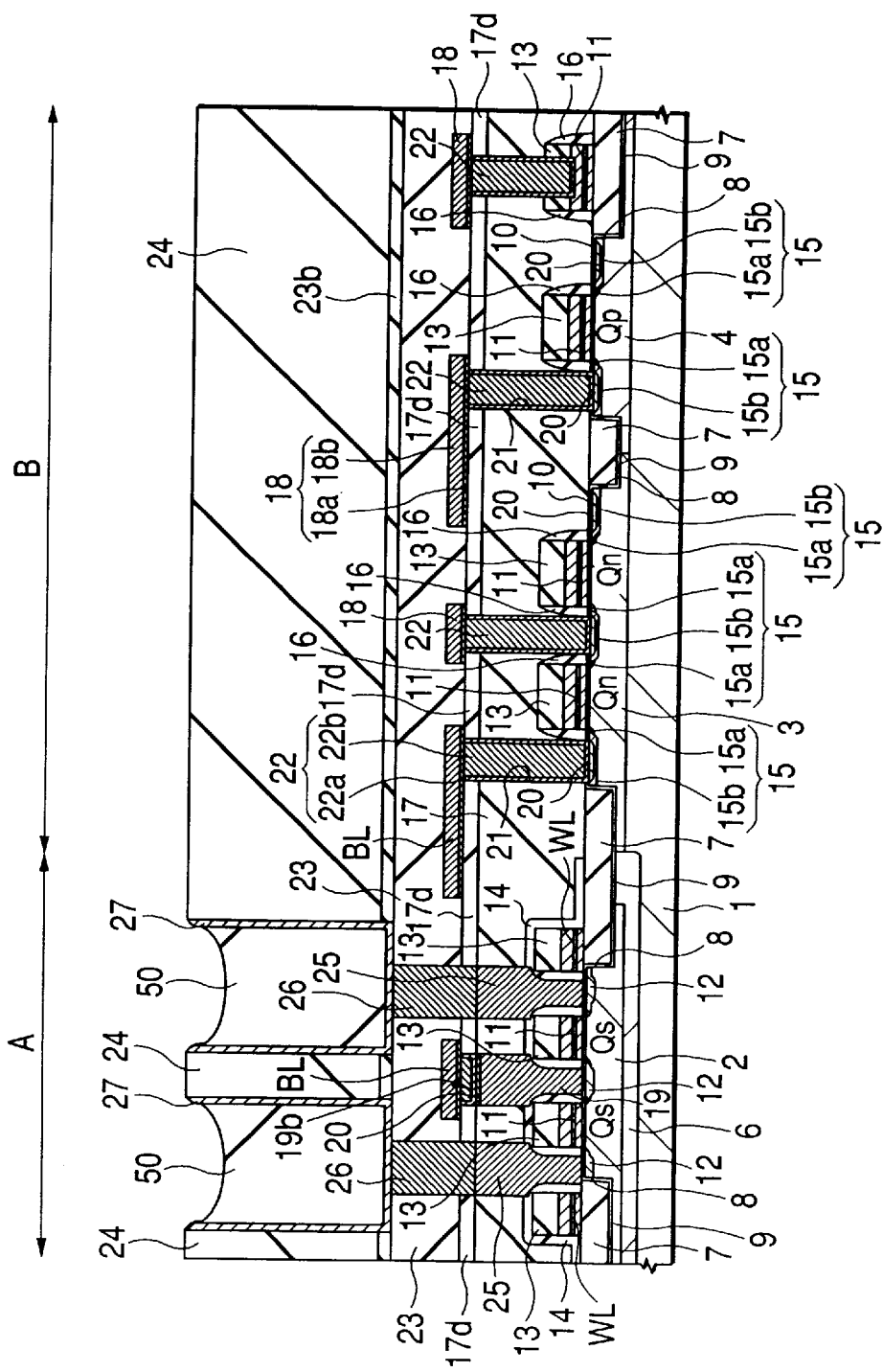
FIG. 15 is a cross-sectional view showing one example of the method of manufacturing the DRAM according to the first embodiment in a still further process sequence.

Next, the silicon oxide film 50 and the polycrystal silicon film 49 on each insulating film 24 are removed to form lower electrodes 27 for capacitors C (see FIG. 15). The removal of the silicon oxide film 50 and the polycrystal silicon film 49 can be performed by an etchback method or the CMP method. The silicon oxide film 50 remains inside each lower electrode 27.

Figure 16:
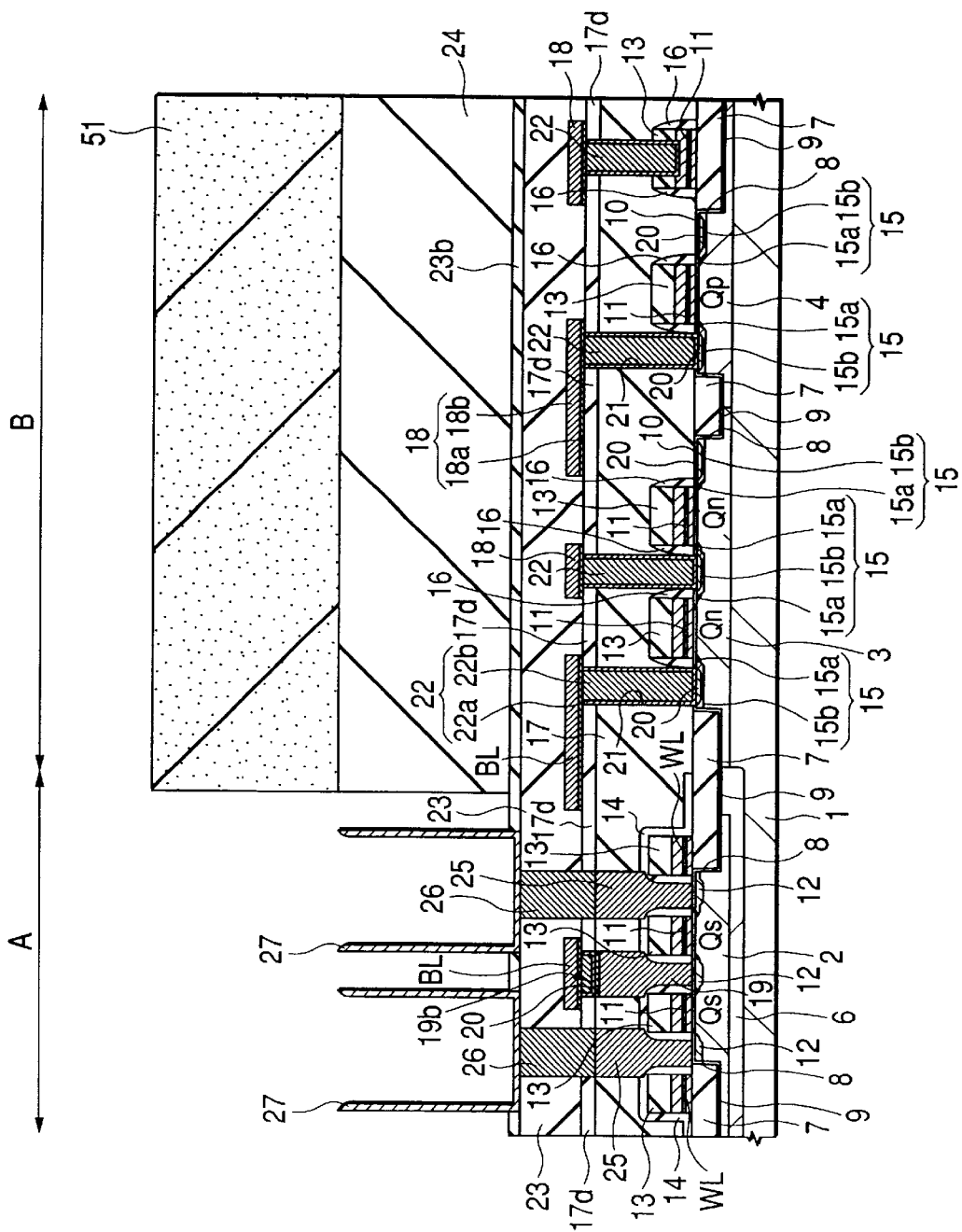
FIG. 16 is a cross-sectional view illustrating one example of the method of manufacturing the DRAM according to the first embodiment in a still further process sequence.
Figure 17:
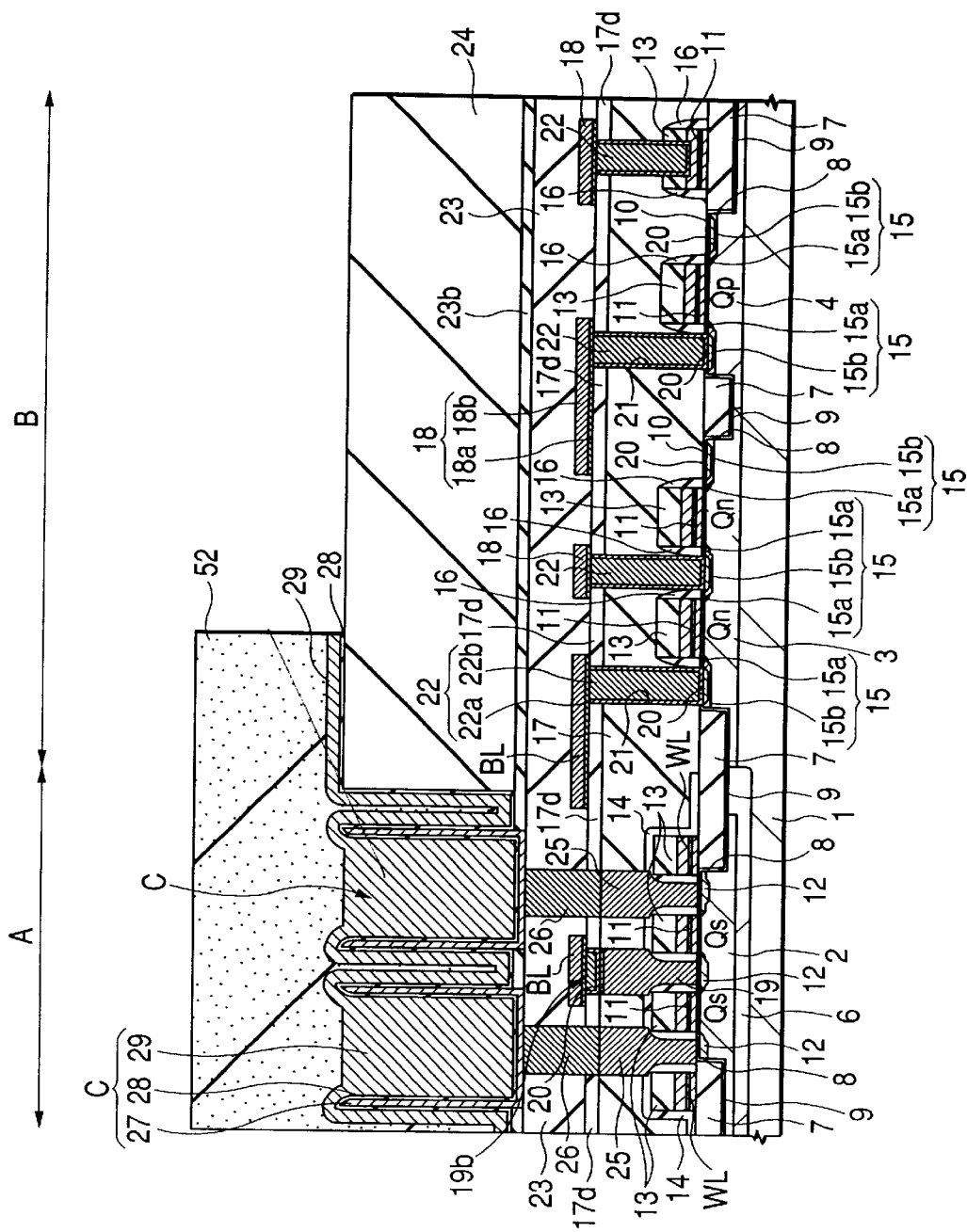
FIG. 17 is a cross-sectional view depicting one example of the method of manufacturing the DRAM according to the first embodiment in a still further process sequence.

Wet etching is next performed with a photoresist film 51 as a mask to remove each insulating film 24 and silicon oxide film 50 in the memory cell array region (A region) (see FIG. 16). As a result, the lower electrodes 27 are exposed.

Incidentally, the silicon nitride film 23b serves as an etching stopper in the wet etching process. Further, since the edge of each insulating film 24 is etched by wet etching, it is illustrated as being sharp (at right angles) for simplicity, although it is not strictly sharp as shown in the drawing.

Since the insulating film 24 is left within the peripheral circuit region (B region) in this way, a large steplike offset caused by the height (which is even with the height of each lower electrode 27) of the capacitor C is not formed between the memory cell array (A region) and the peripheral region (B region) subsequent to the formation of the capacitor C. Therefore, photolithography corresponding to a process subsequent to the process in which the capacitor C is formed can be definitely performed, thus facilitating provisions for high integration of the DRAM.

Next, a tantalum oxide film is deposited after the surface of each lower electrode 27 has been subjected to nitriding or oxidizing/nitriding treatment. The deposition of the tantalum oxide film can be formed by the CVD method with an organic tantalum gas as a raw material. The tantalum oxide film in this stage has an amorphous structure. Now, a capacitive insulating film 28 is formed as a dielectric more rigid as a tantalum oxide film ($Ta_2O_5$) crystallized (polycrystallized) by subjecting the tantalum oxide film to heat treatment. It is necessary to perform this heat treatment at a temperature higher than or equal to 700° C. Thus, the heat resistance of each member formed before the present heat treating process presents a problem. In the present embodiment, however, the second layer interconnection and the like, which present a problem in heat resistance, are not yet formed. It is therefore unnecessary to give a particular limitation to the heat treating process. Therefore, a polycrystal tantalum oxide film large in dielectric constant can be stably formed and the storage capacity of the capacitor C can be increased without increasing the area on which the capacitor C is formed.

Further, a titanium nitride film is deposited by the CVD method. Thereafter, the titanium nitride film and the polycrystal tantalum oxide film are patterned using a photoresist film 52 to thereby form a capacitive insulating film 28 and a plate electrode 29 (see FIG. 17). The capacitor C comprised of the lower electrode 27, capacitive insulating film 28 and plate electrode 29 is formed in this way.

Figure 18:
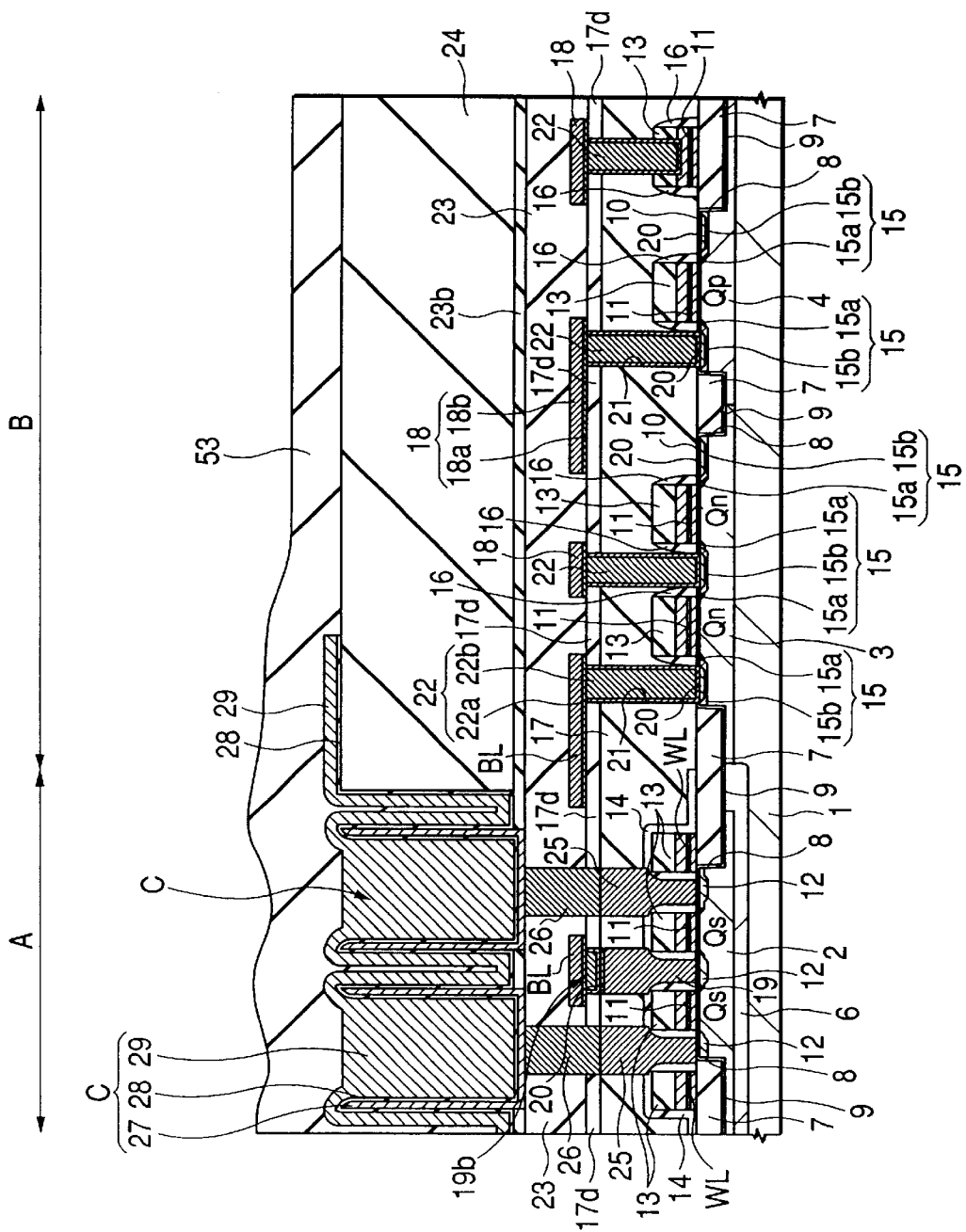
FIG. 18 is a cross-sectional view illustrating one example of the method of manufacturing the DRAM according to the first embodiment in a still further process sequence.
Figure 19:
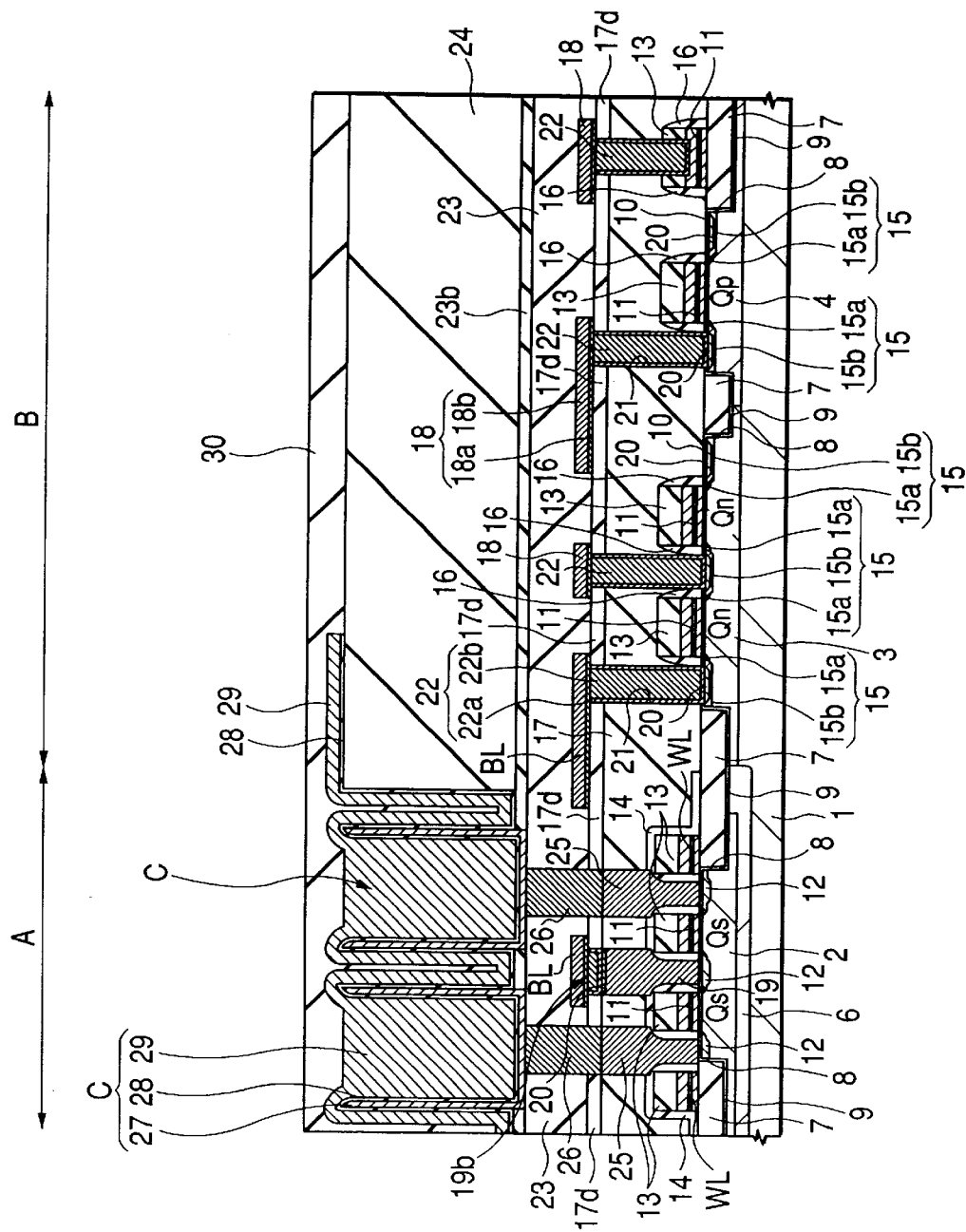
FIG. 19 is a cross-sectional view showing one example of the method of manufacturing the DRAM according to the first embodiment in a still further process sequence.

Next, a TEOS oxide film 53 is deposited over the entire surface of the semiconductor substrate 1 (see FIG. 18). The TEOS oxide film 53 is used to provide electrical isolation of the plate electrode 29. The thickness thereof is set to 0.3 μm. The TEOS oxide film 53 is flattened by being polished by the CMP method to thereby form an insulating film 30 (see FIG. 19). At this stage, the distance between the upper surface of the insulating film 30 and the first layer interconnection 18 is 1.4 μm. Thus, since the insulating film 24 reduces or controls a steplike offset or difference in level between the memory cell array region (A region) and the peripheral circuit region (B region) in advance, the load on a CMP process for flattening the TEOS oxide film 53 to form the insulating film 30 can be lightened. Further, since the surface of the insulating film 30 is flattened, the subsequent photolithography process can be performed precisely, so that micro-processing can be done. Even if interconnections are formed using a so-called damascene method, as will be described later, no residual metal occurs in the surface of the insulating film 30.

Figure 20:
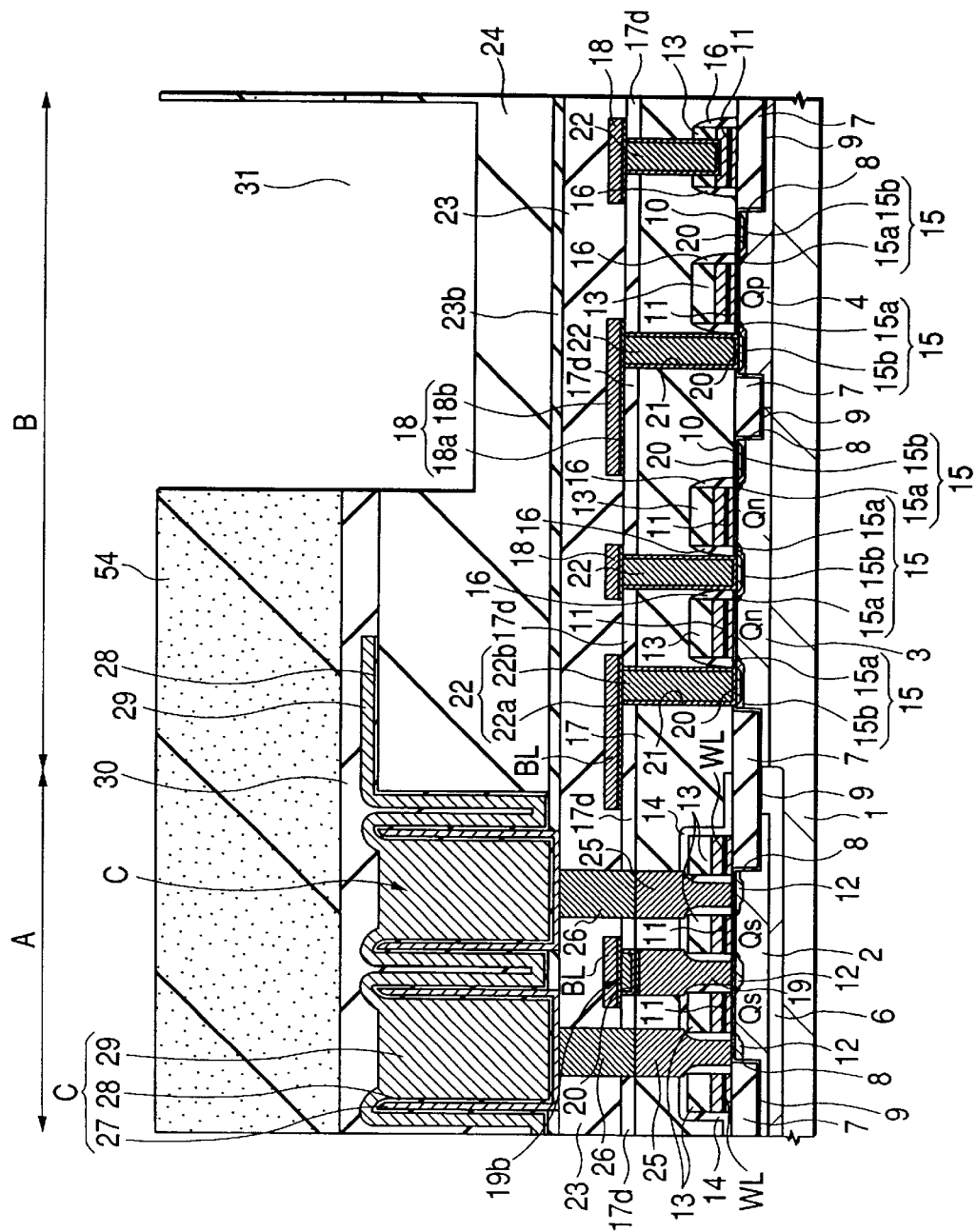
FIG. 20 is a cross-sectional view depicting one example of the method of manufacturing the DRAM according to the first embodiment in a still further process sequence.

Next, the insulating film 30 and the insulating film 24 are etched by dry etching using a photoresist film 54 to form each wiring or interconnection groove 31 (see FIG. 20). Further, the photoresist film 54 is removed and thereafter a photoresist film 55 is formed. The insulating film 24, silicon nitride film 23b and interlayer insulating film 23 are etched by dry etching using the photoresist film 55 to thereby form connecting holes 33 (see FIG. 21). Thus, since the connecting hole 33 is defined below the bottom face of each interconnection groove 31, an etching depth formed by dry etching for processing the connecting hole 33 becomes shallow. Therefore, an etching aspect ratio of the connecting hole 33 in the dry etching process can be reduced and its etching processing can be facilitated. As a result, a failure in the processing of each connecting hole 33 in the dry etching process is reduced, whereby the manufacturing yield and reliability of the DRAM can be improved.

Next, a tantalum film 56 is deposited over the entire surface of the semiconductor substrate 1 containing the interior of the interconnection grooves 31 and connecting holes 33 by the sputtering or CVD method. Further, a copper film 57 is deposited over the tantalum film 56 (see FIG. 22). The deposition of the copper film 57 can be performed by a plating method such as electrolytic plating or electroless plating or the like. Sine a plating method is used, the copper film 57 can be satisfactorily embedded even in a fine space like the connecting hole 33.

The copper film 57 and the tantalum film 56 on the insulating film 30 in the region other than the interconnection grooves 31 are removed by being polished using the CMP method. Thus, a second layer interconnection 32 is formed within each interconnection groove 31, whereas a connection portion 34 is formed within each connecting hole 33 (see FIG. 23). The tantalum film 56 serves as a first conductive layer 32a of each second layer interconnection 32 and a first conductive layer 34a of each connecting portion 34. The copper film 57 serves as a second conductive layer 32b of each second layer interconnection 32 and a second conductive layer 34b of each connecting portion 34. As described above, the second layer interconnection 32 is formed integrally with the connecting portion 34. As mentioned previously, each of the first conductive layers 32a and 34a functions as a barrier film composed of copper, and the second conductive layers 32b and 34b serve as principal conductive layers of the second layer interconnection 32 and the connecting portion 34.

In the present embodiment, the thickness (corresponding to the depth of each interconnection groove 31) of the second layer interconnection 32 can be set to 0.7 μm and the length (corresponding to the depth of each connecting hole 33) of each connecting portion 34 can be set to 0.7 μm. A niobium film, a tantalum nitride film, a titanium nitride film or a tungsten nitride film may be used as an alternative to the tantalum film 56. Alternatively, a layered film of these elements may be used. The niobium film, tantalum nitride film, titanium nitride film or tungsten nitride film can be also deposited by the sputtering or CVD method.

Figure 24:
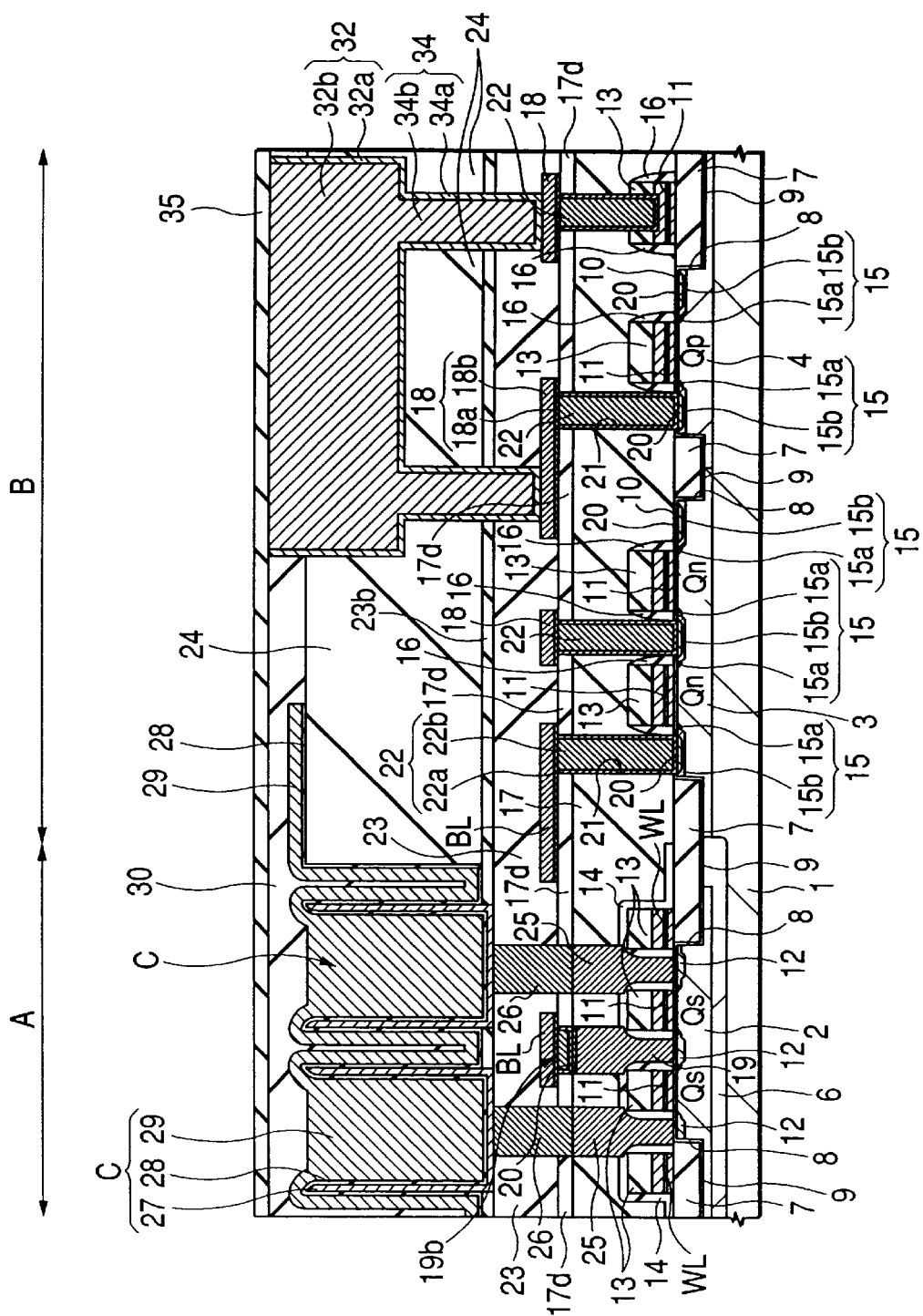
FIG. 24 is a cross-sectional view illustrating one example of the method of manufacturing the DRAM according to the first embodiment in a still further process sequence.
Figure 25:
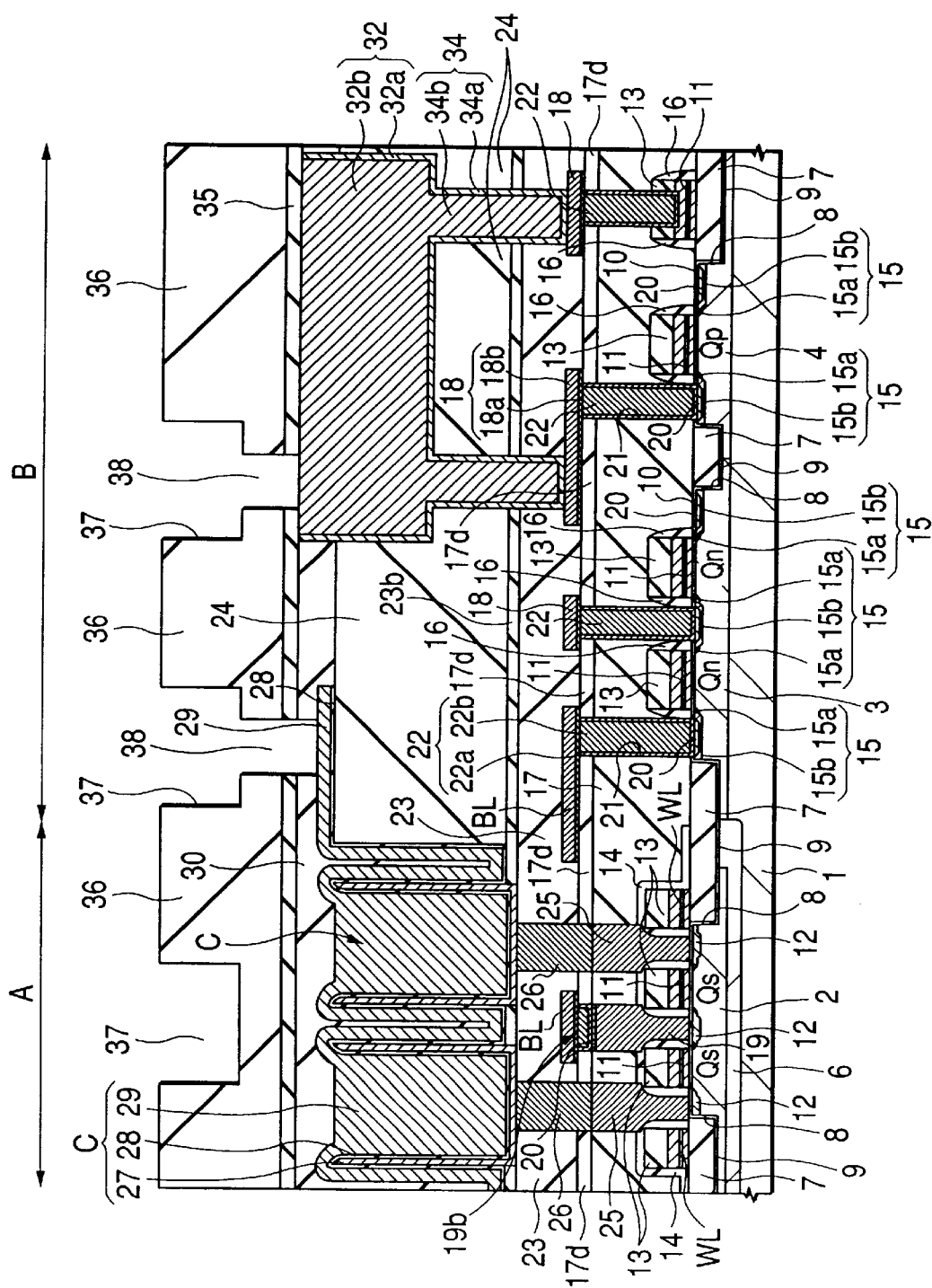
FIG. 25 is a cross-sectional view showing one example of the method of manufacturing the DRAM according to the first embodiment in a still further process sequence.

Next, a silicon nitride film 35 is deposited over the insulating films 30 and the second layer interconnections 32 (see FIG. 24). The deposition of the silicon nitride film 35 is performed by the plasma CVD method or sputtering method. The diffusion of copper from the second layer interconnection 32 can be controlled or restrained by the silicon nitride film 35.

Next, an interlayer insulating film 36 is deposited over the silicon nitride film 35. A TEOS oxide film can be deposited as the interlayer insulating film 36. Further, the interlayer insulating film 36, the silicon nitride film 35 or the insulating film 30 is etched by dry etching with the photoresist film being used as a mask in a manner similar to the above-described wiring grooves 31 and connecting holes 33 to thereby form wiring or interconnection grooves 37 and connecting holes 38 (see FIG. 25).

Figure 26:
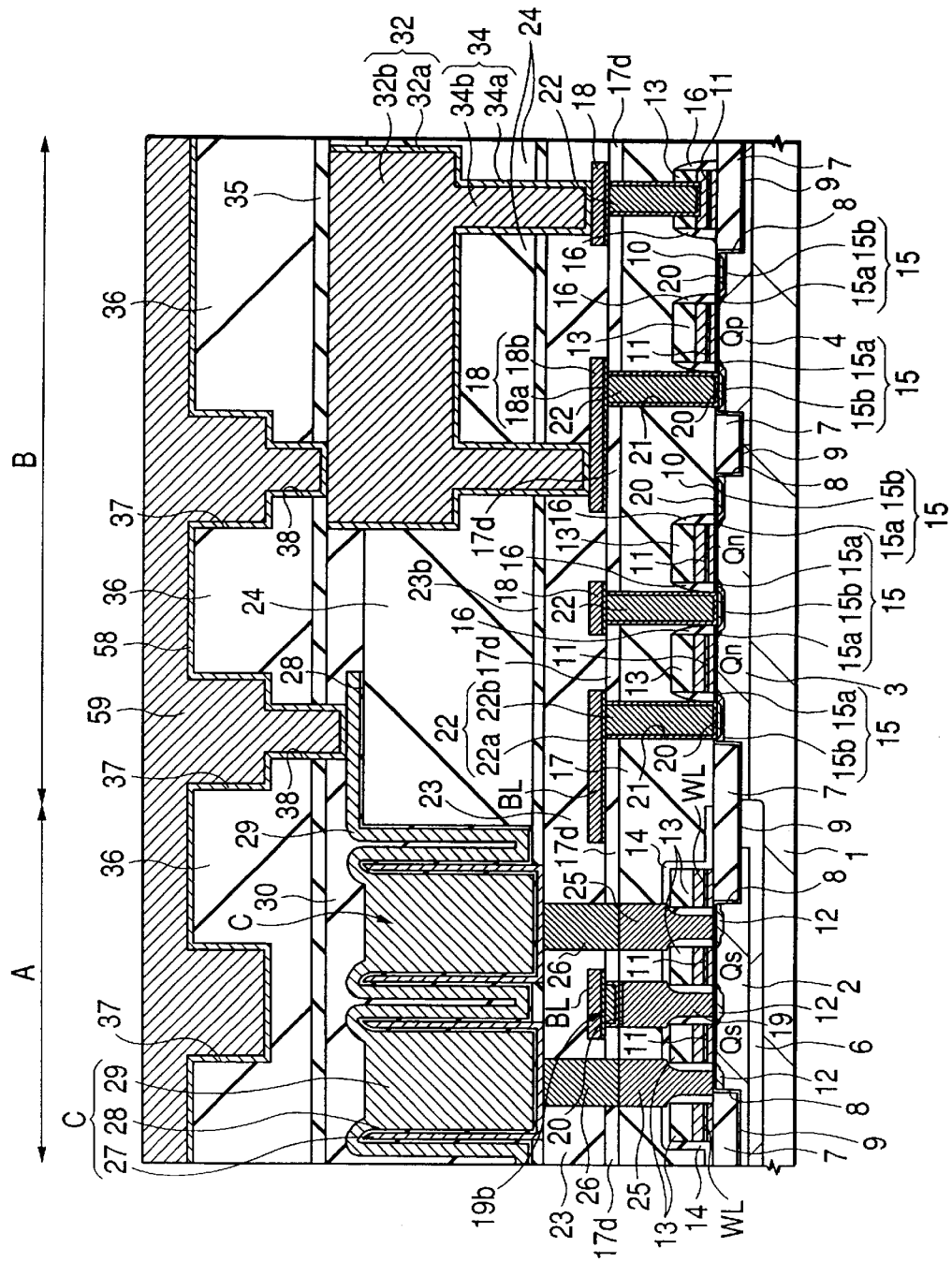
FIG. 26 is a cross-sectional view depicting one example of the method of manufacturing the DRAM according to the first embodiment in a still further process sequence.
Figure 27:
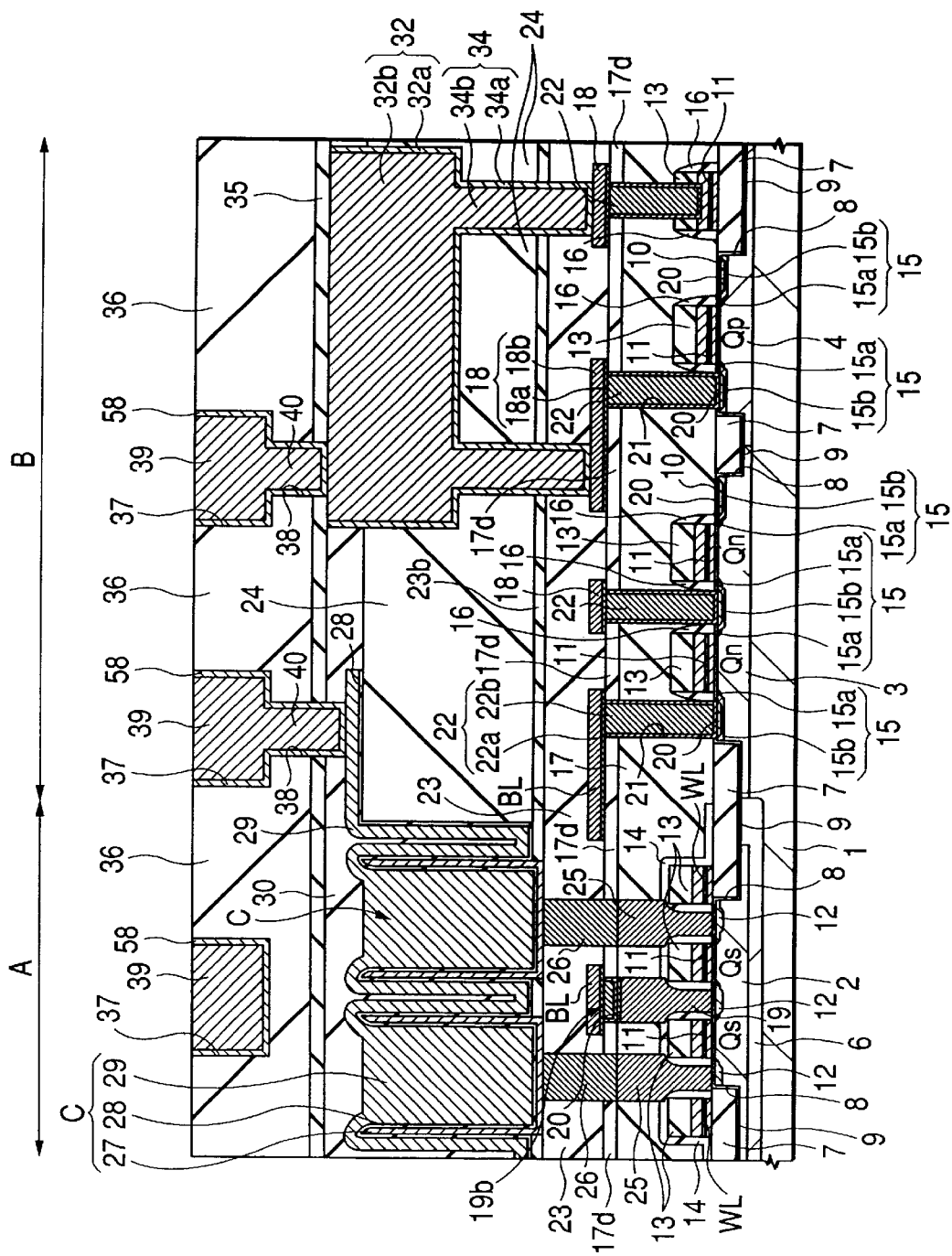
FIG. 27 is a cross-sectional view illustrating one example of the method of manufacturing the DRAM according to the first embodiment in a still further process sequence.
Figure 28:
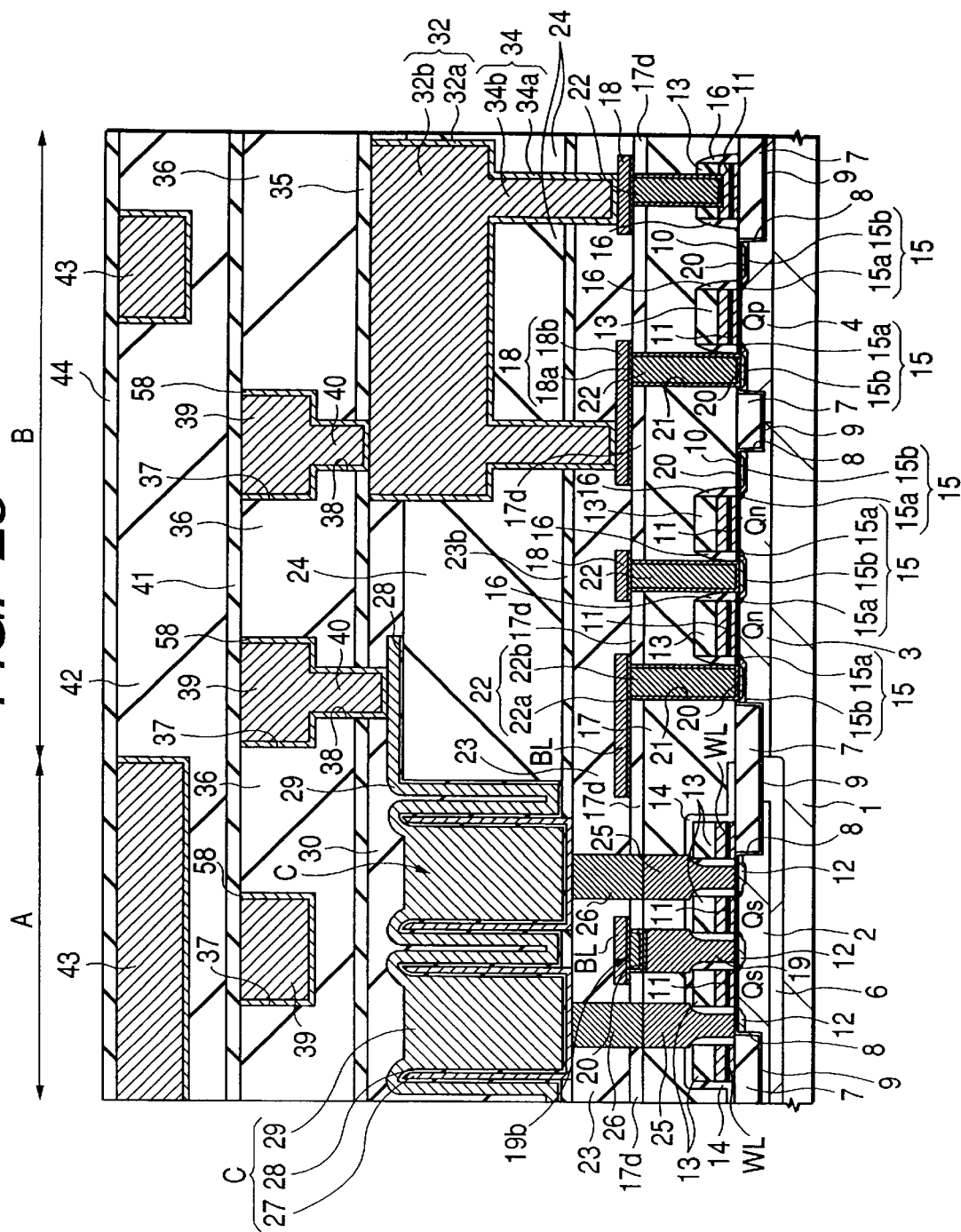
FIG. 28 is a cross-sectional view showing one example of the method of manufacturing the DRAM according to the first embodiment in a still further process sequence.

A tantalum film 58 and a copper film 59 are next deposited over the entire surface of the semiconductor substrate 1 containing the interior of the interconnection grooves 37 and connecting holes 38 in a manner similar to the above-described tantalum film 56 and copper film 57 (see FIG. 26). Further, the tantalum film 58 and the copper film 59 on each interlayer insulating film 36 are removed by polishing using the CMP method to thereby form third layer interconnections 39 within the interconnection grooves 37 and form connecting portions 40 within the connecting holes 38 (see FIG. 27). Each tantalum film 58 serves as a first conductive layer 39a of the third layer interconnection 39 and a first conductive layer 40a of the connecting portion 40. Further, the copper film 59 serves as a second conductive layer 39b of the third layer interconnection 39 and a second conductive layer 40b of the connecting portion 40. The integral formation of the third layer interconnection 39 and the connecting portion 40 is similar to the second layer interconnection 32. Each of the first conductive layers 39a and 40a functions as a barrier film composed of copper, and the second conductive layers 39b and 40b serve as principal conductive layers of the third layer interconnection 39 and the connecting portion 40, as mentioned above.

Incidentally, a niobium film, a tantalum nitride film, a titanium nitride film or a tungsten nitride film may be used as an alternative to the tantalum film 58. Alternatively, a layered film of these may be used. The niobium film, tantalum nitride film, titanium nitride film or tungsten nitride film can be also deposited by the sputtering or CVD method.

Next, a silicon nitride film 41 is deposited over the interlayer insulating film 36 and the third layer interconnections 39. In a manner similar to the third layer interconnection 39, a silicon nitride film 44 is deposited after the formation of an interlayer insulating film 42, fourth layer interconnections 43 and unillustrated connecting portions (see FIG. 28). Since the details of these are similar to the third layer interconnections 39, their description will be omitted.

Finally, an insulating film 45 is deposited over the entire surface of the semiconductor substrate 1 and thereafter is subjected to hydrogen annealing at a temperature of 400° C. to recover damage of each MISFET. Further, a passivation film 46 is deposited over the entire surface of the semiconductor substrate 1 to thereby substantially complete the DRAM shown in FIG. 3.

According to the DRAM and the manufacturing method therefor, the insulating film 30 is flattened and the steplike offset between the memory cell array region (A region) and the peripheral circuit region (B region) is eliminated. Therefore, the accuracy of processing can be improved by precisely performing the process steps subsequent to each second layer interconnection 32. Further, since the connecting holes 33 are defined below the bottom faces of the interconnection or wiring grooves 31, the aspect ratio of each connecting hole according to the thicknesses of the insulating film 30 and the insulating film 24, which results from the elimination of the steplike offset, can be reduced. It is thus possible to reliably open or define each connecting hole 33 and improve the yield and reliability of the DRAM. Therefore, the bottom face of each second layer interconnection 32 is positioned below the upper surface of the capacitor C.

Since the depth of the connecting hole 33 becomes shallow, the length of the connecting portion 34 becomes short so that the resistance thereof can be reduced. It is thus possible to reduce the resistance between the first layer interconnection 18 and the second layer interconnection 32 and improve performance, such as a quick response characteristic or performance or the like of each peripheral circuit of the DRAM.

Further, the copper material can be used for the principal conductive layers (second conductive layers 32b and 34b) of the second layer interconnection 32 and the connecting portion 34 so as to less reduce the resistance of the second layer interconnection 32 and the connecting portion 34 and further improve the performance of the DRAM.

Since the second layer interconnections 32 and the connecting portions 34 are formed after the formation of the capacitor C in the present embodiment, it is not necessary to impose restrictions on the heat treatment in the process of forming the capacitive insulating film 28 for each capacitor C. Further, the capacitive insulating film 28 stable and high in dielectric constant can be formed and the storage capacitance value of the capacitor C can be made great. It is unnecessary to reversely adopt a polycrystal silicon film and a tungsten film high in heat resistance as materials for the second layer interconnection 32 and the connecting portion 34. Copper apt to thermally diffuse can be utilized. It is thus possible to reduce the resistance of the second layer interconnection 32 and the connecting portion 34 using copper which is high in conductivity and thereby improve the performance of the DRAM.

Incidentally, the present embodiment will be described in comparison with the technique or the like described in Japanese Patent Application Laid-Open No. Hei 9-92794 in order to explain the effects of the present embodiment.

The technique described in Japanese Patent Application Laid-Open No. Hei 9-92794 has a drawback in that since each plug for connecting a first layer interconnection and a second layer interconnection is formed before a capacitor forming process, the number of plug forming processes increases. Since a capacitor is formed after the formation of the second layer interconnection in addition to the above, a material like copper which is high in diffusion coefficient cannot be used for the second layer interconnection. If the copper is used for the second layer interconnection, then a heat treating process at a high temperature of 700° C. cannot be adopted for the capacitor forming process. However, such a malfunction does not occur in the present embodiment.

In a DRAM which does not adopt the structure according to the present embodiment, a second layer interconnection is formed even on each memory cell array after a forming process of a capacitor C. However, a silicon oxide film is further deposited with a thickness of about 0.3 $\mu$m to satisfy the need for ensuring insulation from a plate electrode, for example. Therefore, the interval between the second layer interconnection and a first layer interconnection becomes 1.7 $\mu$m. Since the second layer interconnection is formed on an insulating film for solving or eliminating a steplike offset between a memory cell array region and a peripheral circuit region, the depth of each connecting hole for electrically connecting the second layer interconnection and the first layer interconnection reaches 1.7 $\mu$m. Even if the 0.3 $\mu$m-thick silicon oxide film is not formed, then the depth of each connecting hole results in 1.4 $\mu$m. Accordingly, the length of each plug for electrically connecting the second layer interconnection and the first layer interconnection reaches 1.4 $\mu$m or more. The formation of such a plug having a high aspect ratio needs to adopt a titanium nitride film embeddable even in a deep connecting hole or a tungsten film based on a blanket CVD method or the like. Thus, the resistance of each plug formed by such a technique becomes about 5Ω. Further, since the connecting hole is deep, the manufacturing yield stops or stays at about 70%. Since the interconnections for a peripheral circuit are constructed of plugs each having such a high resistance value, the operating frequency of the peripheral circuit is rate-controlled by the resistance of each plug so as to result in about 125 kHz at a maximum.

In the present embodiment contrary to this, since copper which is low in resistivity is used for the principal conductive layer of each connecting portion 34 corresponding to the plug and the length thereof is as short as 0.7 μm, the resistance value of the connecting portion 34 will be 1Ω or less. Since the depth of the connecting hole 33 is shallow, a manufacturing yield of 99% or more can be ensured. Thus, the operating frequency of the peripheral circuit can be set to be greater than or equal to 700 kHz at a maximum because the principal conductive layer of each second layer interconnection 32 is also comprised of copper as well as the connecting portion 34 whose principal conductive layer is made up of copper.

Incidentally, the present embodiment involves an example in which the connecting portions 34 are electrically connected to the first layer interconnections 18. However, the connecting portions 34 may be directly connected to the impurity semiconductor regions 15 or gate electrodes 11 of the n channel and p channel MISFETs Qn and Qp without forming the first layer interconnections 18 and the plugs 22 within the peripheral circuit region (B region). In this case, each second layer interconnection 32 functions as the first layer interconnection.

Further, the present embodiment provides an example in which the steplike offset caused by the capacitor C is reduced or relieved by the insulating film 24. However, an insulating film 30 having a thickness greater than or equal to the elevation of the capacitor C may be deposited without forming the insulating film 24 and flattened by polishing using the CMP method. In this case, for example, a silicon nitride film may preferably be formed in the peripheral circuit region (B region) to prevent dishing of the peripheral circuit region (B region) due to CMP.

Without having to use the insulating film 24 provided with each groove 48 for forming the lower electrode 27 of the capacitor C, the insulating film 24 may be provided such that, after the formation of the capacitor C, an insulating film having a thickness greater than or equal to the elevation of the capacitor is deposited and the deposited insulating film is etched with a photoresist film for covering the peripheral circuit region (B region) as a mask, so that it is formed so as to be left within the peripheral circuit region alone.

Further, the present embodiment provides an example in which the interconnections with the copper as the principal conductive layer are applied even to the third layer interconnections 39 and fourth layer interconnections 43. However, a layered film consisting of, for example, a titanium film, an aluminum film and a titanium nitride film may be patterned after the formation of each plug connected to a lower interconnection so as to form third and fourth layer interconnections.

(Second Embodiment)

Figure 29:
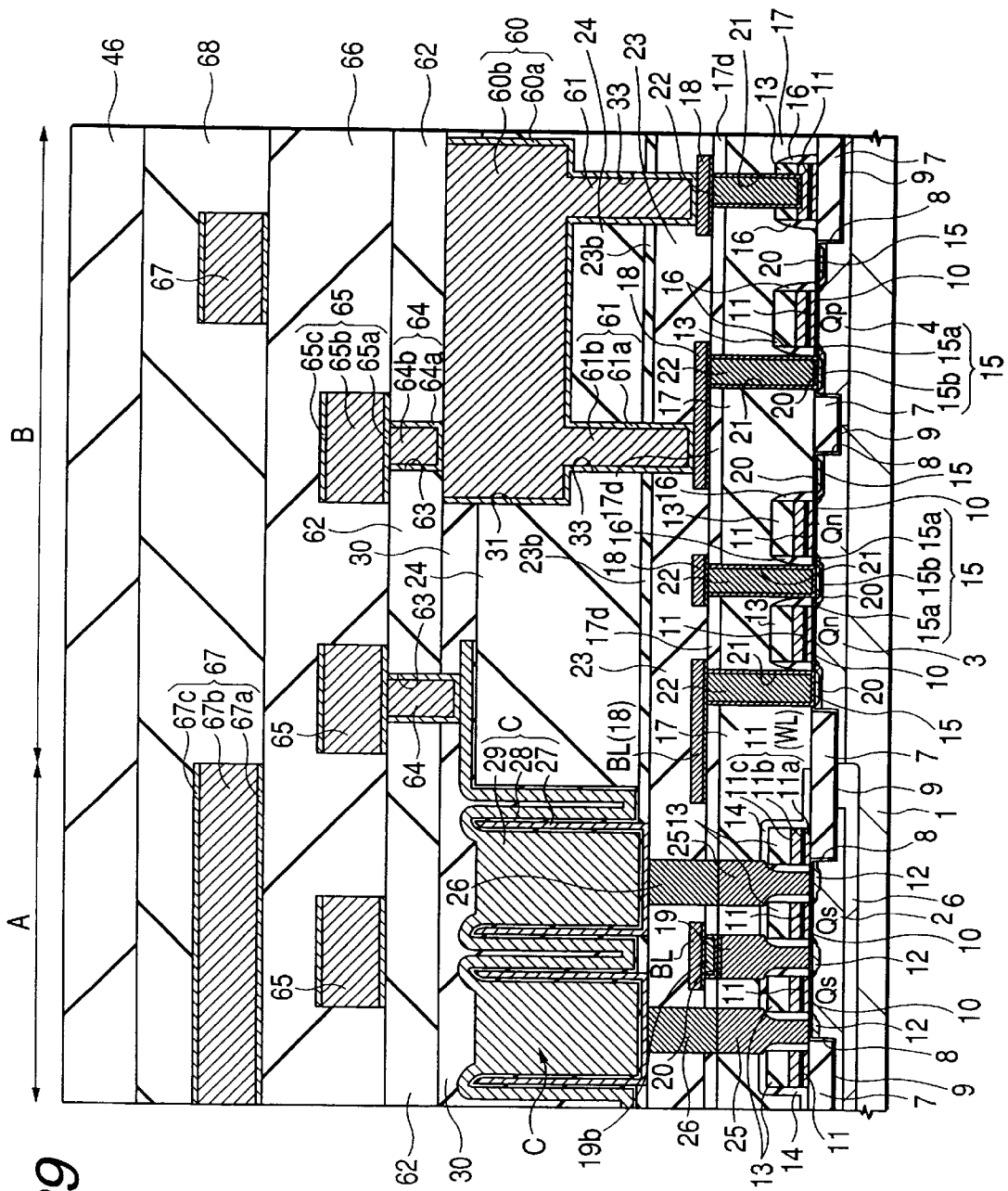
FIG. 29 is a fragmentary cross-sectional view of a DRAM according to a second embodiment of the present invention.
Figure 30:
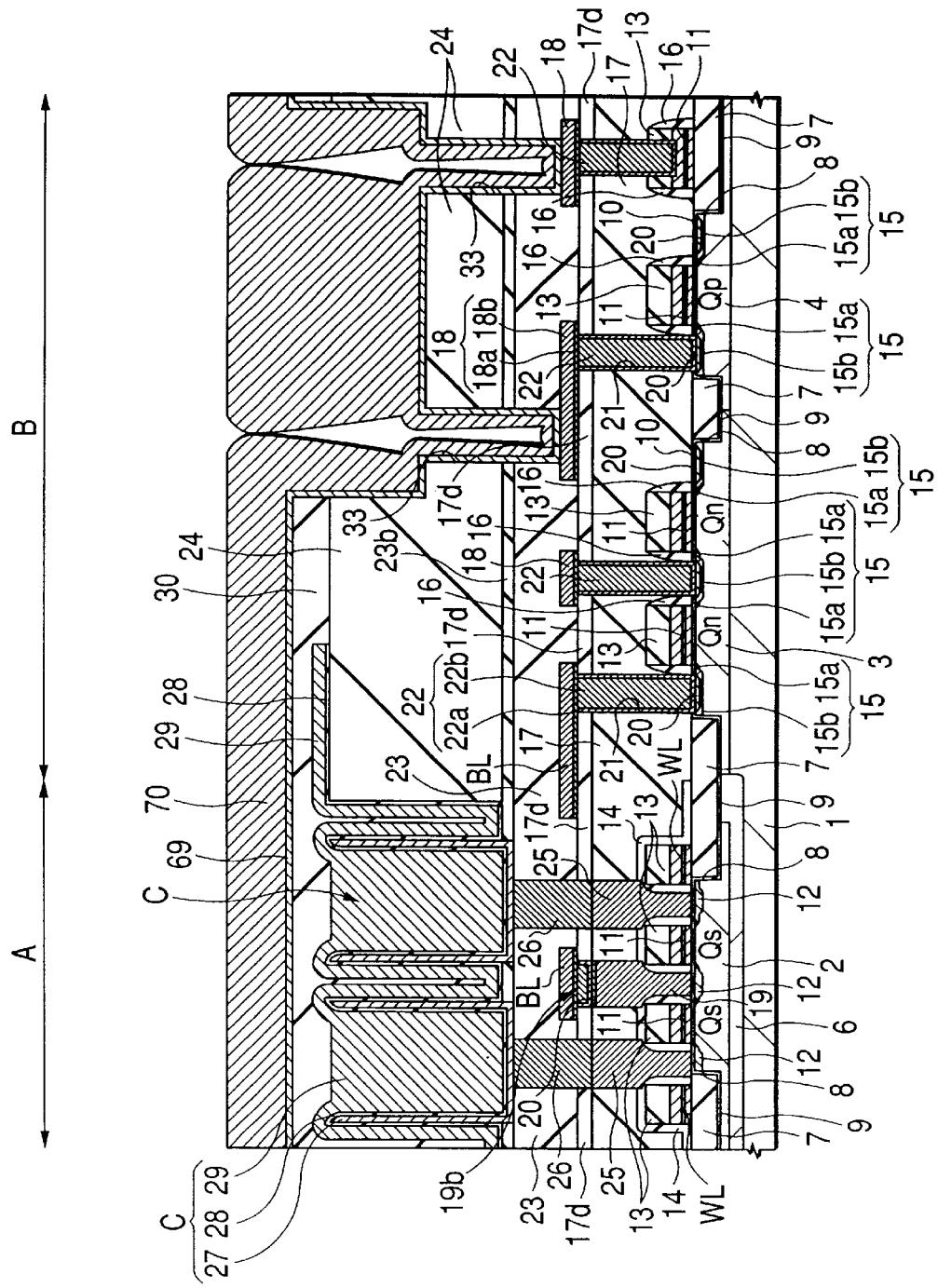
FIG. 30 is a cross-sectional view showing one example of a method of manufacturing the DRAM according to the second embodiment in a process sequence.
Figure 31:
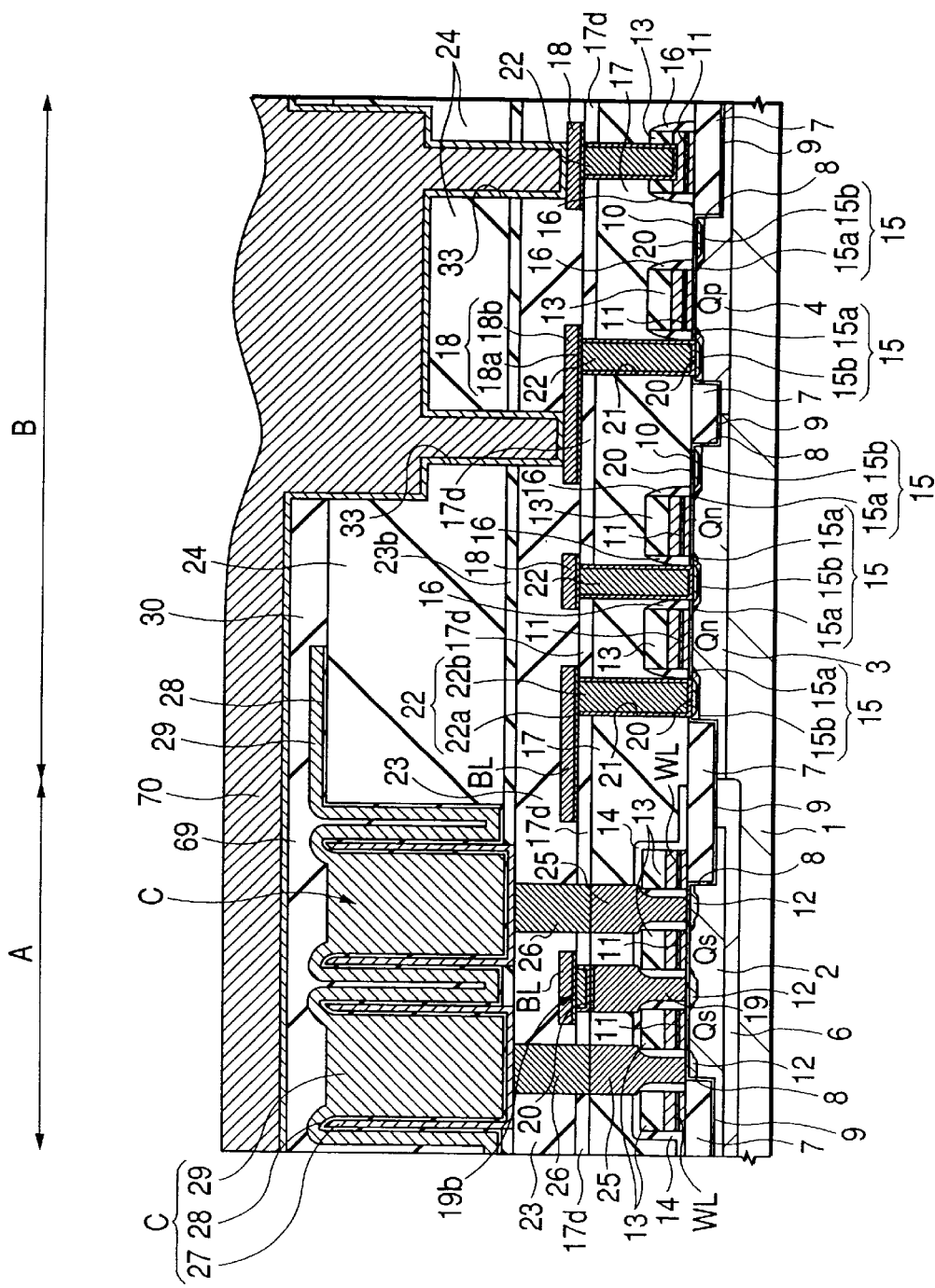
FIG. 31 is a cross-sectional view illustrating one example of the method of manufacturing the DRAM according to the second embodiment in another process sequence.
Figure 32:
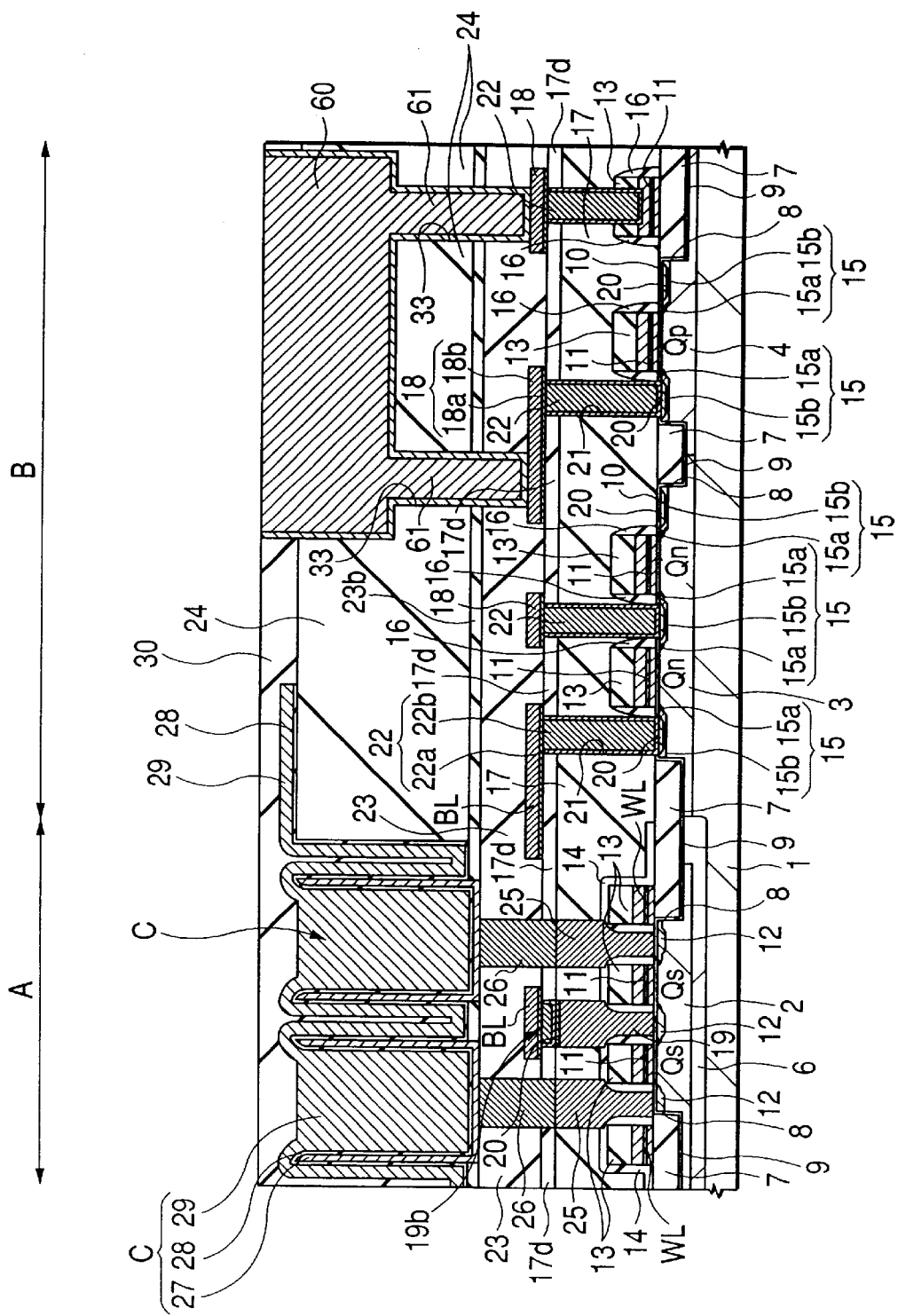
FIG. 32 is a cross-sectional view depicting one example of the method of manufacturing the DRAM according to the second embodiment in a further process sequence.
Figure 33:
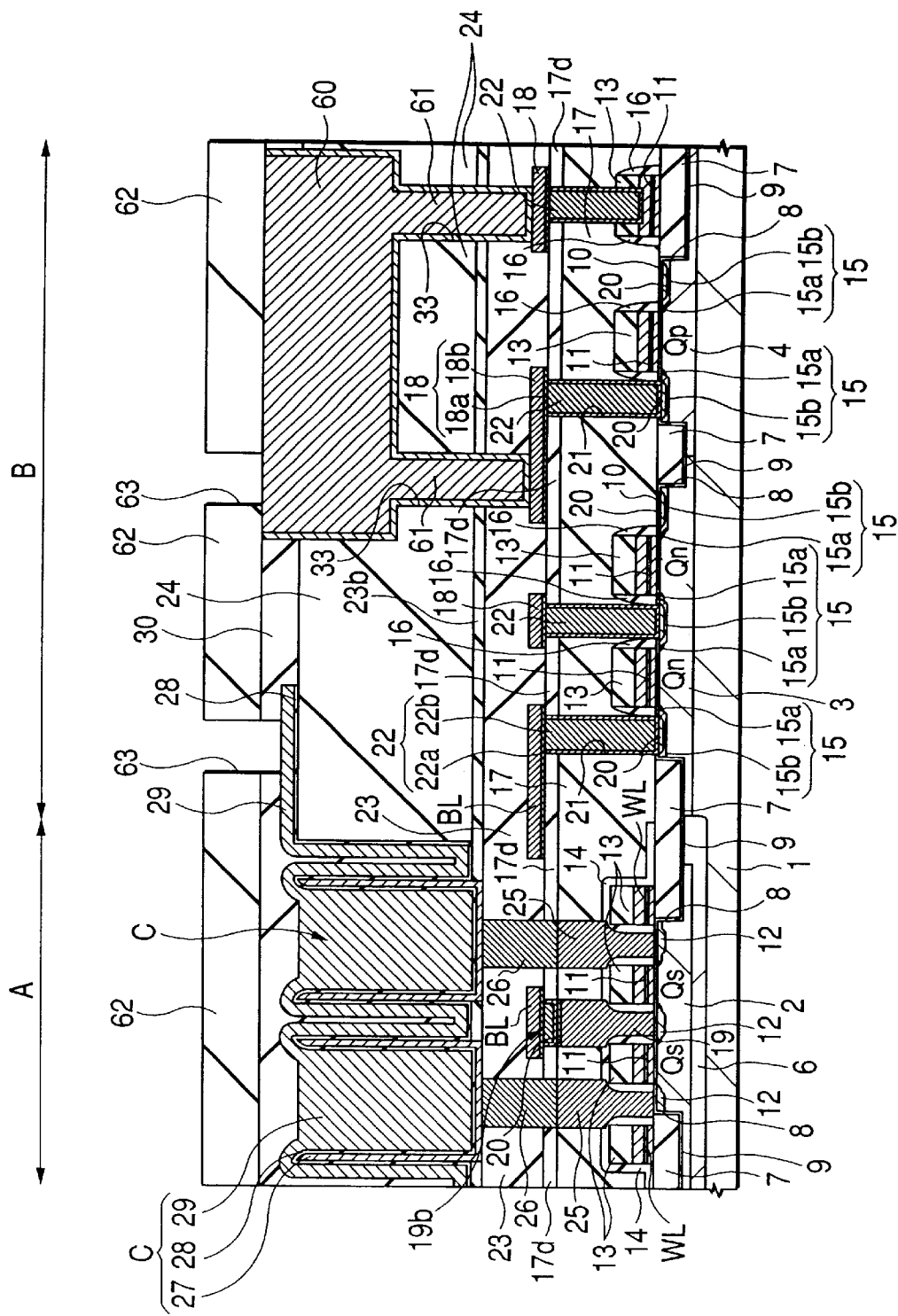
FIG. 33 is a cross-sectional view showing one example of the method of manufacturing the DRAM according to the second embodiment in a still further process sequence.

FIG. 29 is a fragmentary cross-sectional view of a DRAM according to another embodiment of the present invention. The DRAM according to the present embodiment is similar to the DRAM according to the first embodiment in plane placement and circuit configuration (see FIGS. 1 and 2). Thus, the description of these portions will be omitted. The DRAM according to the present embodiment is different from the DRAM according to the first embodiment in the configuration from the second layer interconnections up and the manufacturing method thereof alone. Other configurations and the processes up to the process (see FIG. 21) of forming the wiring grooves 31 and connecting holes 33 defined in the insulating film 30 are similar to the above. Accordingly, the description of these parts will be omitted as well.

Second layer interconnections 60 employed in the DRAM according to the present embodiment are respectively formed within wiring or interconnection grooves 31 formed in the neighborhood of the surfaces of insulating films 30 and 24. As shown in FIG. 29, the surface of each second layer interconnection 60 is flush with the surface of the insulating film 30. Further, the bottom face of the second layer interconnection 60 is positioned below the surface (corresponding to the surface of each plate electrode 29) of a capacitor C. This point is similar to the first embodiment.

Connecting holes 33 are defined in lower portions of the interconnection grooves 31 and connecting portions 61 are formed within the connecting holes 33, respectively. The second layer interconnections 60 and connecting portions 61 are integrally formed in a manner similar to the first embodiment. Each second layer interconnection 60 comprises a first conductive layer 60a composed of a titanium nitride film and a second conductive layer 60b composed of an aluminum film. Each connecting portion 61 comprises a first conductive layer 61a composed of the titanium nitride film and a second conductive layer 61b composed of the aluminum film.

The second conductive layers 60b and 61b serve as principal conductive layers of the second layer interconnection 60 and the connecting portion 61. Since they have the principal conductive layers each comprised of aluminum, the second layer interconnection 60 and connecting portion 61 can be lowered in resistance and the response of a semiconductor integrated circuit device, particularly, the operation of a peripheral circuit can be speeded up to improve the performance of the DRAM. The first conductive layers 60a and 61a serve as wetting layers used upon forming the aluminum film.

Since each connecting hole 33 is defined in the lower portion of the interconnection groove 31 in a manner similar to the first embodiment, the depth of the connecting hole 33 can be made shallow by a length corresponding to the depth of the interconnection groove 31. Thus, the thickness of the second layer interconnection 60 can be set to 0.7 μm and the length of the connecting portion 61 can be set to 0.7 μm in a manner similar to the first embodiment. As a result, effects of the improvements in the reliability of connection by the restraint of the occurrence of the working failure and the manufacturing yield of the DRAM which have been described in the first embodiment, and an effect of an improvement in the performance of the DRAM due to the shortening of the length of each connecting portion 61 can be also obtained in the same manner.

An interlayer insulating film 62 is formed over the upper surfaces of the insulating film 30 and the second layer interconnections 60, and connecting holes 63 are defined in the interlayer insulating film 62. A plug 64 comprised of a titanium nitride film 64a and a tungsten film 64b is formed in each connecting hole 63 and electrically connected to its corresponding second layer interconnection 60 or plate electrode 29. The interlayer insulating film 62 can be formed as a TEOS oxide film, for example.

Third layer interconnections 65 each comprised of a titanium nitride film 65a, an aluminum film 65b and a titanium nitride film 65c are formed over the interlayer insulating film 62 and the plugs 64. The third layer interconnections 65 are covered with an interlayer insulating film 66. Each fourth layer interconnection 67 comprised of a titanium nitride film 67a, an aluminum film 67b and a titanium nitride film 67c is formed over the interlayer insulating film 66. The fourth layer interconnection 67 is covered with an insulating film 68.

The interlayer insulating film 66 and the insulating film 68 can be respectively constructed as a silicon oxide film formed by a CVD method utilizing, for example, bias sputter in combination. The third layer interconnection 65 can be used as a main word line MWB or a shunt interconnection for each word line WL. The fourth layer interconnection 67 is electrically connected to its corresponding third layer interconnection 65 through an unillustrated connecting portion. The fourth layer interconnection 67 can be used as a Y select line YS. A passivation film 46 is formed over the insulating film 68.

A method of manufacturing the DRAM according to the present embodiment will next be described in process sequences with reference to FIGS. 30 through 37. FIGS. 30 through 37 are, respectively, cross-sectional views showing one example of a method of manufacturing a DRAM according to another embodiment of the present invention in process sequences.

Figure 21:
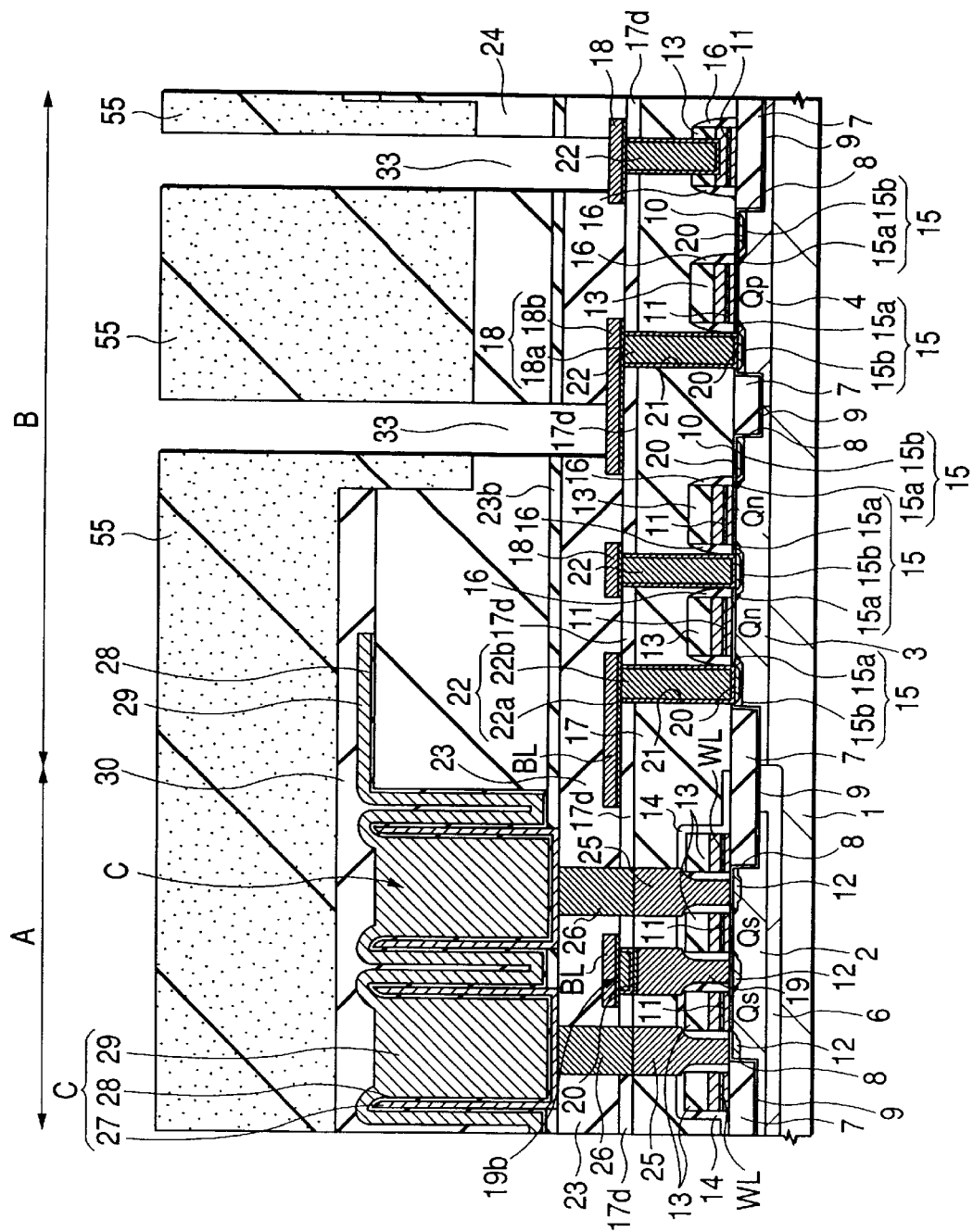
FIG. 21 is a cross-sectional view illustrating one example of the method of manufacturing the DRAM according to the first embodiment in a still further process sequence.
Figure 22:
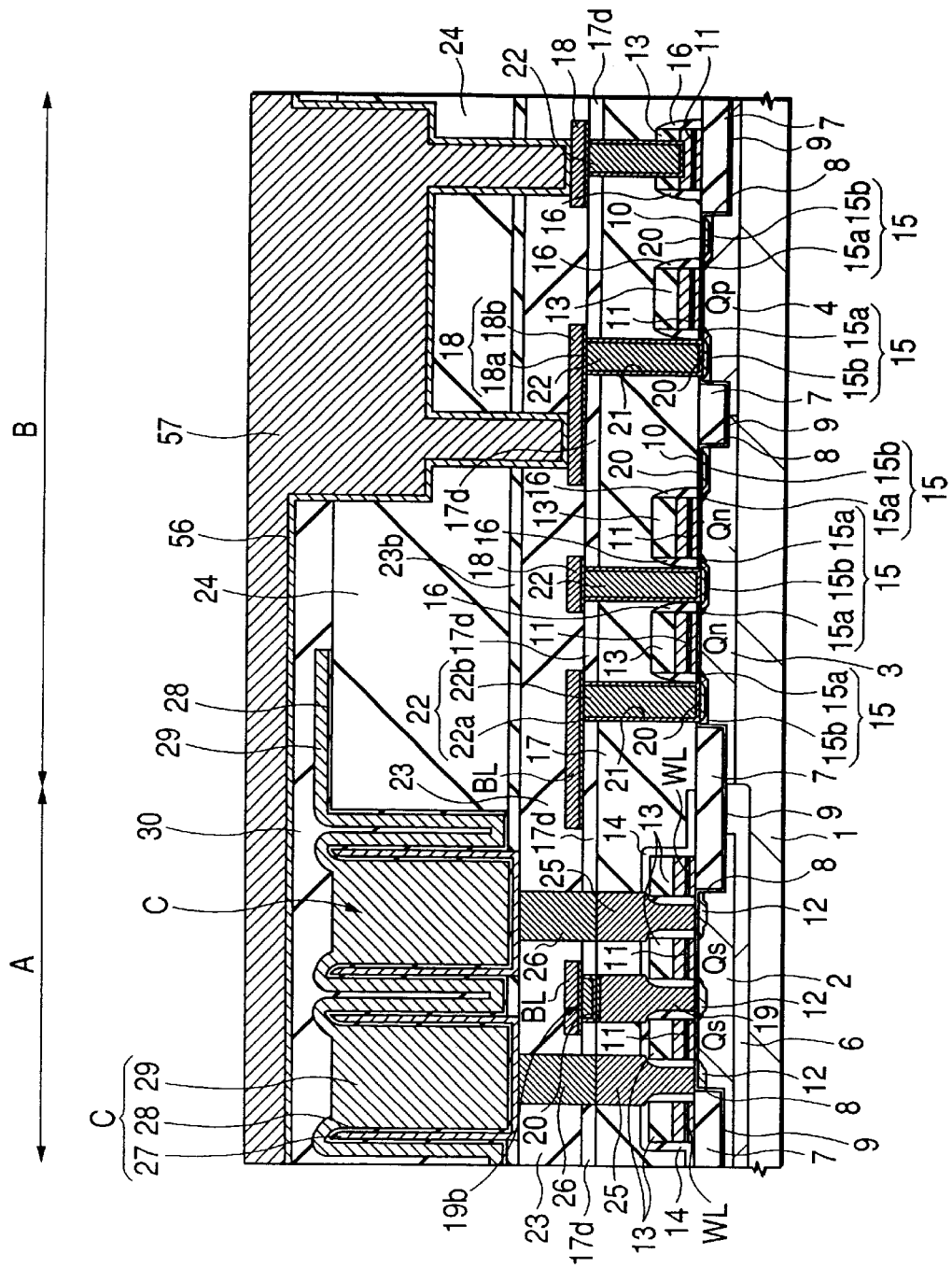
FIG. 22 is a cross-sectional view showing one example of the method of manufacturing the DRAM according to the first embodiment in a still further process sequence.
Figure 23:
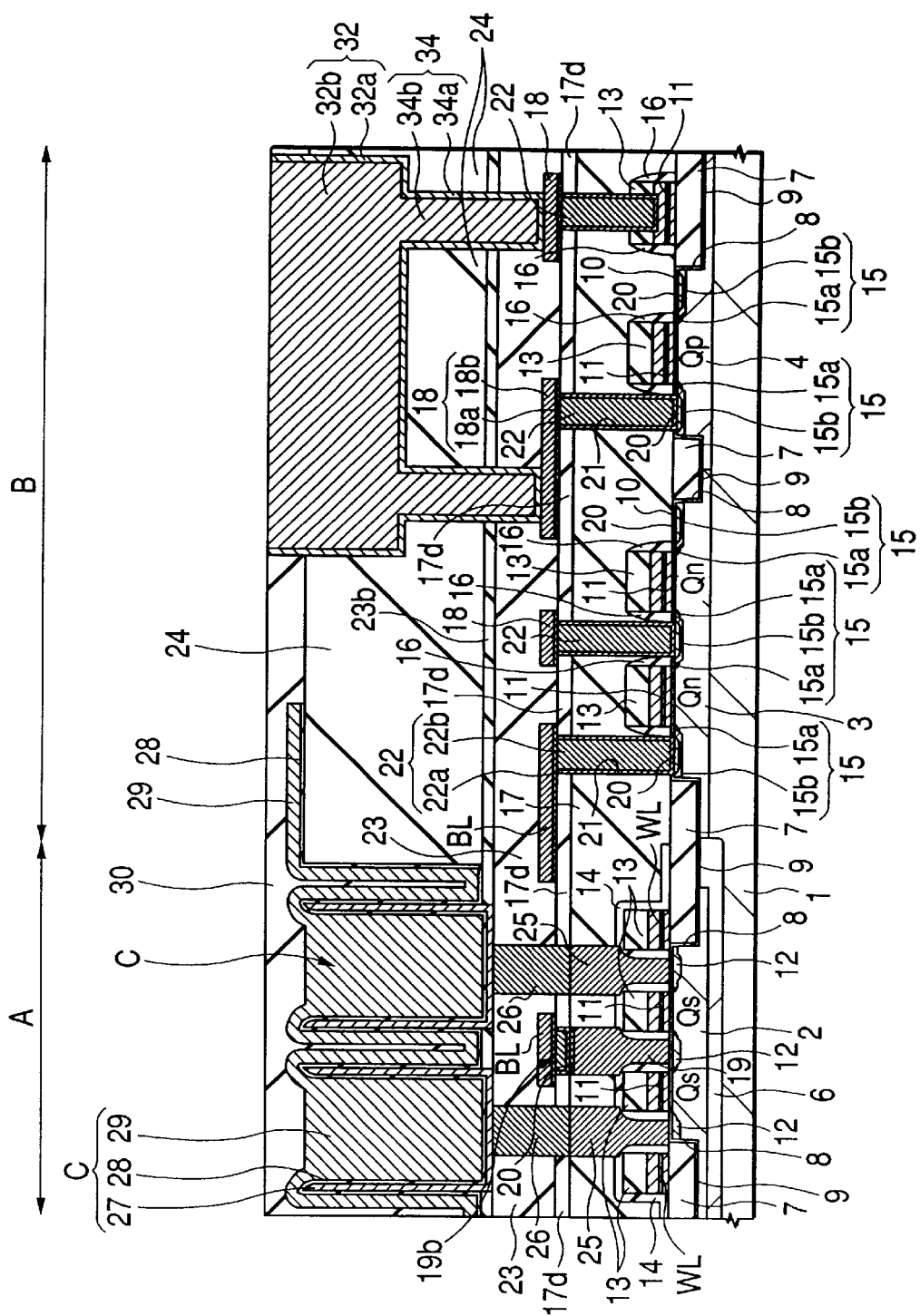
FIG. 23 is a cross-sectional view depicting one example of the method of manufacturing the DRAM according to the first embodiment in a still further process sequence.

The method of manufacturing the DRAM according to the present embodiment is similar up to the process of FIG. 21 employed in the first embodiment as described above.

A titanium nitride film 69 is deposited over the entire surface of a semiconductor substrate 1 containing the interior of interconnection grooves 31 and connecting holes 33 by a CVD method, for example. Further, an aluminum film 70 is deposited by sputtering, for example (see FIG. 30). Since the aluminum film 70 is deposited by sputtering, it is poor in step coverage as shown in the drawing and hence is brought into a state having a void or the like.

Therefore, the semiconductor substrate 1 is held under a high pressure of about 3000 atmosphere. Under such a high pressure, the temperature rises so that the aluminum film 70 is brought to a state having fluidity, whereby the aluminum 70 is completely embedded inside the interconnection grooves 31 and the connecting holes 33 (see FIG. 31). At this time, the titanium nitride film 69 serves as a wetting layer of the aluminum film 70 so as to make it possible to make the aluminum's fluidity better and improve embeddability.

Next, the aluminum film 70 and the titanium nitride film 69 on the insulating films 30 lying within regions other than the interconnection grooves 31 are removed by polishing using a CMP method. Thus, second layer interconnections 60, each comprised of a first conductive layer 60a composed of a titanium nitride film and a second conductive layer 60b composed of an aluminum film, are formed within their corresponding interconnection grooves 31. Further, connecting portions 61, each comprised of a first conductive layer 61a composed of the titanium nitride film and a second conductive layer 61b composed of the aluminum film, are formed within their corresponding connecting holes 33 (see FIG. 32). Thus, the second layer interconnection 60 is formed integrally with the connecting portion 61.

Next, a TEOS oxide film is deposited over the insulating films 30 and the second layer interconnections 60 so as to form an interlayer insulating film 62. Further, the interlayer insulating film 62 and each insulating film 30 are etched by dry etching with a photoresist film as a mask to thereby form connecting holes 63 (see FIG. 33).

Figure 34:
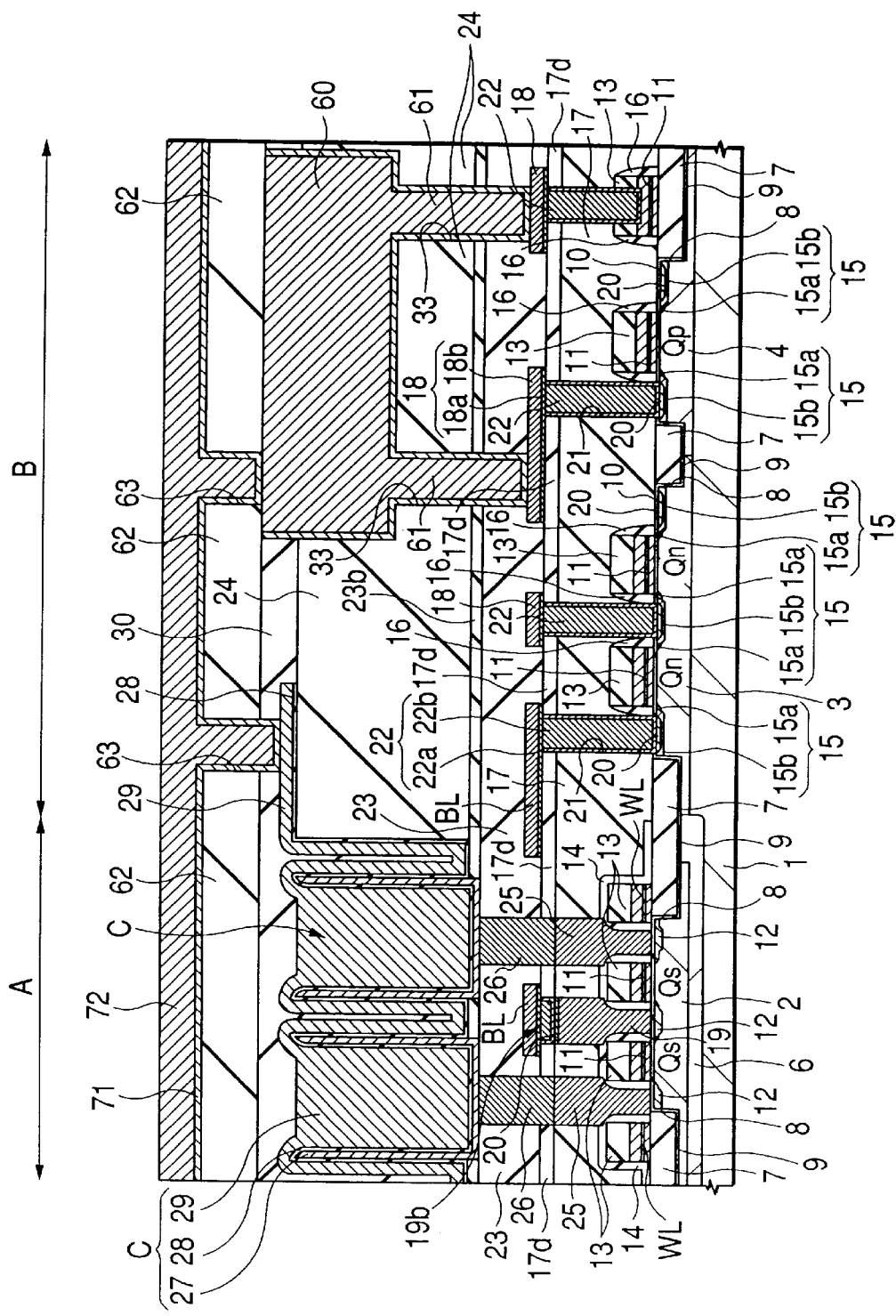
FIG. 34 is a cross-sectional view illustrating one example of the method of manufacturing the DRAM according to the second embodiment in a still further process sequence.
Figure 35:
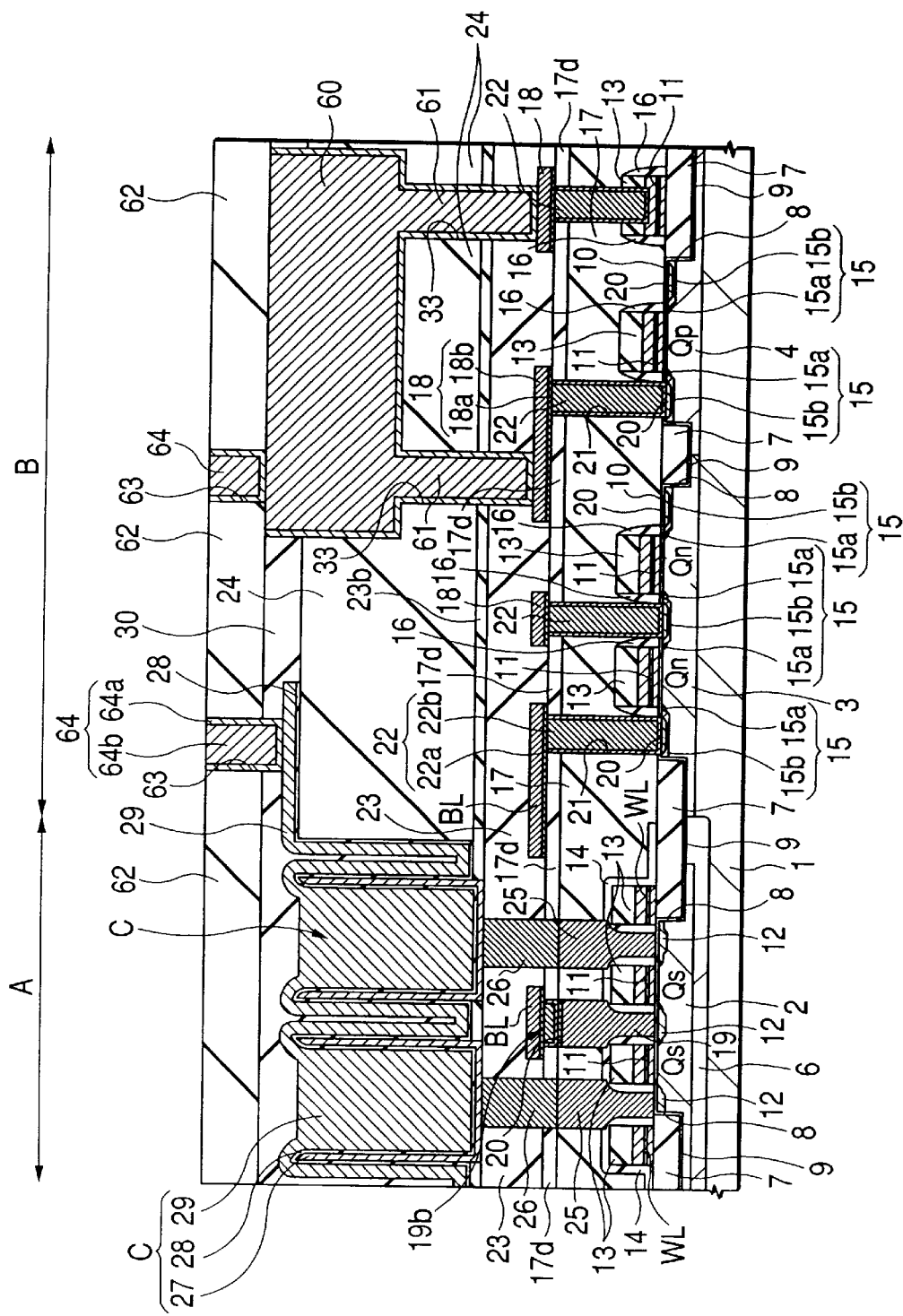
FIG. 35 is a cross-sectional view depicting one example of the method of manufacturing the DRAM according to the second embodiment in a still further process sequence.
Figure 36:
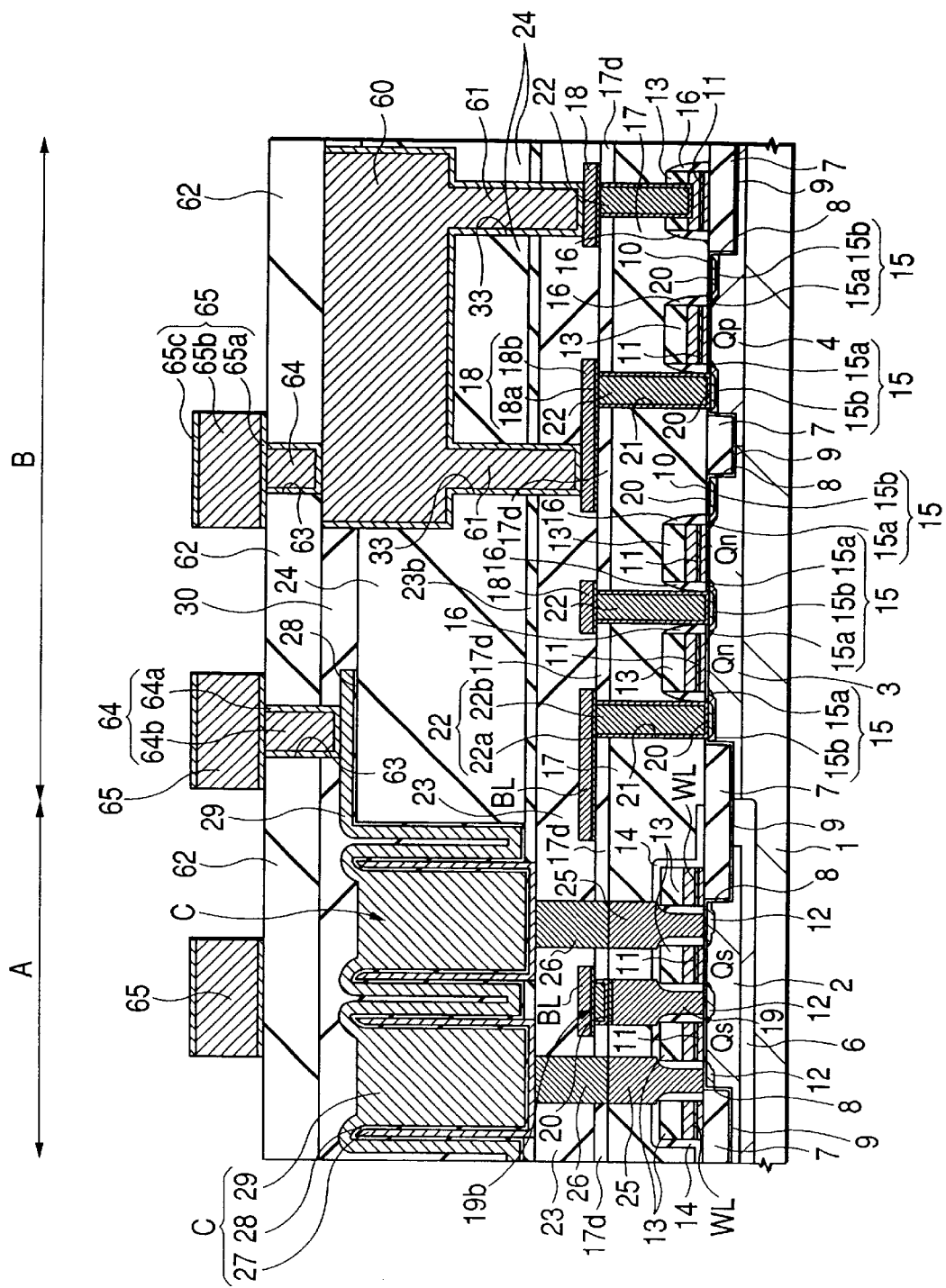
FIG. 36 is a cross-sectional view showing one example of the method of manufacturing the DRAM according to the second embodiment in a still further process sequence.
Figure 37:
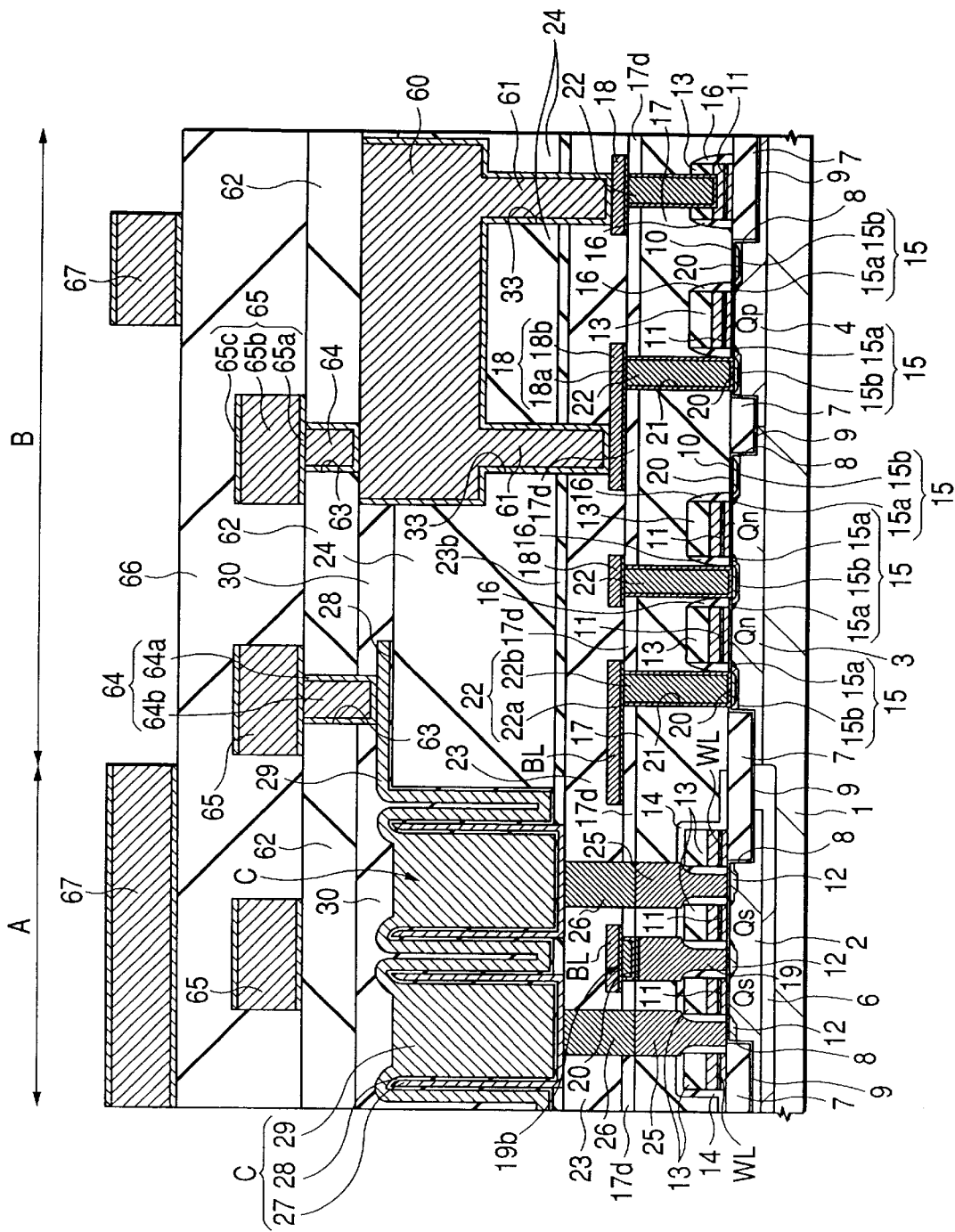
FIG. 37 is a cross-sectional view illustrating one example of the method of manufacturing the DRAM according to the second embodiment in a still further process sequence.

A titanium nitride film 71 and tungsten 72 are next successively deposited over each interlayer insulating film 62 including the interior of the connecting holes 63 (see FIG. 34). The titanium nitride film 71 and the tungsten 72 on each interlayer insulating film 62, other than that in each connecting hole 63, are removed by polishing with the CMP method to thereby form plugs 64 each comprised of a titanium nitride film 64a and a tungsten film 64b (see FIG. 35). The titanium nitride film 64a and the tungsten film 64b can be deposited by a CVD method or sputtering.

Next, a titanium nitride film is deposited by the CVD method and an aluminum film is deposited by sputtering, whereby a layered film comprised of the titanium nitride film, the aluminum film and the titanium nitride film is deposited. Thereafter, the layered film is patterned by photolithography and dry etching techniques to thereby form third layer interconnections 65 each comprised of a titanium nitride film 65a, an aluminum film 65b and a titanium nitride film 65c (see FIG. 36).

Next, a silicon oxide film is deposited by the CVD method utilizing sputtering in superimposed form, whereby the silicon oxide film is embedded in each third layer interconnection 65. Thereafter, the silicon oxide film is flattened by the CMP method to form an interlayer insulating film 66. Further, unillustrated plugs and fourth layer interconnections 67 are formed in a manner similar to the third layer interconnections 65 (see FIG. 37).

Finally, an insulating film 68 is deposited over the entire surface of the semiconductor substrate 1 and thereafter is subjected to hydrogen annealing at a temperature of 400° C. to recover any damage of each MISFET. Further, a passivation film 46 is deposited over the entire surface of the semiconductor substrate 1 to thereby substantially complete the DRAM shown in FIG. 29.

According to the DRAM of the present embodiment and the manufacturing method therefor, the same effects as those described in the first embodiment can be obtained. Since aluminum, which is low in electric resistance is used in the present embodiment, the resistance value of each connecting portion 61 is less than or equal to 1Ω. Further, since the connecting hole 33 is short, the manufacturing yield reaches 99% or more. Since the second layer interconnections 60 and the connecting portions 61 are formed using aluminum, the operating frequency of a peripheral circuit results in 500 kHz at a maximum.

(Third Eembodiment)

Figure 38:
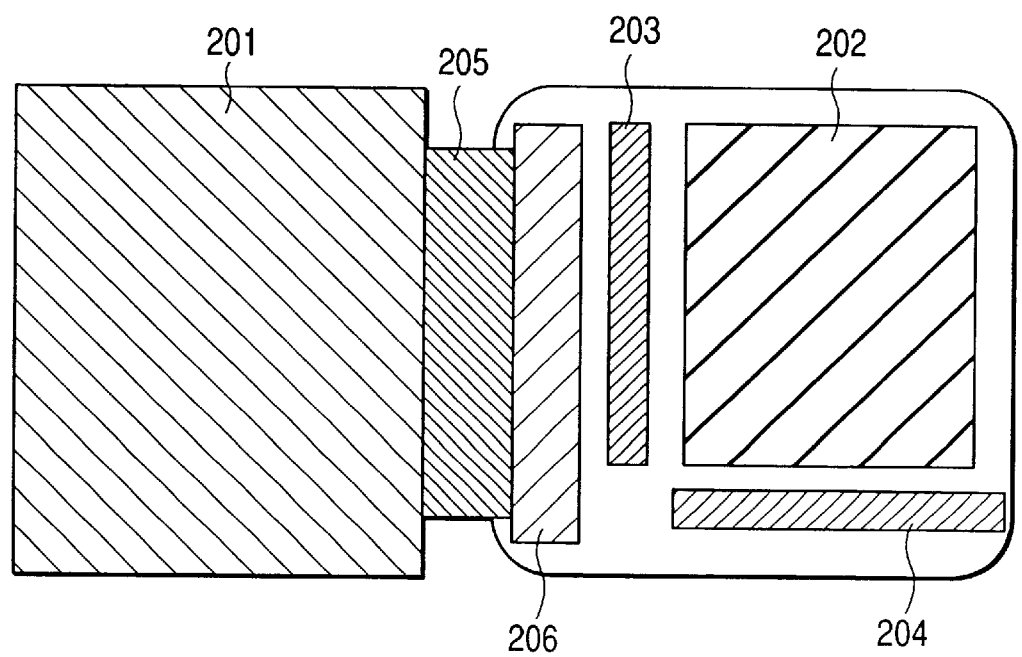
FIG. 38 is a plan view showing one example of the entire semiconductor chip with a semiconductor integrated circuit device formed therein according to a third embodiment of the present invention.

FIG. 38 is a plan view showing one example of the entire semiconductor chip with a semiconductor integrated circuit device formed therein according to a further embodiment of the present invention.

The semiconductor integrated circuit device according to the present embodiment has a DRAM and a logic circuit mixed together within a single chip. The semiconductor integrated circuit device has a logic unit 201 and a memory unit 202. A CPU for performing logical operations or the like, a stack, etc. are formed within the logic unit 201. Data storage elements are formed within the memory unit 202. A first I/O part 203 and a second I/O part 204 are placed around the memory unit 202 and respectively control the input/output of data. Further, data inputted and outputted via the first I/O part 203 and the second I/O part 204 is transmitted to a decoder unit 206, after which it is sent to the logic unit 201.

The chip size of the semiconductor integrated circuit device according to the present embodiment is 15×8 mm². The memory capacity of the DRAM is 256 Mbits.

Figure 39:
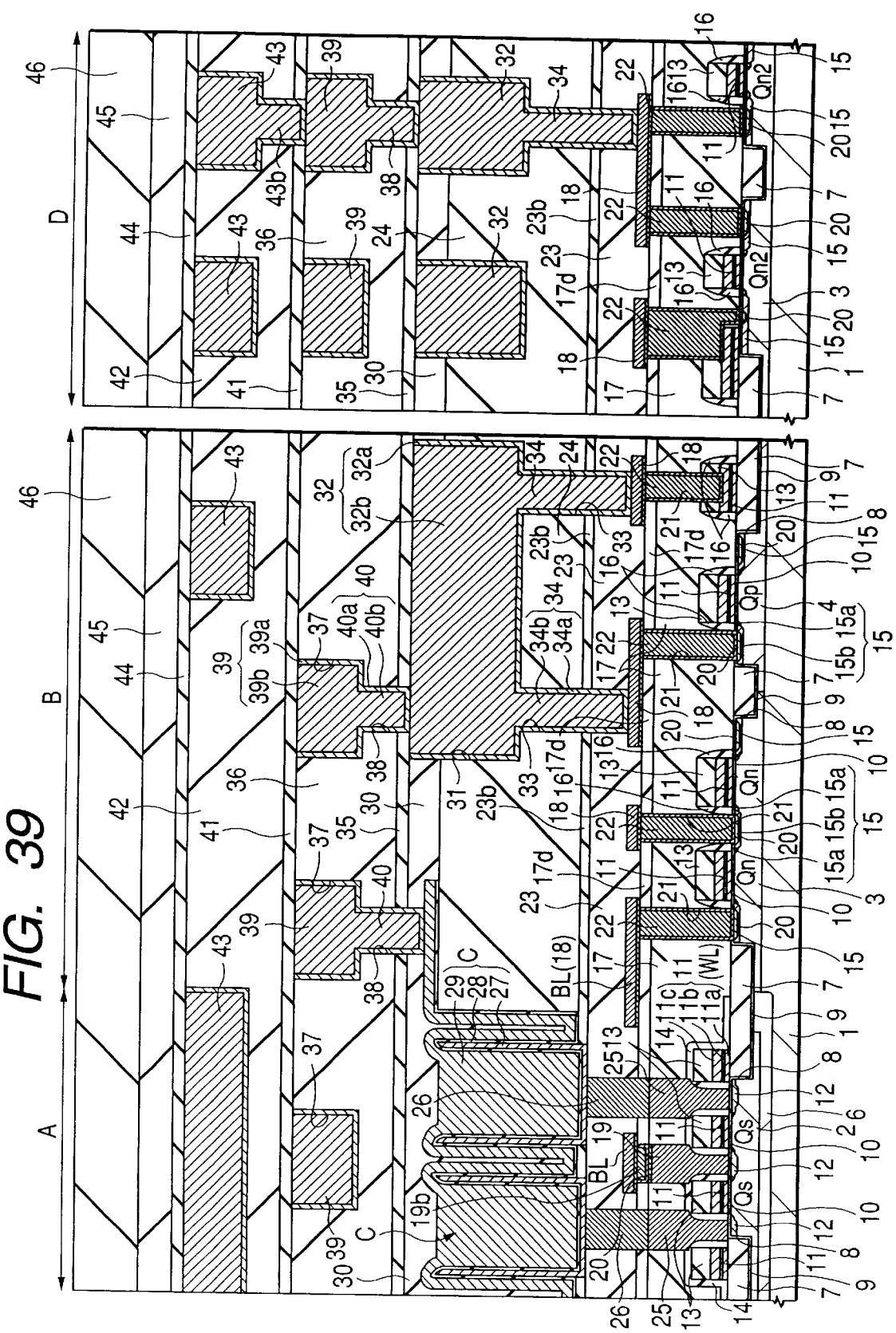
FIG. 39 is a fragmentary cross-sectional view of a DRAM according to the third embodiment.

FIG. 39 is a fragmentary cross-sectional view of a DRAM according to the present embodiment. A memory cell array region (A region) and a peripheral circuit region (B region)

of the DRAM according to the present embodiment are similar to those according to the first embodiment in their configurations and manufacturing method. Accordingly, the description of these portions will be omitted.

The semiconductor integrated circuit device according to the present embodiment has a logic circuit region (D region) in addition to the memory cell array region (A region) and the peripheral circuit region (B region). The logic circuit region corresponds to a region other than the memory cell array region and the peripheral circuit region. For example, a logic unit 201, a first I/O part 203, a second I/O part 204, a bus 205, etc. are formed in the region.

Separation regions 7 and p-type wells 3 similar to the peripheral circuit region are formed on a semiconductor substrate 1 in the logic circuit region (D region). Similar to the peripheral circuit region, n-channel MISFETs Qn are formed on a principal surface of the semiconductor substrate 1. Although n channel MISFETs Qn2 are shown by way of illustrative example in the present embodiment, p channel MISFETs may be used. Alternatively, a CMISFET structure may be provided.

A gate electrode 11, a cap insulating film 13, a side wall spacer 16, and an impurity semiconductor region 15 constituting a source-to-drain region of each n channel MISFET Qn2 are similar to those in the peripheral circuit region. Further, an interlayer insulating film 17, a TEOS oxide film 17, first layer interconnections 18 formed in an upper layer thereof, and plugs 22 are also similar to those in the peripheral circuit region. Moreover, an interlayer insulating film 23, a silicon nitride film 23b, an insulating film 24, an insulating film 30, second layer interconnections 32, connecting portions 34, silicon nitride films 35, 41 and 44, interlayer insulating films 36 and 42, third layer interconnections 39, connecting holes 38, fourth layer interconnections 43, a connecting portion 43b of each fourth layer interconnection, an insulating film 45 and a passivation film 46 are similar to those in the peripheral circuit region. Therefore, their description will be omitted. The fourth layer interconnection 43 can be applied to the bus 205 for connecting the memory unit 202 and the logic unit 201 to each other.

The method of manufacturing the semiconductor integrated circuit device according to the present embodiment is similar to a method of manufacturing the respective members in the peripheral circuit region, corresponding to the respective members in the above-described logic circuit region and is as described in the first embodiment. Therefore, their detailed description will be omitted.

According to the semiconductor integrated circuit device of the present embodiment, the following effects are brought about in addition to the effects obtained in the first embodiment. Namely, as shown in FIG. 39, the regions (memory cell array region (A region) and peripheral circuit region (B region)) and the logic circuit region (D region) of the DRAM are electrically connected to one another by the same second layer interconnection 32, third layer interconnection 39 and fourth layer interconnection 43. However, these interconnections are those having an excellent quick response with copper as a principal conductive layer. Thus, a portion corresponding to the DRAM and a portion corresponding to the logic circuit are electrically connected to one another by quick-response interconnections, and so the operating frequency of the semiconductor integrated circuit device can be increased to improve the performance of the semiconductor integrated circuit device. In the present embodiment, the operating frequency can be set to be greater than or equal to 700 kHz at a maximum. When the DRAM and the logic circuit are constructed by semiconductor chips independent of each other in isolation, interconnections for connecting them are inevitably made long, such quick response cannot provide a high operating frequency. On the other hand, even if the DRAM and the logic circuit are placed in the same chip in a mixed state, such a high operating frequency is hard to obtain even when interconnections high in resistivity are used and connecting portions or plugs high in resistance value are used to connect between different layers by such interconnections. Namely, in the present embodiment, the resistance value of each connecting portion 34 is reduced, a copper material low in resistivity is used for the second, third and fourth layer interconnections 32, 39 and 43, and the same interconnection is used in the DRAM region and the logic circuit region, whereby the above-described drawbacks are solved and the performance of the semiconductor integrated circuit device is significantly improved.

Although the features of the present invention have been described specifically by reference to illustrative embodiments, the present invention is not limited to the aforementioned embodiments. It is needless to say that various changes can be made thereto within a scope departing from the substance of the invention.

While silicon MISFETs have been described by way of illustrative example in the above-described embodiments, the present invention can be applied even to a MIS type semiconductor device using other semiconductor materials.

The effects obtained by a typical one of the embodiments disclosed in the present application will be described in brief as follows.

(1) In a semiconductor integrated circuit device having memory cells each of which is formed with a COB structure, the reliability of connection between a first layer interconnection and a second layer interconnection, having a thick insulating film formed in the same layer as that for a solid capacitor interposed therebetween, can be improved.

(2) The resistance of a hole portion for connection between the first layer interconnection and the second layer interconnection can be reduced.

(3) Interconnections of the second layer interconnection and up can be reduced in wiring resistance.

(4) A process for forming each second layer interconnection is used subsequent to a capacitor forming process requiring a high heat treating process. Even a material having large thermal diffusion coefficient or a material having thermal fluidity can be used for the second layer interconnection.

(5) The quick response of a peripheral circuit or logic circuit formed on the same substrate as that for the DRAM having memory cells formed with the COB structure can be improved.

Further, the above-described effects can be achieved without increasing the number of processes in particular.

What is claimed is:

1. A method of manufacturing a semiconductor integrated circuit device, comprising the steps of:

forming memory cell selection MISFETs in a memory cell array region on a principal surface of a semiconductor substrate and forming peripheral circuit MISFETs or logic circuit MISFETs in a peripheral circuit region or logic circuit region on said semiconductor substrate, respectively;

forming a first insulating film which covers said memory cell selection MISFETs and said peripheral circuit MISFETs or logic circuit MISFETs;

forming bit lines over said first insulating film in said memory cell array region;

forming a second insulating film which covers said bit lines;

forming a lower electrode for each of a plurality of information storage capacitive elements, a capacitive insulating film covering each lower electrode, and an upper electrode over each second insulating film in said memory cell array region;

forming a third insulating film over each information storage capacitive element; and flattening the surface of said third insulating film by a CMP method, thereafter defining interconnection grooves and connecting holes in the flattened third insulating film and a lower insulating film thereof in said peripheral circuit region or logic circuit region, successively depositing a first conductive layer and a second conductive layer over the third insulating film contained in the interior of said interconnection grooves and connecting holes, removing the first and second conductive layers on the surface of said third insulating film by the CMP method, and forming interconnections comprised of the first and second conductive layers within each interconnection groove and forming connecting portions comprised of the first and second conductive layers within each connected hole.

2. The method according to 1, wherein prior to the deposition of the third insulating film, a fourth insulating film formed in the same layer as that for each information storage capacitive element is formed within said peripheral circuit region or logic circuit region to thereby substantially eliminate a steplike offset between said memory cell array region and said peripheral circuit region or logic circuit region due to the height of each information storage capacitive element.

3. The method according to claim 2, wherein said fourth insulating film is an insulating film in which a cylindrical groove is defined upon formation of the lower electrode of each information storage capacitive element.

4. The method according to claim 1, wherein said third insulating film covers each information storage capacitive element and is deposited with a thickness greater than or equal to a size corresponding to the height of each information storage capacitive element.

5. The method according to claim 1, wherein a first layer interconnection composed of the same material as that used for each bit line is formed over the first insulating film in said peripheral circuit region or logic circuit region simultaneously with the formation of said bit lines, and each connecting portion is connected to said first layer interconnection.

6. The method according to claim 1, wherein said first conductive layer is a titanium nitride film and said second conductive layer is an aluminum film.

7. The method according to claim 6, wherein after the deposition of said aluminum film, said semiconductor substrate is held under high pressure to embed said aluminum film in each connecting hole.

8. The method according to claim 1, wherein said first conductive layer is a film selected from a group consisting of a tantalum film, a niobium film, a tantalum nitride film, a titanium nitride film, a tungsten nitride film and a multilayer film consisting of a plurality of thin films, and said second conductive layer is a copper film.

9. The method according to claim 8, wherein said copper film is deposited by a plating method.

10. The method according to claim 8, wherein a silicon nitride film is deposited over said third insulating film and each interconnection.

11. The method according to claim 1, wherein the first connecting holes are formed to extend from the interconnecting grooves so as to expose lower level conductors in the peripheral circuit region or logic circuit region.

12. The method according to claim 11, wherein the first connecting holes are formed so as to extend from the bottom of the interconnection grooves.

13. The method according to claim 11, wherein a plurality of said first connecting holes are formed to extend from an interconnection groove of the interconnection grooves.

14. The method according to claim 1, wherein said interconnection grooves and said first connecting holes are located outside a memory cell array region.

15. The method according to claim 1, wherein after forming said interconnections, further comprising the steps of:

forming a fourth insulator film over said third insulating film;

forming a second connecting hole in said fourth insulator film;

forming a third conductive layer over said fourth insulator film and electrically connected to said second conductive layer via said second connecting hole.

16. The method according to claim 2, wherein after forming said interconnections, further comprising the steps of:

forming a fifth insulator film over said third insulating film;

forming a second connecting hole in said fifth insulator film;

forming a third conductive layer over said fifth insulator film and electrically connected to said second conductive layer via said second connecting hole.

17. A semiconductor integrated circuit device, comprising:

memory cell selection MISFETs formed in a memory cell array region on a semiconductor substrate;

peripheral circuit MISFETs formed in a peripheral circuit region around said memory cell array region;

a first interlayer insulating film which covers said memory cell selection MISFETs and said peripheral circuit MISFETs;

at least one information storage capacitive element formed on said first interlayer insulating film in said memory cell array region and provided with a lower electrode electrically connected to one source-to-drain region of each memory cell selection MISFET; and a second interlayer insulating film having a thickness substantially equal to the height of said information storage capacitive element, said second interlayer insulating film being provided on said first interlayer insulating film in said peripheral circuit region, and wherein interconnections are formed inside said second interlayer insulating film in said peripheral circuit region.

18. A semiconductor integrated circuit device, comprising:

memory cell selection MISFETs formed in a memory cell array region on a semiconductor substrate;

peripheral circuit MISFETs formed in a peripheral circuit region around said memory cell array region;

a first interlayer insulating film which covers said memory cell selection MISFETs and said peripheral circuit MISFETs;

at least one information storage capacitive element formed over said first interlayer insulating film in said memory cell array region and provided with a lower electrode electrically connected to one source-to-drain region of each memory cell selection MISFET; and a second interlayer insulating film provided on said first interlayer insulating film in said peripheral circuit region so as to reduce a steplike offset developed between said memory cell array region and said peripheral circuit region due to the height of said information storage capacitive element, and wherein interconnections are formed inside said second interlayer insulating film in said peripheral circuit region.

19. A method of manufacturing a semiconductor integrated circuit device having a memory cell array region in which memory cells comprised of first MISFETs and capacitive elements connected in series are placed in matrix form, and a peripheral circuit region comprised of a plurality of second MISFETs, comprising the steps of:

(a) forming the first MISFETs in a memory cell array region on a principal surface of a semiconductor substrate and the second MISFETs in a peripheral circuit region respectively;

(b) forming a first insulating film over said first and second MISFETs;

(c) forming a second insulating film over said first insulating film and defining respective openings in said second insulating film in said memory cell array region;

(d) forming a first conductive layer within each opening along an inner wall thereof;

(e) forming a dielectric film of each capacitive element over said first conductive layer and forming a second conductive layer over said dielectric film;

(f) forming first and second grooves in said second insulating film within said peripheral circuit region; and (g) forming a third conductive layer within the first and second grooves, and wherein said first groove is wider than said second groove and said second groove is located so as to extend from said first groove.

20. The method according to claim 19, wherein plural second grooves are provided in said step (f).

21. The method according to claim 19, wherein the second groove extends toward the semiconductor substrate from a bottom of the first groove.

22. The method according to claim 19, wherein a plurality of second grooves extend from one of the first grooves.

23. The method according to claim 19, wherein said third conductive layer is formed after the step (e) of forming said dielectric film and said second conductive layer.

24. The method according to claim 19, wherein said first and second grooves are formed after the step (e) of forming said dielectric film and said second conductive layer.

25. The method according to claim 19, wherein said first and second grooves are located outside a memory cell array region.

26. The method according to claim 19, wherein after forming said third conductive layer, further comprising the steps of:

forming a third insulator film over said second insulating film;

forming a first connecting hole in said third insulator film;

forming a fourth conductive layer over said third insulating film and electrically connected to said third conductive layer via said first connecting hole.

27. A method of manufacturing a semiconductor integrated circuit device having a memory cell array region in which memory cells comprised of first MISFETs and capacitive elements connected in series are placed in matrix form, and a peripheral circuit region comprised of a plurality of second MISFETs, comprising the steps of:

(a) forming the first MISFETs in a memory cell array region on a principal surface of a semiconductor substrate and the second MISFETs in a peripheral circuit region respectively;

(b) forming a first insulating film over said first and second MISFETs;

(c) forming a first conductive piece and a second conductive piece over said first insulating film in said peripheral circuit region;

(d) forming second and third insulating films over said first and second conductive pieces;

(e) defining respective openings in said third insulating film in said memory cell array region;

(f) forming a first conductive layer within each opening along an inner wall thereof;

(g) forming a dielectric film of each capacitive element over said first conductive layer and forming a second conductive layer over said dielectric film;

(h) forming a first groove and a plurality of second grooves in said third insulating film within said peripheral circuit region; and (i) forming a third conductive layer within said first and second grooves, and wherein said first groove is wider than each second groove and said each second groove is located so as to extend from said first groove and reaches said first and second conductive pieces.

28. The method according to claim 27, wherein said third conductive layer is formed after the step (g) of forming said dielectric film and said second conductive layer.

29. The method according to claim 27, wherein said first and second grooves are located outside a memory cell array region.

30. The method according to claim 27, wherein after forming said third conductive layer, further comprising the steps of:

forming a fourth insulator film over said third insulating film;

forming a first connecting hole in said fourth insulator film;

forming a fourth conductive layer over said fourth insulator film and electrically connected to said third conductive layer via said first connecting hole.

31. A method of manufacturing a semiconductor integrated circuit device, comprising the steps of:

forming memory cell selection MISFETs in a memory cell array region on a principal surface of a semiconductor substrate and forming peripheral circuit MISFETs or logic circuit MISFETs in a peripheral circuit region or logic circuit region of said semiconductor substrate, respectively;

forming a first insulating film which covers said memory cell selection MISFETs and said peripheral circuit MISFETs or logic circuit MISFETs;

forming bit lines over said first insulating film in said memory cell array region;

forming a second insulating film which covers said bit lines;

forming a lower electrode of each information storage capacitive element, a capacitive insulating film covering said lower electrode, and an upper electrode over said second insulating film in said memory cell array region;

forming a third insulating film over said each information storage capacitive element;

flattening the surface of said third insulating film by a CMP method; and thereafter defining interconnection grooves in the flattened third insulating film in said peripheral circuit region or logic circuit region, successively depositing a first conductive layer and a second conductive layer over said third insulating film contained in the interior of said interconnection grooves, removing said first and second conductive layers on the surface of said third insulating film by the CMP method, and forming interconnections comprised of said first and second conductive layers within said each interconnection groove.

32. A method of manufacturing a semiconductor integrated circuit device having a memory cell array region in which memory cells comprised of first MISFETs and capacitive elements connected in series are placed in matrix form, and a peripheral circuit region comprised of a plurality of second MISFETs, comprising the steps of:

(a) forming the first MISFETs in a memory cell array region on a principal surface of a semiconductor substrate and the second MISFETs in a peripheral circuit region, respectively;

(b) forming a first insulating film over said first and second MISFETs;

(c) forming a second insulating film over said first insulating film and defining each opening in said second insulating film in said memory cell array region;

(d) forming a first conductive layer within said each opening along an inner wall thereof;

(e) forming a dielectric film of said each capacitive element over said first conductive layer and forming a second conductive layer over said dielectric film;

(f) forming a groove in said second insulating film within said peripheral circuit region; and (g) forming a third conductive layer within said groove.

* * * * *